United States Patent
Bertness

(10) Patent No.: US 11,650,259 B2
(45) Date of Patent: May 16, 2023

(54) BATTERY PACK MAINTENANCE FOR ELECTRIC VEHICLE

(71) Applicant: Midtronics, Inc., Willowbrook, IL (US)

(72) Inventor: Kevin I. Bertness, Batavia, IL (US)

(73) Assignee: MIDTRONICS, INC., Willowbrook, IL (US)

( * ) Notice: Subject to any disclaimer, the term of this patent is extended or adjusted under 35 U.S.C. 154(b) by 496 days.

(21) Appl. No.: 16/021,538

(22) Filed: Jun. 28, 2018

(65) Prior Publication Data

US 2018/0306867 A1 Oct. 25, 2018

Related U.S. Application Data

(63) Continuation of application No. 14/039,746, filed on Sep. 27, 2013, now abandoned, which is a
(Continued)

(51) Int. Cl.
*H01M 10/42* (2006.01)
*G01R 31/385* (2019.01)
(Continued)

(52) U.S. Cl.
CPC .......... *G01R 31/385* (2019.01); *B60L 3/0046* (2013.01); *B60L 3/12* (2013.01); *B60L 50/62* (2019.02); *B60L 50/66* (2019.02); *B60L 53/65* (2019.02); *B60L 53/80* (2019.02); *B60L 58/18* (2019.02); *B60L 58/21* (2019.02); *H01M 10/4207* (2013.01); *H01M 10/4285* (2013.01); *H01M 10/54* (2013.01); *B60L 2240/545* (2013.01); *H01M 2220/20* (2013.01); *Y02T 10/62* (2013.01); *Y02T 10/70* (2013.01);
(Continued)

(58) Field of Classification Search
None
See application file for complete search history.

(56) References Cited

U.S. PATENT DOCUMENTS

| | | | |
|---|---|---|---|
| 85,553 A | 1/1869 | Adams | 33/472 |
| 2,000,665 A | 5/1935 | Neal | 439/440 |

(Continued)

FOREIGN PATENT DOCUMENTS

| | | |
|---|---|---|
| CN | 2470964 Y | 1/2002 |
| CN | 201063352 Y | 5/2008 |

(Continued)

OTHER PUBLICATIONS

Office Action from Chinese Patent Application No. 201480066251.8, dated Dec. 13, 2018.
(Continued)

*Primary Examiner* — Lucas J. O'Donnell
(74) *Attorney, Agent, or Firm* — Westman, Champlin & Koehler, P.A.

(57) ABSTRACT

A method and apparatus for repairing or testing a used battery pack from an electric vehicle include removing the battery pack from the vehicle. Battery tests are performed on at least some of the plurality of batteries and battery test results for each of the batteries tested are obtained. A cradle is configured to receive at least two different types of batteries. The cradle includes connectors to electrically couple circuitry of a battery tester to the battery.

13 Claims, 25 Drawing Sheets

Related U.S. Application Data continuation of application No. 13/152,711, filed on Jun. 3, 2011, now abandoned, which is a continuation of application No. 12/894,951, filed on Sep. 30, 2010, now Pat. No. 8,738,309.

(60) Provisional application No. 61/351,017, filed on Jun. 3, 2010.

(51) Int. Cl.
| | |
|---|---|
| *B60L 3/00* | (2019.01) |
| *B60L 3/12* | (2006.01) |
| *H01M 10/54* | (2006.01) |
| *B60L 50/60* | (2019.01) |
| *B60L 58/18* | (2019.01) |
| *B60L 53/65* | (2019.01) |
| *B60L 58/21* | (2019.01) |
| *B60L 50/62* | (2019.01) |
| *B60L 53/80* | (2019.01) |

(52) U.S. Cl.
CPC ............ Y02T 10/7072 (2013.01); Y02T 90/12 (2013.01); Y02T 90/14 (2013.01); Y02T 90/16 (2013.01); Y02T 90/167 (2013.01); Y02W 30/84 (2015.05); Y04S 30/14 (2013.01)

(56) References Cited

U.S. PATENT DOCUMENTS

| | | | |
|---|---|---|---|
| 2,254,846 A | 9/1941 | Heyer | 324/437 |
| 2,417,940 A | 3/1947 | Lehman | 200/61.25 |
| 2,437,772 A | 3/1948 | Wall | 324/523 |
| 2,514,745 A | 7/1950 | Dalzell | 324/115 |
| 2,727,221 A | 12/1955 | Springg | 340/447 |
| 3,025,455 A | 3/1962 | Jonsson | 323/369 |
| 3,178,686 A | 4/1965 | Mills | 340/447 |
| 3,215,194 A | 11/1965 | Sununu et al. | 165/80.3 |
| 3,223,969 A | 12/1965 | Alexander | 340/447 |
| 3,267,452 A | 8/1966 | Wolf | 340/249 |
| 3,356,936 A | 12/1967 | Smith | 324/429 |
| 3,562,634 A | 2/1971 | Latner | 324/427 |
| 3,593,099 A | 7/1971 | Scholl | 320/127 |
| 3,607,673 A | 9/1971 | Seyl | 324/425 |
| 3,652,341 A | 3/1972 | Halsall et al. | 29/623.2 |
| 3,676,770 A | 7/1972 | Sharaf et al. | 324/430 |
| 3,699,433 A | 10/1972 | Smith, Jr. | 324/523 |
| 3,704,439 A | 11/1972 | Nelson | |
| 3,729,989 A | 5/1973 | Little | 73/862.192 |
| 3,745,441 A | 7/1973 | Soffer | 290/14 |
| 3,750,011 A | 7/1973 | Kreps | 324/430 |
| 3,753,094 A | 8/1973 | Furuishi et al. | 324/430 |
| 3,776,177 A | 12/1973 | Bryant et al. | 116/311 |
| 3,796,124 A | 3/1974 | Crosa | 411/521 |
| 2,689,939 A | 4/1974 | Godshalk | |
| 3,808,401 A | 4/1974 | Wright et al. | |
| 3,808,522 A | 4/1974 | Sharaf | 324/430 |
| 3,808,573 A | 4/1974 | Cappell | |
| 3,811,089 A | 5/1974 | Strezelewicz | 324/170 |
| 3,816,805 A | 6/1974 | Terry | 320/123 |
| 3,850,490 A | 11/1974 | Zehr | 439/822 |
| 3,857,082 A | 12/1974 | Van Opijnen | 320/143 |
| 3,873,911 A | 3/1975 | Champlin | 324/430 |
| 3,876,931 A | 4/1975 | Godshalk | 324/429 |
| 3,879,654 A | 4/1975 | Kessinger | 324/434 |
| 3,886,426 A | 5/1975 | Daggett | 320/117 |
| 3,886,443 A | 5/1975 | Miyakawa et al. | 324/426 |
| 3,889,248 A | 6/1975 | Ritter | 340/636.11 |
| 3,906,329 A | 9/1975 | Bader | 320/134 |
| 3,909,708 A | 9/1975 | Champlin | 324/431 |
| 3,920,284 A | 11/1975 | Lane et al. | 303/122.06 |
| 3,936,744 A | 2/1976 | Perlmutter | 324/772 |
| 3,939,400 A | 2/1976 | Steele | 324/434 |
| 3,946,299 A | 3/1976 | Christianson et al. | 320/430 |
| 3,947,757 A | 3/1976 | Grube et al. | 324/416 |
| 3,969,667 A | 7/1976 | McWilliams | 324/427 |
| 3,979,664 A | 9/1976 | Harris | 324/397 |
| 3,984,762 A | 10/1976 | Dowgiallo, Jr. | 324/430 |
| 3,984,768 A | 10/1976 | Staples | 324/712 |
| 3,989,544 A | 11/1976 | Santo | 429/65 |
| 3,997,830 A | 12/1976 | Newell et al. | 320/102 |
| 4,008,619 A | 2/1977 | Alcaide et al. | 73/724 |
| 4,023,882 A | 5/1977 | Pettersson | 439/426 |
| 4,024,953 A | 5/1977 | Nailor, III | 206/344 |
| 4,047,091 A | 9/1977 | Hutchines et al. | 363/59 |
| 4,053,824 A | 10/1977 | Dupuis et al. | 324/434 |
| 4,056,764 A | 11/1977 | Endo et al. | 320/101 |
| 4,057,313 A | 11/1977 | Polizzano | 439/219 |
| 4,070,624 A | 1/1978 | Taylor | 324/772 |
| 4,086,531 A | 4/1978 | Bernier | 324/772 |
| 4,106,025 A | 8/1978 | Katz | 343/715 |
| 4,112,351 A | 9/1978 | Back et al. | 324/380 |
| 4,114,083 A | 9/1978 | Benham et al. | 340/636.13 |
| 4,126,874 A | 11/1978 | Suzuki et al. | 396/301 |
| 4,160,916 A | 7/1979 | Papasideris | 307/10.6 |
| 4,176,315 A | 11/1979 | Sunnarborg | 324/133 |
| 4,178,546 A | 12/1979 | Hulls et al. | 324/772 |
| 4,193,025 A | 3/1980 | Frailing et al. | 324/427 |
| 4,207,610 A | 6/1980 | Gordon | 701/33.9 |
| 4,207,611 A | 6/1980 | Gordon | 701/33 |
| 4,217,645 A | 8/1980 | Barry et al. | 702/63 |
| 4,218,745 A | 8/1980 | Perkins | 324/66 |
| 4,280,457 A | 7/1981 | Bloxham | 123/198 R |
| 4,295,468 A | 10/1981 | Bartelt | |
| 4,297,639 A | 10/1981 | Branham | 324/429 |
| 4,307,342 A | 12/1981 | Peterson | 324/767 |
| 4,315,204 A | 2/1982 | Sievers et al. | 322/28 |
| 4,316,185 A | 2/1982 | Watrous et al. | 340/636.11 |
| 4,322,685 A | 3/1982 | Frailing et al. | 324/429 |
| 4,351,405 A | 6/1982 | Fields et al. | 180/65.2 |
| 4,352,067 A | 9/1982 | Ottone | 324/434 |
| 4,360,780 A | 11/1982 | Skutch, Jr. | 324/437 |
| 4,361,809 A | 11/1982 | Bil et al. | 324/426 |
| 4,363,407 A | 12/1982 | Buckler et al. | 209/3.3 |
| 4,369,407 A | 1/1983 | Korbell | 324/416 |
| 4,379,989 A | 4/1983 | Kurz et al. | 320/165 |
| 4,379,990 A | 4/1983 | Sievers et al. | 322/99 |
| 4,385,269 A | 5/1983 | Aspinwall et al. | 320/129 |
| 4,390,828 A | 6/1983 | Converse et al. | 320/153 |
| 4,392,101 A | 7/1983 | Saar et al. | 320/156 |
| 4,396,880 A | 8/1983 | Windebank | 320/156 |
| 4,408,157 A | 10/1983 | Beaubien | 324/712 |
| 4,412,169 A | 10/1983 | Dell'Orto | 320/123 |
| 4,423,378 A | 12/1983 | Marino et al. | 324/427 |
| 4,423,379 A | 12/1983 | Jacobs et al. | 324/429 |
| 4,424,491 A | 1/1984 | Bobbett et al. | 324/433 |
| 4,425,791 A | 1/1984 | Kling | 73/116.02 |
| 4,441,359 A | 4/1984 | Ezoe | 73/116.06 |
| 4,459,548 A | 7/1984 | Lentz et al. | 324/472 |
| 4,502,000 A | 2/1985 | Mashikian | |
| 4,514,694 A | 4/1985 | Finger | 324/429 |
| 4,520,353 A | 5/1985 | McAuliffe | 340/636.16 |
| 4,521,498 A | 6/1985 | Juergens | 429/59 |
| 4,544,312 A | 10/1985 | Stencel | |
| 4,560,230 A | 12/1985 | Inglis | 439/890 |
| 4,564,798 A | 1/1986 | Young | 320/103 |
| 4,620,767 A | 11/1986 | Woolf | 439/217 |
| 4,626,765 A | 12/1986 | Tanaka | 320/127 |
| 4,633,418 A | 12/1986 | Bishop | 702/63 |
| 4,637,359 A | 1/1987 | Cook | 123/179 |
| 4,643,511 A | 2/1987 | Gawlik | 439/755 |
| 4,659,977 A | 4/1987 | Kissel et al. | 320/150 |
| 4,663,580 A | 5/1987 | Wortman | 320/153 |
| 4,665,370 A | 5/1987 | Holland | 324/429 |
| 4,667,143 A | 5/1987 | Cooper et al. | 320/153 |
| 4,667,279 A | 5/1987 | Maier | 363/46 |
| 4,678,998 A | 7/1987 | Muramatsu | 324/427 |
| 4,679,000 A | 7/1987 | Clark | 324/428 |
| 4,680,528 A | 7/1987 | Mikami et al. | 320/165 |
| 4,686,442 A | 8/1987 | Radomski | 320/123 |
| 4,697,134 A | 9/1987 | Burkum et al. | 320/134 |
| 4,707,795 A | 11/1987 | Alber et al. | 702/63 |
| 4,709,202 A | 11/1987 | Koenck et al. | 320/112 |
| 4,710,861 A | 12/1987 | Kanner | 363/46 |

(56) References Cited

U.S. PATENT DOCUMENTS

| | | | |
|---|---|---|---|
| 4,719,428 A | 1/1988 | Liebermann | 324/436 |
| 4,723,656 A | 2/1988 | Kiernan et al. | 206/705 |
| 4,743,855 A | 5/1988 | Randin et al. | 324/430 |
| 4,745,349 A | 5/1988 | Palanisamy et al. | 320/125 |
| 4,773,011 A | 9/1988 | VanHoose | 701/30 |
| 4,781,629 A | 11/1988 | Mize | 439/822 |
| D299,909 S | 2/1989 | Casey | D10/77 |
| 4,816,768 A | 3/1989 | Champlin | 324/436 |
| 4,820,966 A | 4/1989 | Fridman | 320/116 |
| 4,825,170 A | 4/1989 | Champlin | 324/436 |
| 4,826,457 A | 5/1989 | Varatta | 439/504 |
| 4,847,547 A | 7/1989 | Eng, Jr. et al. | 320/153 |
| 4,849,700 A | 7/1989 | Morioka et al. | 324/427 |
| 4,874,679 A | 10/1989 | Miyagawa | 429/91 |
| 4,876,495 A | 10/1989 | Palanisamy et al. | 320/106 |
| 4,881,038 A | 11/1989 | Champlin | 324/426 |
| 4,885,523 A | 12/1989 | Koench | 230/131 |
| 4,888,716 A | 12/1989 | Ueno | 702/63 |
| 4,901,007 A | 2/1990 | Sworm | 324/110 |
| 4,907,176 A | 3/1990 | Bahnick et al. | 364/551.01 |
| 4,912,416 A | 3/1990 | Champlin | 324/430 |
| 4,913,116 A | 4/1990 | Katogi et al. | 123/406.32 |
| 4,926,330 A | 5/1990 | Abe et al. | 701/33 |
| 4,929,931 A | 5/1990 | McCuen | 340/636.15 |
| 4,931,738 A | 6/1990 | MacIntyre et al. | 324/435 |
| 4,932,905 A | 6/1990 | Richards | 439/822 |
| 4,933,845 A | 6/1990 | Hayes | 710/104 |
| 4,934,957 A | 6/1990 | Bellusci | 439/504 |
| 4,937,528 A | 6/1990 | Palanisamy | 324/430 |
| 4,947,124 A | 8/1990 | Hauser | 324/430 |
| 4,949,046 A | 8/1990 | Seyfang | 324/427 |
| 4,956,597 A | 9/1990 | Heavey et al. | 320/129 |
| 4,965,738 A | 10/1990 | Bauer et al. | 320/136 |
| 4,968,941 A | 11/1990 | Rogers | 324/428 |
| 4,968,942 A | 11/1990 | Palanisamy | 324/430 |
| 4,969,834 A | 11/1990 | Johnson | 439/841 |
| 4,983,086 A | 1/1991 | Hatrock | 411/259 |
| 5,004,979 A | 4/1991 | Marino et al. | 324/160 |
| 5,030,916 A | 7/1991 | Bokitch | 324/503 |
| 5,032,825 A | 7/1991 | Kuznicki | 340/636.15 |
| 5,034,893 A | 7/1991 | Fisher | 701/99 |
| 5,037,335 A | 8/1991 | Campbell | 439/217 |
| 5,037,778 A | 8/1991 | Stark et al. | 228/121 |
| 5,047,722 A | 9/1991 | Wurst et al. | 324/430 |
| 5,081,565 A | 1/1992 | Nabha et al. | 362/465 |
| 5,083,076 A | 1/1992 | Scott | 320/105 |
| 5,087,881 A | 2/1992 | Peacock | 324/378 |
| 5,095,223 A | 3/1992 | Thomas | 307/110 |
| 5,108,320 A | 4/1992 | Kimber | 439/883 |
| 5,109,213 A | 4/1992 | Williams | 340/447 |
| 5,126,675 A | 6/1992 | Yang | 324/435 |
| 5,130,658 A | 7/1992 | Bohmer | 324/435 |
| 5,140,269 A | 8/1992 | Champlin | 324/433 |
| 5,144,218 A | 9/1992 | Bosscha | 320/139 |
| 5,144,248 A | 9/1992 | Alexandres et al. | 324/428 |
| D330,338 S | 10/1992 | Wang | D10/77 |
| 5,159,272 A | 10/1992 | Rao et al. | 324/429 |
| 5,160,881 A | 11/1992 | Schramm et al. | 322/7 |
| 5,164,653 A | 11/1992 | Reem | |
| 5,167,529 A | 12/1992 | Verge | 427/1 |
| 5,168,208 A | 12/1992 | Schultz et al. | 322/25 |
| 5,170,124 A | 12/1992 | Blair et al. | 324/434 |
| 5,179,335 A | 1/1993 | Nor | 320/159 |
| 5,187,382 A | 2/1993 | Kondo | 307/10.1 |
| 5,194,799 A | 3/1993 | Tomantschger | 320/103 |
| 5,202,617 A | 4/1993 | Nor | |
| 5,204,611 A | 4/1993 | Nor et al. | 320/145 |
| 5,214,370 A | 5/1993 | Harm et al. | 320/152 |
| 5,214,385 A | 5/1993 | Gabriel et al. | 324/434 |
| 5,223,747 A | 6/1993 | Tschulena | 257/713 |
| 5,241,275 A | 8/1993 | Fang | 324/430 |
| 5,254,952 A | 10/1993 | Salley et al. | 324/429 |
| 5,266,880 A | 11/1993 | Newland | 320/125 |
| 5,278,759 A | 1/1994 | Berra et al. | 701/1 |
| 5,281,919 A | 1/1994 | Palanisamy | 324/427 |
| 5,281,920 A | 1/1994 | Wurst | 324/430 |
| 5,295,078 A | 3/1994 | Stich et al. | 700/297 |
| 5,296,823 A | 3/1994 | Dietrich | 333/161 |
| 5,298,797 A | 3/1994 | Redl | 327/387 |
| 5,300,874 A | 4/1994 | Shimamoto et al. | 320/106 |
| 5,302,902 A | 4/1994 | Groehl | 324/434 |
| 5,309,052 A | 5/1994 | Kim | 174/350 |
| 5,313,152 A | 5/1994 | Wozniak et al. | 320/118 |
| 5,315,287 A | 5/1994 | Sol | 340/455 |
| 5,321,231 A | 6/1994 | Schmalzriedt et al. | |
| 5,321,626 A | 6/1994 | Palladino | 702/63 |
| 5,321,627 A | 6/1994 | Reher | 702/63 |
| 5,323,337 A | 6/1994 | Wilson et al. | 702/73 |
| 5,325,041 A | 6/1994 | Briggs | 320/149 |
| 5,331,268 A | 7/1994 | Patino et al. | 320/158 |
| 5,332,927 A | 7/1994 | Paul et al. | 307/66 |
| 5,336,993 A | 8/1994 | Thomas et al. | 324/158.1 |
| 5,338,515 A | 8/1994 | Dalla Betta et al. | 422/95 |
| 5,339,018 A | 8/1994 | Brokaw | 320/147 |
| 5,343,380 A | 8/1994 | Champlin | 363/46 |
| 5,345,384 A | 9/1994 | Przybyla et al. | 701/29.1 |
| 5,347,163 A | 9/1994 | Yoshimura | 307/66 |
| 5,349,535 A | 9/1994 | Gupta | 320/106 |
| 5,352,968 A | 10/1994 | Reni et al. | 320/136 |
| 5,357,519 A | 10/1994 | Martin et al. | 371/15.1 |
| 5,365,160 A | 11/1994 | Leppo et al. | 320/160 |
| 5,365,453 A | 11/1994 | Startup et al. | 702/36 |
| 5,369,364 A | 11/1994 | Renirie et al. | 324/430 |
| 5,381,096 A | 1/1995 | Hirzel | 324/427 |
| 5,384,540 A | 1/1995 | Dessel | 324/539 |
| 5,387,871 A | 2/1995 | Tsai | 324/429 |
| 5,394,093 A | 2/1995 | Cervas | 324/556 |
| 5,402,007 A | 3/1995 | Center et al. | 290/40 B |
| 5,410,754 A | 4/1995 | Klotzbach et al. | 370/466 |
| 5,412,308 A | 5/1995 | Brown | 323/267 |
| 5,412,323 A | 5/1995 | Kato et al. | 324/429 |
| 5,425,041 A | 6/1995 | Seko et al. | 372/45.01 |
| 5,426,371 A | 6/1995 | Salley et al. | 324/429 |
| 5,426,416 A | 6/1995 | Jefferies et al. | 340/664 |
| 5,430,645 A | 7/1995 | Keller | 364/424.01 |
| 5,432,025 A | 7/1995 | Cox | 29/65 |
| 5,432,426 A | 7/1995 | Yoshida | 320/160 |
| 5,432,429 A | 7/1995 | Armstrong, II et al. | |
| 5,434,495 A | 7/1995 | Toko | 320/135 |
| 5,435,185 A | 7/1995 | Eagan | 73/587 |
| 5,442,274 A | 8/1995 | Tamai | 320/146 |
| 5,445,026 A | 8/1995 | Eagan | 73/591 |
| 5,449,996 A | 9/1995 | Matsumoto et al. | 320/148 |
| 5,449,997 A | 9/1995 | Gilmore et al. | 320/148 |
| 5,451,881 A | 9/1995 | Finger | 324/433 |
| 5,453,027 A | 9/1995 | Buell et al. | 439/433 |
| 5,457,377 A | 10/1995 | Jonsson | 324/430 |
| 5,459,660 A | 10/1995 | Berra | 701/33 |
| 5,462,439 A * | 10/1995 | Keith | B60L 53/305 439/246 |
| 5,469,043 A | 11/1995 | Cherng et al. | 320/161 |
| 5,485,090 A | 1/1996 | Stephens | 324/433 |
| 5,486,123 A | 1/1996 | Miyazaki | 439/825 |
| 5,488,300 A | 1/1996 | Jamieson | 324/432 |
| 5,504,674 A | 4/1996 | Chen et al. | 705/4 |
| 5,508,599 A | 4/1996 | Koenck | 320/138 |
| 5,519,383 A | 5/1996 | De La Rosa | 340/636.15 |
| 5,528,148 A | 6/1996 | Rogers | 320/137 |
| 5,537,967 A | 7/1996 | Tashiro et al. | 123/192.1 |
| 5,541,489 A | 7/1996 | Dunstan | 320/134 |
| 5,546,317 A | 8/1996 | Andrieu | 702/63 |
| 5,548,273 A | 8/1996 | Nicol et al. | 340/439 |
| 5,550,485 A | 8/1996 | Falk | 324/772 |
| 5,555,498 A | 9/1996 | Berra | |
| 5,561,380 A | 10/1996 | Sway-Tin et al. | 324/509 |
| 5,562,501 A | 10/1996 | Kinoshita et al. | 439/852 |
| 5,563,496 A | 10/1996 | McClure | 320/128 |
| 5,572,136 A | 11/1996 | Champlin | 324/426 |
| 5,573,611 A | 11/1996 | Koch et al. | 152/152.1 |
| 5,574,355 A | 11/1996 | McShane et al. | 320/161 |
| 5,578,915 A | 11/1996 | Crouch, Jr. et al. | 324/428 |
| 5,583,416 A | 12/1996 | Klang | 320/160 |
| 5,585,416 A | 12/1996 | Audett et al. | 522/35 |
| 5,585,728 A | 12/1996 | Champlin | 324/427 |

(56) References Cited

U.S. PATENT DOCUMENTS

| | | | |
|---|---|---|---|
| 5,589,292 A | 12/1996 | Rozon | |
| 5,589,757 A | 12/1996 | Klang | 320/160 |
| 5,592,093 A | 1/1997 | Klingbiel | 324/426 |
| 5,592,094 A | 1/1997 | Ichikawa | 324/427 |
| 5,596,260 A | 1/1997 | Moravec et al. | 320/135 |
| 5,596,261 A | 1/1997 | Suyama | 320/152 |
| 5,598,098 A | 1/1997 | Champlin | 324/430 |
| 5,602,462 A | 2/1997 | Stich et al. | 323/258 |
| 5,606,242 A | 2/1997 | Hull et al. | 320/106 |
| 5,614,788 A | 3/1997 | Mullins et al. | 315/82 |
| 5,621,298 A | 4/1997 | Harvey | 320/134 |
| 5,631,536 A | 5/1997 | Tseng | 320/15 |
| 5,631,831 A | 5/1997 | Bird et al. | 701/34.4 |
| 5,633,985 A | 5/1997 | Severson et al. | 704/267 |
| 5,637,978 A | 6/1997 | Kellett et al. | 320/104 |
| 5,642,031 A | 6/1997 | Brotto | 320/156 |
| 5,644,212 A | 7/1997 | Takahashi | 320/134 |
| 5,650,937 A | 7/1997 | Bounaga | 702/65 |
| 5,652,501 A | 7/1997 | McClure et al. | 340/636.15 |
| 5,653,659 A | 8/1997 | Kunibe et al. | 477/111 |
| 5,654,623 A | 8/1997 | Shiga et al. | 320/106 |
| 5,656,920 A | 8/1997 | Cherng et al. | 324/431 |
| 5,661,368 A | 8/1997 | Deol et al. | 315/82 |
| 5,666,040 A | 9/1997 | Bourbeau | 320/118 |
| 5,675,234 A | 10/1997 | Greene | 340/636.11 |
| 5,677,077 A | 10/1997 | Faulk | 429/90 |
| 5,684,678 A | 11/1997 | Barrett | 363/17 |
| 5,685,734 A | 11/1997 | Kutz | 439/371 |
| 5,691,621 A | 11/1997 | Phuoc et al. | 320/134 |
| 5,699,050 A | 12/1997 | Kanazawa | 340/636.13 |
| 5,701,089 A | 12/1997 | Perkins | 324/772 |
| 5,705,929 A | 1/1998 | Caravello et al. | 324/430 |
| 5,707,015 A | 1/1998 | Guthrie | 241/120 |
| 5,710,503 A | 1/1998 | Sideris et al. | 320/116 |
| 5,711,648 A | 1/1998 | Hammerslag | 414/800 |
| 5,712,795 A | 1/1998 | Layman et al. | 700/297 |
| 5,717,336 A | 2/1998 | Basell et al. | 324/430 |
| 5,717,937 A | 2/1998 | Fritz | 713/300 |
| 5,721,688 A | 2/1998 | Bramwell | 324/426 |
| 5,732,074 A | 3/1998 | Spaur et al. | 370/313 |
| 5,739,667 A | 4/1998 | Matsuda et al. | 320/128 |
| 5,744,962 A | 4/1998 | Alber et al. | 324/426 |
| 5,745,044 A | 4/1998 | Hyatt, Jr. et al. | 340/5.23 |
| 5,747,189 A | 5/1998 | Perkins | 429/91 |
| 5,747,909 A | 5/1998 | Syverson et al. | 310/156.56 |
| 5,747,967 A | 5/1998 | Muljadi et al. | 320/148 |
| 5,754,417 A | 5/1998 | Nicollini | 363/60 |
| 5,757,192 A | 5/1998 | McShane et al. | 324/427 |
| 5,760,587 A | 6/1998 | Harvey | 324/434 |
| 5,772,468 A | 6/1998 | Kowalski et al. | 439/506 |
| 5,773,962 A | 6/1998 | Nor | 320/134 |
| 5,773,978 A | 6/1998 | Becker | 324/430 |
| 5,778,326 A | 7/1998 | Moroto et al. | 701/22 |
| 5,780,974 A | 7/1998 | Pabla et al. | 315/82 |
| 5,780,980 A | 7/1998 | Naito | 318/139 |
| 5,789,899 A | 8/1998 | van Phuoc et al. | 320/112 |
| 5,793,359 A | 8/1998 | Ushikubo | 345/169 |
| 5,796,239 A | 8/1998 | van Phuoc et al. | 320/107 |
| 5,808,469 A | 9/1998 | Kopera | 324/434 |
| 5,811,979 A | 9/1998 | Rhein | 324/718 |
| 5,818,201 A | 10/1998 | Stockstad et al. | 320/119 |
| 5,818,234 A | 10/1998 | McKinnon | 324/433 |
| 5,820,407 A | 10/1998 | Morse et al. | 439/504 |
| 5,821,756 A | 10/1998 | McShane et al. | 324/430 |
| 5,821,757 A | 10/1998 | Alvarez et al. | 324/434 |
| 5,825,174 A | 10/1998 | Parker | 324/106 |
| 5,826,467 A | 10/1998 | Huang | |
| 5,831,435 A | 11/1998 | Troy | 324/426 |
| 5,832,396 A | 11/1998 | Moroto et al. | 701/22 |
| 5,850,113 A | 12/1998 | Weimer et al. | 307/125 |
| 5,862,515 A | 1/1999 | Kobayashi et al. | 702/63 |
| 5,865,638 A | 2/1999 | Trafton | 439/288 |
| 5,869,951 A | 2/1999 | Takahashi | 320/104 |
| 5,870,018 A | 2/1999 | Person | 307/10.2 |
| 5,871,858 A | 2/1999 | Thomsen et al. | 429/7 |
| 5,872,443 A | 2/1999 | Williamson | 320/160 |
| 5,872,453 A | 2/1999 | Shimoyama et al. | 324/431 |
| 5,883,306 A | 3/1999 | Hwang | 73/146.8 |
| 5,884,202 A | 3/1999 | Arjomand | 701/31.4 |
| 5,895,440 A | 4/1999 | Proctor et al. | 702/63 |
| 5,903,154 A | 5/1999 | Zhang et al. | 324/437 |
| 5,903,716 A | 5/1999 | Kimber et al. | 395/114 |
| 5,912,534 A | 6/1999 | Benedict | 315/82 |
| 5,914,605 A | 6/1999 | Bertness | 324/430 |
| 5,916,287 A | 6/1999 | Arjomand et al. | 701/33.2 |
| 5,927,938 A | 7/1999 | Hammerslag | 414/809 |
| 5,929,609 A | 7/1999 | Joy et al. | 322/25 |
| 5,935,180 A | 8/1999 | Fieramosca et al. | 701/29.6 |
| 5,939,855 A | 8/1999 | Proctor et al. | 320/104 |
| 5,939,861 A | 8/1999 | Joko et al. | 320/122 |
| 5,945,829 A | 8/1999 | Bertness | 324/430 |
| 5,946,605 A | 8/1999 | Takahisa et al. | 455/68 |
| 5,950,144 A | 9/1999 | Hall et al. | 702/108 |
| 5,951,229 A | 9/1999 | Hammerslag | 414/398 |
| 5,953,322 A | 9/1999 | Kimball | 370/328 |
| 5,955,951 A | 9/1999 | Wischerop et al. | 340/572.8 |
| 5,961,561 A | 10/1999 | Wakefield, II | 701/29 |
| 5,961,604 A | 10/1999 | Anderson et al. | 709/229 |
| 5,963,012 A | 10/1999 | Garcia et al. | 320/106 |
| 5,969,625 A | 10/1999 | Russo | 340/636.19 |
| 5,973,598 A | 10/1999 | Beigel | 340/572.1 |
| 5,978,805 A | 11/1999 | Carson | 707/10 |
| 5,982,138 A | 11/1999 | Krieger | 320/105 |
| 5,990,664 A | 11/1999 | Rahman | 320/136 |
| 6,002,238 A | 12/1999 | Champlin | 320/134 |
| 6,005,489 A | 12/1999 | Siegle et al. | 340/825.69 |
| 6,005,759 A | 12/1999 | Hart et al. | 361/66 |
| 6,008,652 A | 12/1999 | Theofanopoulos et al. | 324/434 |
| 6,009,369 A | 12/1999 | Boisvert et al. | 701/99 |
| 6,009,742 A | 1/2000 | Balko | |
| 6,016,047 A | 1/2000 | Notten et al. | 320/137 |
| 6,031,354 A | 2/2000 | Wiley et al. | 320/116 |
| 6,031,368 A | 2/2000 | Klippel et al. | 324/133 |
| 6,037,745 A | 3/2000 | Koike et al. | 320/104 |
| 6,037,751 A | 3/2000 | Klang | 320/160 |
| 6,037,777 A | 3/2000 | Champlin | 324/430 |
| 6,037,778 A | 3/2000 | Makhija | 324/433 |
| 6,037,749 A | 4/2000 | Parsonage | 320/132 |
| 6,046,514 A | 4/2000 | Rouillard et al. | 307/77 |
| 6,051,976 A | 4/2000 | Bertness | 324/426 |
| 6,055,468 A | 4/2000 | Kaman et al. | 701/29 |
| 6,061,638 A | 5/2000 | Joyce | 702/63 |
| 6,064,372 A | 5/2000 | Kahkoska | 345/173 |
| 6,072,299 A | 6/2000 | Kurle et al. | 320/112 |
| 6,072,300 A | 6/2000 | Tsuji | 320/116 |
| 6,075,339 A | 6/2000 | Reipur et al. | 320/110 |
| 6,081,098 A | 6/2000 | Bertness et al. | 320/134 |
| 6,081,109 A | 6/2000 | Seymour et al. | 324/127 |
| 6,081,154 A | 6/2000 | Ezell et al. | 327/540 |
| 6,087,815 A | 7/2000 | Pfeifer et al. | 323/282 |
| 6,091,238 A | 7/2000 | McDermott | 324/207.2 |
| 6,091,245 A | 7/2000 | Bertness | 324/426 |
| 6,094,033 A | 7/2000 | Ding et al. | 320/132 |
| 6,097,193 A | 8/2000 | Bramwell | 324/429 |
| 6,100,670 A | 8/2000 | Levesque | 320/150 |
| 6,100,815 A | 8/2000 | Pailthorp | 324/754.07 |
| 6,104,167 A | 8/2000 | Bertness et al. | 320/132 |
| 6,113,262 A | 9/2000 | Purola et al. | 374/45 |
| 6,114,834 A | 9/2000 | Parise | 320/109 |
| 6,118,252 A | 9/2000 | Richter | |
| 6,121,880 A | 9/2000 | Scott et al. | 340/572.5 |
| 6,130,519 A | 10/2000 | Whiting et al. | |
| 6,136,914 A | 10/2000 | Hergenrother et al. | 524/495 |
| 6,137,261 A | 10/2000 | Kurle et al. | |
| 6,137,269 A | 10/2000 | Champlin | 320/150 |
| 6,140,797 A | 10/2000 | Dunn | 320/105 |
| 6,141,608 A | 10/2000 | Rother | 701/29.6 |
| 6,144,185 A | 11/2000 | Dougherty et al. | 320/132 |
| 6,147,598 A | 11/2000 | Murphy et al. | 340/426.19 |
| 6,149,653 A | 11/2000 | Deslauriers | 606/232 |
| 6,150,793 A | 11/2000 | Lesesky et al. | 320/104 |
| 6,158,000 A | 12/2000 | Collins | 713/1 |
| 6,161,640 A | 12/2000 | Yamaguchi | 180/65.8 |
| 6,163,156 A | 12/2000 | Bertness | 324/426 |

(56) References Cited

U.S. PATENT DOCUMENTS

| | | | |
|---|---|---|---|
| 6,164,063 A | 12/2000 | Mendler | 60/274 |
| 6,167,349 A | 12/2000 | Alvarez | 702/63 |
| 6,172,483 B1 | 1/2001 | Champlin | 320/134 |
| 6,172,505 B1 | 1/2001 | Bertness | 324/430 |
| 6,177,737 B1 | 1/2001 | Palfey et al. | 307/64 |
| 6,177,878 B1 | 1/2001 | Tamura | |
| 6,181,545 B1 | 1/2001 | Amatucci et al. | 361/502 |
| 6,184,655 B1 | 2/2001 | Malackowski | 320/116 |
| 6,184,656 B1 | 2/2001 | Karunasiri et al. | 320/119 |
| 6,191,557 B1 | 2/2001 | Gray et al. | 320/132 |
| 6,202,739 B1 | 3/2001 | Pal et al. | 165/104.33 |
| 6,211,651 B1 | 4/2001 | Nemoto | 320/133 |
| 6,211,653 B1 | 4/2001 | Stasko | 320/132 |
| 6,215,275 B1 | 4/2001 | Bean | 320/106 |
| 6,218,805 B1 | 4/2001 | Melcher | 320/105 |
| 6,218,936 B1 | 4/2001 | Imao | 340/447 |
| 6,222,342 B1 | 4/2001 | Eggert et al. | 320/105 |
| 6,222,369 B1 | 4/2001 | Champlin | 324/430 |
| D442,503 S | 5/2001 | Lundbeck et al. | D10/77 |
| 6,225,808 B1 | 5/2001 | Varghese et al. | 324/426 |
| 6,225,898 B1 | 5/2001 | Kamiya et al. | 340/505 |
| 6,236,186 B1 | 5/2001 | Helton et al. | 320/106 |
| 6,236,332 B1 | 5/2001 | Conkright et al. | 340/3.1 |
| 6,236,949 B1 | 5/2001 | Hart | 702/64 |
| 6,238,253 B1 | 5/2001 | Qualls | 439/759 |
| 6,242,887 B1 | 6/2001 | Burke | 320/104 |
| 6,242,921 B1 | 6/2001 | Thibedeau et al. | 324/429 |
| 6,249,124 B1 | 6/2001 | Bertness | 324/426 |
| 6,250,973 B1 | 6/2001 | Lowery et al. | 439/763 |
| 6,252,942 B1 | 6/2001 | Zoiss | 379/19 |
| 6,254,438 B1 | 7/2001 | Gaunt | 439/755 |
| 6,255,826 B1 | 7/2001 | Ohsawa | 320/116 |
| 6,259,170 B1 | 7/2001 | Limoge et al. | 307/10.8 |
| 6,259,254 B1 | 7/2001 | Klang | 324/427 |
| 6,262,563 B1 | 7/2001 | Champlin | 320/134 |
| 6,262,692 B1 | 7/2001 | Babb | 343/895 |
| 6,263,268 B1 | 7/2001 | Nathanson | 701/29 |
| 6,263,322 B1 | 7/2001 | Kirkevold et al. | 705/400 |
| 6,271,643 B1 | 8/2001 | Becker et al. | 320/112 |
| 6,271,748 B1 | 8/2001 | Derbyshire et al. | 340/442 |
| 6,272,387 B1 | 8/2001 | Yoon | 700/83 |
| 6,275,008 B1 | 8/2001 | Arai et al. | 320/132 |
| 6,285,191 B1 | 9/2001 | Gollomp et al. | 324/427 |
| 6,294,896 B1 | 9/2001 | Champlin | 320/134 |
| 6,294,897 B1 | 9/2001 | Champlin | 320/153 |
| 6,304,087 B1 | 10/2001 | Bertness | 324/426 |
| 6,307,349 B1 | 10/2001 | Koenck et al. | 320/112 |
| 6,310,481 B2 | 10/2001 | Bertness | 324/430 |
| 6,313,607 B1 | 11/2001 | Champlin | 320/132 |
| 6,313,608 B1 | 11/2001 | Varghese et al. | 320/132 |
| 6,316,914 B1 | 11/2001 | Bertness | 320/134 |
| 6,320,385 B1 | 11/2001 | Ng et al. | 320/104 |
| 6,323,650 B1 | 11/2001 | Bertness et al. | 324/426 |
| 6,324,042 B1 | 11/2001 | Andrews | 361/93.2 |
| 6,329,793 B1 | 12/2001 | Bertness et al. | 320/132 |
| 6,331,762 B1 | 12/2001 | Bertness | 320/134 |
| 6,332,113 B1 | 12/2001 | Bertness | 702/63 |
| 6,346,795 B2 | 2/2002 | Haraguchi et al. | 320/136 |
| 6,347,958 B1 | 2/2002 | Tsai | 439/488 |
| 6,351,102 B1 | 2/2002 | Troy | 320/139 |
| 6,356,042 B1 | 3/2002 | Kahlon et al. | 318/138 |
| 6,356,083 B1 | 3/2002 | Ying | 324/426 |
| 6,359,441 B1 | 3/2002 | Bertness | 324/426 |
| 6,359,442 B1 | 3/2002 | Henningson et al. | 324/426 |
| 6,363,303 B1 | 3/2002 | Bertness | 701/29 |
| RE37,677 E | 4/2002 | Irie | 315/83 |
| 6,377,031 B1 | 4/2002 | Karuppana et al. | 323/220 |
| 6,384,608 B1 | 5/2002 | Namaky | 324/430 |
| 6,388,448 B1 | 5/2002 | Cervas | 324/426 |
| 6,389,337 B1 | 5/2002 | Kolls | 701/31.6 |
| 6,392,414 B2 | 5/2002 | Bertness | 324/429 |
| 6,396,278 B1 | 5/2002 | Makhija | 324/402 |
| 6,407,554 B1 | 6/2002 | Godau et al. | 324/503 |
| 6,411,098 B1 | 6/2002 | Laletin | 324/436 |
| 6,417,669 B1 | 7/2002 | Champlin | 324/426 |
| 6,420,852 B1 | 7/2002 | Sato | 320/134 |
| 6,424,157 B1 | 7/2002 | Gollomp et al. | 324/430 |
| 6,424,158 B2 | 7/2002 | Klang | 324/433 |
| 6,433,512 B1 | 8/2002 | Birkler et al. | 320/132 |
| 6,437,957 B1 | 8/2002 | Karuppana et al. | 361/78 |
| 6,441,585 B1 | 8/2002 | Bertness | 320/132 |
| 6,445,158 B1 | 9/2002 | Bertness et al. | 320/104 |
| 6,448,778 B1 | 9/2002 | Rankin | 324/503 |
| 6,449,726 B1 | 9/2002 | Smith | 713/340 |
| 6,456,036 B1 | 9/2002 | Thandiwe | 320/106 |
| 6,456,045 B1 | 9/2002 | Troy et al. | 320/139 |
| 6,465,908 B1 | 10/2002 | Karuppana et al. | 307/31 |
| 6,466,025 B1 | 10/2002 | Klang | 324/429 |
| 6,466,026 B1 | 10/2002 | Champlin | 324/430 |
| 6,469,511 B1 | 10/2002 | Vonderhaar et al. | 324/425 |
| 6,473,659 B1 | 10/2002 | Shah et al. | 700/79 |
| 6,477,478 B1 | 11/2002 | Jones et al. | 702/102 |
| 6,495,990 B2 | 12/2002 | Champlin | 320/132 |
| 6,497,209 B1 | 12/2002 | Karuppana et al. | 123/179.3 |
| 6,500,025 B1 | 12/2002 | Moenkhaus et al. | 439/502 |
| 6,501,243 B1 | 12/2002 | Kaneko | 318/139 |
| 6,505,507 B1 | 1/2003 | Imao | 73/146.5 |
| 6,507,196 B2 | 1/2003 | Thomsen et al. | 324/436 |
| 6,526,361 B1 | 2/2003 | Jones et al. | 702/63 |
| 6,529,723 B1 | 3/2003 | Bentley | 455/405 |
| 6,531,847 B1 | 3/2003 | Tsukamoto et al. | |
| 6,531,848 B1 | 3/2003 | Chitsazan et al. | 320/153 |
| 6,532,425 B1 | 3/2003 | Boost et al. | 702/63 |
| 6,533,316 B2 | 3/2003 | Breed et al. | 280/735 |
| 6,534,992 B2 | 3/2003 | Meissner et al. | 324/426 |
| 6,534,993 B2 | 3/2003 | Bertness | 324/433 |
| 6,536,536 B1 | 3/2003 | Gass et al. | 173/2 |
| 6,544,078 B2 | 4/2003 | Palmisano et al. | 439/762 |
| 6,545,599 B2 | 4/2003 | Derbyshire et al. | 340/442 |
| 6,556,019 B2 | 4/2003 | Bertness | 324/426 |
| 6,566,883 B1 | 5/2003 | Vonderhaar et al. | 324/426 |
| 6,570,385 B1 | 5/2003 | Roberts et al. | 324/378 |
| 6,573,685 B2 | 6/2003 | Nakanishi et al. | |
| 6,577,107 B2 | 6/2003 | Kechmire | 320/139 |
| 6,586,941 B2 | 7/2003 | Bertness et al. | 324/426 |
| 6,597,150 B1 | 7/2003 | Bertness et al. | 320/104 |
| 6,599,243 B2 | 7/2003 | Woltermann et al. | 600/300 |
| 6,600,815 B1 | 7/2003 | Walding | 379/93.07 |
| 6,611,740 B2 | 8/2003 | Lowrey et al. | 701/29 |
| 6,614,349 B1 | 9/2003 | Proctor et al. | 340/572.1 |
| 6,618,644 B2 | 9/2003 | Bean | 700/231 |
| 6,621,272 B2 | 9/2003 | Champlin | 324/426 |
| 6,623,314 B1 | 9/2003 | Cox et al. | 439/759 |
| 6,624,635 B1 | 9/2003 | Lui | 324/426 |
| 6,628,011 B2 | 9/2003 | Droppo et al. | 307/43 |
| 6,629,054 B2 | 9/2003 | Makhija et al. | 702/113 |
| 6,633,165 B2 | 10/2003 | Bertness | 324/426 |
| 6,635,974 B1 | 10/2003 | Karuppana et al. | 307/140 |
| 6,636,790 B1 | 10/2003 | Lightner et al. | 701/31.5 |
| 6,667,624 B1 | 12/2003 | Raichle et al. | 324/522 |
| 6,679,212 B2 | 1/2004 | Kelling | 123/179.28 |
| 6,686,542 B2 | 2/2004 | Zhang | 174/74 |
| 6,696,819 B2 | 2/2004 | Bertness | 320/134 |
| 6,707,303 B2 | 3/2004 | Bertness et al. | 324/426 |
| 6,732,031 B1 | 5/2004 | Lightner et al. | 701/31.4 |
| 6,736,941 B2 | 5/2004 | Oku et al. | 203/68 |
| 6,737,831 B2 | 5/2004 | Champlin | 320/132 |
| 6,738,697 B2 | 5/2004 | Breed | 701/29 |
| 6,740,990 B2 | 5/2004 | Tozuka et al. | 307/9.1 |
| 6,744,149 B1 | 6/2004 | Karuppana et al. | 307/31 |
| 6,745,153 B2 | 6/2004 | White et al. | 702/184 |
| 6,759,849 B2 | 7/2004 | Bertness | 324/426 |
| 6,771,073 B2 | 8/2004 | Henningson et al. | 324/426 |
| 6,777,945 B2 | 8/2004 | Roberts et al. | 324/426 |
| 6,781,344 B1 | 8/2004 | Hedegor et al. | 320/106 |
| 6,781,382 B2 | 8/2004 | Johnson | 324/426 |
| 6,784,635 B2 | 8/2004 | Larson | 320/104 |
| 6,784,637 B2 | 8/2004 | Raichle et al. | 320/107 |
| 6,788,025 B2 | 9/2004 | Bertness et al. | 320/104 |
| 6,795,782 B2 | 9/2004 | Bertness et al. | 702/63 |
| 6,796,841 B1 | 9/2004 | Cheng et al. | 439/620.3 |
| 6,805,090 B2 | 10/2004 | Bertness et al. | 123/198 |
| 6,806,716 B2 | 10/2004 | Bertness et al. | 324/426 |
| 6,825,669 B2 | 11/2004 | Raichle et al. | 324/426 |

(56) References Cited

U.S. PATENT DOCUMENTS

| | | |
|---|---|---|
| 6,832,141 B2 | 12/2004 | Skeen et al. ............... 701/31.4 |
| 6,842,707 B2 | 1/2005 | Raichle et al. ............... 702/62 |
| 6,845,279 B1 | 1/2005 | Gilmore et al. ............ 700/115 |
| 6,850,037 B2 | 2/2005 | Bertness ...................... 320/132 |
| 6,856,162 B1 | 2/2005 | Greatorex et al. ....... 324/764.01 |
| 6,856,972 B1 | 2/2005 | Yun et al. ................. 705/36 R |
| 6,871,151 B2 | 3/2005 | Bertness ........................ 702/63 |
| 6,885,195 B2 | 4/2005 | Bertness ...................... 324/426 |
| 6,888,468 B2 | 5/2005 | Bertness .................. 340/636.15 |
| 6,891,378 B2 | 5/2005 | Bertness et al. ............. 324/426 |
| 6,895,809 B2 | 5/2005 | Raichle ........................... 73/119 |
| 6,904,796 B2 | 6/2005 | Pacsai et al. ................ 73/146.8 |
| 6,906,522 B2 | 6/2005 | Bertness et al. ............. 324/426 |
| 6,906,523 B2 | 6/2005 | Bertness et al. ............. 324/426 |
| 6,906,624 B2 | 6/2005 | McClelland et al. ......... 340/442 |
| 6,909,287 B2 | 6/2005 | Bertness ...................... 324/427 |
| 6,909,356 B2 | 6/2005 | Brown et al. .................. 340/3.2 |
| 6,911,825 B2 | 6/2005 | Namaky ...................... 324/426 |
| 6,913,483 B2 | 7/2005 | Restaino et al. .............. 439/504 |
| 6,914,413 B2 | 7/2005 | Bertness et al. ............. 320/104 |
| 6,919,725 B2 | 7/2005 | Bertness et al. ............. 324/433 |
| 6,930,485 B2 | 8/2005 | Bertness et al. ............. 324/426 |
| 6,933,727 B2 | 8/2005 | Bertness et al. ............. 324/426 |
| 6,941,234 B2 | 9/2005 | Bertness et al. ............... 702/63 |
| 6,957,133 B1 | 10/2005 | Hunt et al. ................... 701/32.4 |
| 6,961,445 B1 | 11/2005 | Jensen et al. |
| 6,966,676 B2 | 11/2005 | Chabert et al. |
| 6,967,484 B2 | 11/2005 | Bertness ...................... 324/426 |
| 6,972,662 B1 | 12/2005 | Ohkawa et al. .............. 340/10.1 |
| 6,983,212 B2 | 1/2006 | Burns ............................. 702/63 |
| 6,988,053 B2 | 1/2006 | Namaky ...................... 320/104 |
| 6,993,421 B2 | 1/2006 | Pillar et al. ................... 701/29.4 |
| 6,998,847 B2 | 2/2006 | Bertness et al. ............. 324/426 |
| 7,003,410 B2 | 2/2006 | Bertness et al. ............... 702/63 |
| 7,003,411 B2 | 2/2006 | Bertness ........................ 702/63 |
| 7,012,433 B2 | 3/2006 | Smith et al. .................. 324/426 |
| 7,015,674 B2 | 3/2006 | VonderHaar ................. 320/103 |
| 7,029,338 B1 | 4/2006 | Orange et al. ................. 439/755 |
| 7,034,541 B2 | 4/2006 | Bertness et al. ............. 324/426 |
| 7,039,533 B2 | 5/2006 | Bertness et al. ............... 702/63 |
| 7,042,346 B2 | 5/2006 | Paulsen ........................ 340/438 |
| 7,049,822 B2 | 5/2006 | Kung ........................... 324/426 |
| 7,058,525 B2 | 6/2006 | Bertness et al. ............... 702/63 |
| 7,069,979 B2 | 7/2006 | Tobias ...................... 165/104.33 |
| 7,081,755 B2 | 7/2006 | Klang et al. ................. 324/426 |
| 7,089,127 B2 | 8/2006 | Thibedeau et al. ............. 702/63 |
| 7,098,666 B2 | 8/2006 | Patino .......................... 324/433 |
| 7,102,556 B2 | 9/2006 | White ........................... 341/141 |
| 7,106,070 B2 | 9/2006 | Bertness et al. ............. 324/538 |
| 7,116,109 B2 | 10/2006 | Klang ........................... 324/426 |
| 7,119,686 B2 | 10/2006 | Bertness et al. ........... 340/572.1 |
| 7,120,488 B2 | 10/2006 | Nova et al. ....................... 600/2 |
| 7,126,341 B2 | 10/2006 | Bertness et al. ............. 324/426 |
| 7,129,706 B2 | 10/2006 | Kalley .......................... 324/426 |
| 7,154,276 B2 | 12/2006 | Bertness ...................... 324/503 |
| 7,170,393 B2 | 1/2007 | Martin ......................... 340/10.1 |
| 7,173,182 B2 | 2/2007 | Katsuyama et al. ............ 174/36 |
| 7,177,925 B2 | 2/2007 | Carcido et al. ............... 709/223 |
| 7,182,147 B2 | 2/2007 | Cutler et al. ..................... 173/1 |
| 7,184,866 B2 | 2/2007 | Squires .................... 340/426.15 |
| 7,184,905 B2 | 2/2007 | Stefan ............................ 702/63 |
| 7,198,510 B2 | 4/2007 | Bertness ...................... 439/500 |
| 7,200,424 B2 | 4/2007 | Tischer et al. ............... 455/567 |
| 7,202,636 B2 | 4/2007 | Reynolds et al. ............ 320/166 |
| 7,208,914 B2 | 4/2007 | Klang .......................... 320/132 |
| 7,209,850 B2 | 4/2007 | Brott et al. ................... 324/426 |
| 7,209,860 B2 | 4/2007 | Trsar et al. ................... 702/183 |
| 7,212,887 B2 | 5/2007 | Shah et al. ................... 700/276 |
| 7,212,911 B2 | 5/2007 | Raichle et al. ............... 701/114 |
| 7,219,023 B2 | 5/2007 | Banke et al. ................... 702/58 |
| 7,233,128 B2 | 6/2007 | Brost et al. ................... 320/132 |
| 7,235,977 B2 | 6/2007 | Koran et al. ................. 324/426 |
| 7,246,015 B2 | 7/2007 | Bertness et al. ............... 702/63 |
| 7,251,551 B2 | 7/2007 | Mitsueda ........................ 700/2 |
| 7,272,519 B2 | 9/2007 | Lesesky et al. ................ 702/63 |
| 7,287,001 B1 | 10/2007 | Falls et al. ...................... 705/22 |
| 7,295,936 B2 | 11/2007 | Bertness et al. ............... 702/63 |
| 7,301,303 B1 | 11/2007 | Hulden ......................... 320/103 |
| 7,319,304 B2 | 1/2008 | Veloo et al. .................. 320/134 |
| 7,339,477 B2 | 3/2008 | Puzio et al. ................ 340/572.1 |
| 7,363,175 B2 | 4/2008 | Bertness et al. ............... 702/63 |
| 7,376,497 B2 | 5/2008 | Chen ........................... 701/31.6 |
| 7,398,176 B2 | 7/2008 | Bertness |
| 7,408,358 B2 | 8/2008 | Knopf .......................... 324/426 |
| 7,425,833 B2 | 9/2008 | Bertness et al. ............. 324/426 |
| 7,446,536 B2 | 11/2008 | Bertness ...................... 324/426 |
| 7,453,238 B2 | 11/2008 | Melichar ...................... 320/132 |
| 7,479,763 B2 | 1/2009 | Bertness ...................... 320/134 |
| 7,498,767 B2 | 3/2009 | Brown et al. ................. 320/107 |
| 7,501,795 B2 | 3/2009 | Bertness et al. ............. 320/134 |
| 7,504,830 B2 | 3/2009 | Keuss |
| 7,505,856 B2 | 3/2009 | Restaino et al. ................ 702/63 |
| 7,538,571 B2 | 5/2009 | Raichle et al. ............... 324/772 |
| 7,545,146 B2 | 6/2009 | Klang et al. ................. 324/426 |
| 7,557,586 B1 | 7/2009 | Vonderhaar et al. ......... 324/437 |
| 7,571,035 B2 | 8/2009 | Raichle |
| 7,590,476 B2 | 9/2009 | Shumate ...................... 701/31.6 |
| 7,592,776 B2 | 9/2009 | Tsukamoto et al. .......... 320/136 |
| 7,595,643 B2 | 9/2009 | Klang ........................... 324/426 |
| 7,596,437 B1 | 9/2009 | Hunt et al. |
| 7,598,699 B2 | 10/2009 | Restaino et al. ............. 320/105 |
| 7,598,743 B2 | 10/2009 | Bertness ...................... 324/426 |
| 7,598,744 B2 | 10/2009 | Bertness et al. ............. 324/426 |
| 7,619,417 B2 | 11/2009 | Klang ........................... 324/427 |
| 7,642,786 B2 | 1/2010 | Philbrook .................... 324/426 |
| 7,642,787 B2 | 1/2010 | Bertness et al. ............. 324/426 |
| 7,656,162 B2 | 2/2010 | Vonderhaar et al. ......... 324/426 |
| 7,657,386 B2 | 2/2010 | Thibedeau et al. ............. 702/63 |
| 7,667,437 B2 | 2/2010 | Johnson et al. .............. 320/150 |
| 7,679,325 B2 | 3/2010 | Seo .............................. 320/116 |
| 7,684,908 B1 | 3/2010 | Ogilvie et al. ............... 701/29.6 |
| 7,688,074 B2 | 3/2010 | Cox et al. .................... 324/426 |
| 7,690,573 B2 | 4/2010 | Raichle et al. ............... 235/462 |
| 7,696,759 B2 | 4/2010 | Raichle et al. ............... 324/538 |
| 7,698,179 B2 | 4/2010 | Leung et al. ................... 705/28 |
| 7,705,602 B2 | 4/2010 | Bertness ...................... 324/426 |
| 7,706,991 B2 | 4/2010 | Bertness et al. ............... 702/63 |
| 7,706,992 B2 | 4/2010 | Ricci et al. |
| 7,710,119 B2 | 5/2010 | Bertness ...................... 324/426 |
| 7,723,993 B2 | 5/2010 | Klang ........................... 324/431 |
| 7,728,556 B2 | 6/2010 | Yano et al. ................... 320/134 |
| 7,728,597 B2 | 6/2010 | Bertness ...................... 324/426 |
| 7,729,880 B1 | 6/2010 | Mashburn .................... 702/151 |
| 7,743,788 B2 | 6/2010 | Schmitt ........................ 137/554 |
| 7,751,953 B2 | 7/2010 | Namaky ...................... 701/33.2 |
| 7,772,850 B2 | 8/2010 | Bertness ...................... 324/426 |
| 7,774,130 B2 | 8/2010 | Pepper ......................... 340/439 |
| 7,774,151 B2 | 8/2010 | Bertness ........................ 702/63 |
| 7,777,612 B2 | 8/2010 | Sampson et al. ........... 340/426.1 |
| 7,791,348 B2 | 9/2010 | Brown et al. ................. 324/426 |
| 7,797,995 B2 | 9/2010 | Schaefer |
| 7,808,375 B2 | 10/2010 | Bertness et al. ............. 340/455 |
| 7,848,857 B2 | 12/2010 | Nasr et al. ...................... 701/22 |
| 7,883,002 B2 | 2/2011 | Jin et al. ....................... 235/376 |
| 7,902,990 B2 | 3/2011 | Delmonico et al. ........ 340/636.1 |
| 7,914,350 B1 | 3/2011 | Bozich ......................... 439/506 |
| 7,924,015 B2 | 4/2011 | Bertness ...................... 324/427 |
| 7,940,052 B2 | 5/2011 | Vonderhaar |
| 7,940,053 B2 | 5/2011 | Brown et al. ................. 324/426 |
| 7,959,476 B2 | 6/2011 | Smith et al. |
| 7,977,914 B2 | 7/2011 | Bertness |
| D643,759 S | 8/2011 | Bertness |
| 7,990,155 B2 | 8/2011 | Henningson ................. 324/429 |
| 7,999,505 B2 | 8/2011 | Bertness ...................... 320/104 |
| 8,024,083 B2 | 9/2011 | Chenn ............................. 701/2 |
| 8,047,868 B1 | 11/2011 | Korcynski .................... 439/522 |
| 8,164,343 B2 | 4/2012 | Bertness ...................... 324/503 |
| 8,198,900 B2 | 6/2012 | Bertness et al. |
| 8,203,345 B2 | 6/2012 | Bertness |
| 8,222,868 B2 | 7/2012 | Buckner ....................... 320/136 |
| 8,226,008 B2 | 7/2012 | Raichle et al. .......... 235/462.13 |
| 8,237,448 B2 | 8/2012 | Bertness |
| 8,306,690 B2 | 11/2012 | Bertness ...................... 701/34.4 |
| 8,310,271 B2 | 11/2012 | Raichle et al. .......... 324/765.01 |

(56) References Cited

U.S. PATENT DOCUMENTS

| | | | |
|---|---|---|---|
| 8,344,685 B2 | 1/2013 | Bertness et al. | |
| 8,436,619 B2 | 5/2013 | Bertness et al. | |
| 8,442,877 B2 | 5/2013 | Bertness et al. | |
| 8,449,560 B2 | 5/2013 | Roth | 227/175.1 |
| 8,493,022 B2 | 7/2013 | Bertness | |
| D687,727 S | 8/2013 | Kehoe et al. | |
| 8,509,212 B2 | 8/2013 | Sanjeev | |
| 8,513,949 B2 | 8/2013 | Bertness | |
| 8,594,957 B2 | 11/2013 | Gauthier | 324/548 |
| 8,674,654 B2 | 3/2014 | Bertness | |
| 8,674,711 B2 | 3/2014 | Bertness | |
| 8,704,483 B2 | 4/2014 | Bertness et al. | |
| 8,738,309 B2 | 5/2014 | Bertness | |
| 8,754,653 B2 | 6/2014 | Volderhaar et al. | |
| 8,810,200 B2 | 8/2014 | Kondo | |
| 8,825,272 B1 | 9/2014 | Chinnadurai | |
| 8,827,729 B2 | 9/2014 | Gunreben | 439/188 |
| 8,872,516 B2 | 10/2014 | Bertness | |
| 8,872,517 B2 | 10/2014 | Philbrook et al. | |
| 8,901,888 B1 | 12/2014 | Beckman | |
| 8,958,998 B2 | 2/2015 | Bertness | |
| 8,963,550 B2 | 2/2015 | Bertness et al. | |
| 9,018,958 B2 | 4/2015 | Bertness | |
| 9,037,394 B2 | 5/2015 | Fernandes | 701/400 |
| 9,052,366 B2 | 6/2015 | Bertness | |
| 9,056,556 B1 | 6/2015 | Hyde et al. | |
| 9,166,261 B2 | 10/2015 | Ibi | |
| 9,201,120 B2 | 12/2015 | Stukenburg | |
| 9,229,062 B2 | 1/2016 | Stukenberg | |
| 9,244,100 B2 | 1/2016 | Coleman et al. | |
| 9,255,955 B2 | 2/2016 | Bertness | 324/503 |
| 9,274,157 B2 | 3/2016 | Bertness | |
| 9,312,575 B2 | 4/2016 | Stukenberg | |
| 9,335,362 B2 | 5/2016 | Bertness | |
| 9,419,311 B2 | 8/2016 | Bertness | |
| 9,425,487 B2 | 8/2016 | Bertness | |
| 9,496,720 B2 | 11/2016 | McShane | |
| 9,588,185 B2 | 3/2017 | Champlin | |
| 9,639,899 B1 | 5/2017 | Gersitz | |
| 9,923,289 B2 | 3/2018 | Bertness | |
| 9,966,676 B2 | 5/2018 | Salo, III et al. | |
| 10,046,649 B2 | 8/2018 | Bertness | |
| 10,222,397 B2 | 3/2019 | Salo et al. | |
| 10,317,468 B2 | 6/2019 | Bertness | |
| 10,429,449 B2 | 10/2019 | Arnoldus | |
| 10,473,555 B2 | 11/2019 | Bertness | |
| 10,525,841 B2 | 1/2020 | Zhou et al. | |
| 10,608,353 B2 | 3/2020 | Lipkin et al. | |
| 10,843,574 B2 | 11/2020 | Palmisano et al. | |
| 11,054,480 B2 | 7/2021 | Bertness | |
| 11,325,479 B2 | 5/2022 | Bertness | |
| 2001/0012738 A1 | 8/2001 | Duperret | 439/835 |
| 2001/0033169 A1 | 10/2001 | Singh | 324/426 |
| 2001/0035178 A1 | 11/2001 | Nakanishi et al. | 320/122 |
| 2001/0048215 A1 | 12/2001 | Breed et al. | 280/728.1 |
| 2001/0048226 A1 | 12/2001 | Nada | 290/40 |
| 2002/0003423 A1 | 1/2002 | Bertness et al. | 324/426 |
| 2002/0004694 A1 | 1/2002 | McLeod | 701/29 |
| 2002/0007237 A1 | 1/2002 | Phung et al. | 701/33 |
| 2002/0010558 A1 | 1/2002 | Bertness et al. | 702/63 |
| 2002/0021135 A1 | 2/2002 | Li et al. | 324/677 |
| 2002/0027346 A1 | 3/2002 | Breed et al. | 280/735 |
| 2002/0030495 A1 | 3/2002 | Kechmire | 324/427 |
| 2002/0036504 A1 | 3/2002 | Troy et al. | 324/430 |
| 2002/0041175 A1 | 4/2002 | Lauper et al. | 320/106 |
| 2002/0044050 A1 | 4/2002 | Derbyshire et al. | 340/442 |
| 2002/0047711 A1 | 4/2002 | Bertness et al. | 324/426 |
| 2002/0050163 A1 | 5/2002 | Makhija et al. | 73/116 |
| 2002/0065619 A1 | 5/2002 | Bertness | 702/63 |
| 2002/0074398 A1 | 6/2002 | Lancos et al. | 235/382 |
| 2002/0116140 A1 | 8/2002 | Rider | 702/63 |
| 2002/0118111 A1 | 8/2002 | Brown et al. | 340/573.1 |
| 2002/0121877 A1 | 9/2002 | Smith et al. | |
| 2002/0121901 A1 | 9/2002 | Hoffman | 324/426 |
| 2002/0128985 A1 | 9/2002 | Greenwald | 705/400 |
| 2002/0130665 A1 | 9/2002 | Bertness et al. | 324/426 |
| 2002/0152791 A1 | 10/2002 | Cardinale | |
| 2002/0153864 A1 | 10/2002 | Bertness | 320/132 |
| 2002/0171428 A1 | 11/2002 | Bertness | 702/63 |
| 2002/0176010 A1 | 11/2002 | Wallach et al. | 348/362 |
| 2002/0193955 A1 | 12/2002 | Bertness | 702/63 |
| 2003/0006779 A1 | 1/2003 | H. Youval | 324/503 |
| 2003/0009270 A1 | 1/2003 | Breed | 701/29 |
| 2003/0017753 A1 | 1/2003 | Palmisano et al. | 439/762 |
| 2003/0025481 A1 | 2/2003 | Bertness | 324/427 |
| 2003/0030442 A1 | 2/2003 | Sugimoto | 324/429 |
| 2003/0036909 A1 | 2/2003 | Kato | 704/275 |
| 2003/0040873 A1 | 2/2003 | Lesesky et al. | 702/57 |
| 2003/0060953 A1 | 3/2003 | Chen | 701/33 |
| 2003/0078743 A1 | 4/2003 | Bertness et al. | 702/63 |
| 2003/0088375 A1 | 5/2003 | Bertness et al. | 702/63 |
| 2003/0090272 A1 | 5/2003 | Bertness | 324/426 |
| 2003/0114206 A1 | 6/2003 | Timothy | 455/575.7 |
| 2003/0124417 A1 | 7/2003 | Bertness et al. | 429/90 |
| 2003/0128011 A1 | 7/2003 | Bertness et al. | |
| 2003/0128036 A1 | 7/2003 | Henningson et al. | 324/426 |
| 2003/0137277 A1 | 7/2003 | Mori et al. | 320/132 |
| 2003/0155930 A1 | 8/2003 | Thomsen | |
| 2003/0164073 A1 | 9/2003 | Chen | |
| 2003/0169018 A1 | 9/2003 | Berels et al. | 320/132 |
| 2003/0169019 A1 | 9/2003 | Oosaki | 320/132 |
| 2003/0171111 A1 | 9/2003 | Clark | 455/414.1 |
| 2003/0173971 A1 | 9/2003 | Bertness | 324/441 |
| 2003/0177417 A1 | 9/2003 | Malhotra et al. | 714/42 |
| 2003/0184262 A1 | 10/2003 | Makhija | 320/156 |
| 2003/0184264 A1 | 10/2003 | Bertness | |
| 2003/0184306 A1 | 10/2003 | Bertness et al. | 324/426 |
| 2003/0187556 A1 | 10/2003 | Suzuki | 701/29 |
| 2003/0194672 A1 | 10/2003 | Roberts et al. | 431/196 |
| 2003/0197512 A1 | 10/2003 | Miller et al. | 324/426 |
| 2003/0212311 A1 | 11/2003 | Nova et al. | 600/300 |
| 2003/0214395 A1 | 11/2003 | Flowerday et al. | 340/445 |
| 2003/0224241 A1 | 12/2003 | Takada et al. | 429/52 |
| 2003/0236656 A1 | 12/2003 | Dougherty | 703/14 |
| 2004/0000590 A1 | 1/2004 | Raichle et al. | 235/462.01 |
| 2004/0000891 A1 | 1/2004 | Raichle et al. | 320/107 |
| 2004/0000893 A1 | 1/2004 | Raichle et al. | 320/135 |
| 2004/0000913 A1 | 1/2004 | Raichle et al. | 324/426 |
| 2004/0000915 A1 | 1/2004 | Raichle et al. | 324/522 |
| 2004/0002824 A1 | 1/2004 | Raichle et al. | 702/63 |
| 2004/0002825 A1 | 1/2004 | Raichle et al. | 702/63 |
| 2004/0002836 A1 | 1/2004 | Raichle et al. | 702/188 |
| 2004/0032264 A1 | 2/2004 | Schoch | 324/426 |
| 2004/0036443 A1 | 2/2004 | Bertness | 320/109 |
| 2004/0044452 A1 | 3/2004 | Bauer et al. | 703/33 |
| 2004/0044454 A1 | 3/2004 | Ross et al. | 701/33 |
| 2004/0046564 A1 | 3/2004 | Klang | 324/426 |
| 2004/0049361 A1 | 3/2004 | Hamdan et al. | 702/115 |
| 2004/0051532 A1 | 3/2004 | Smith et al. | 324/426 |
| 2004/0051533 A1 | 3/2004 | Namaky | 324/426 |
| 2004/0051534 A1 | 3/2004 | Kobayashi et al. | 324/429 |
| 2004/0054503 A1 | 3/2004 | Namaky | 702/182 |
| 2004/0064225 A1 | 4/2004 | Jammu et al. | 701/29 |
| 2004/0065489 A1 | 4/2004 | Aberle | 180/65.1 |
| 2004/0088087 A1 | 5/2004 | Fukushima et al. | 701/32 |
| 2004/0104728 A1 | 6/2004 | Bertness et al. | 324/429 |
| 2004/0108855 A1 | 6/2004 | Raichle | 324/378 |
| 2004/0108856 A1 | 6/2004 | Johnson | 324/426 |
| 2004/0113494 A1 | 6/2004 | Karuppana et al. | |
| 2004/0113588 A1 | 6/2004 | Mikuriya et al. | 320/128 |
| 2004/0145342 A1 | 7/2004 | Lyon | 320/108 |
| 2004/0145371 A1 | 7/2004 | Bertness | 324/426 |
| 2004/0150494 A1 | 8/2004 | Yoshida | 333/243 |
| 2004/0157113 A1 | 8/2004 | Klang | 429/50 |
| 2004/0164706 A1 | 8/2004 | Osborne | 320/116 |
| 2004/0172177 A1 | 9/2004 | Nagai et al. | 701/29 |
| 2004/0178185 A1 | 9/2004 | Yoshikawa et al. | 219/270 |
| 2004/0189309 A1 | 9/2004 | Bertness et al. | 324/426 |
| 2004/0199343 A1 | 10/2004 | Cardinal et al. | 702/63 |
| 2004/0207367 A1 | 10/2004 | Taniguchi et al. | 320/149 |
| 2004/0221641 A1 | 11/2004 | Moritsugu | 73/23.31 |
| 2004/0227523 A1 | 11/2004 | Namaky | 324/537 |
| 2004/0239332 A1 | 12/2004 | Mackel et al. | 324/426 |
| 2004/0251876 A1 | 12/2004 | Bertness et al. | 320/136 |

(56) References Cited

U.S. PATENT DOCUMENTS

| | | |
|---|---|---|
| 2004/0251907 A1 | 12/2004 | Kalley |
| 2004/0257084 A1 | 12/2004 | Restaino ............... 324/400 |
| 2005/0007068 A1 | 1/2005 | Johnson et al. ........... 320/110 |
| 2005/0009122 A1 | 1/2005 | Whelan et al. ............ 435/7.32 |
| 2005/0017726 A1 | 1/2005 | Koran et al. ............ 324/433 |
| 2005/0017952 A1 | 1/2005 | His ............... 345/169 |
| 2005/0021197 A1 | 1/2005 | Zimmerman ............... 701/31.4 |
| 2005/0021294 A1 | 1/2005 | Trsar et al. ............ 702/183 |
| 2005/0021475 A1 | 1/2005 | Bertness ............... 705/63 |
| 2005/0025299 A1 | 2/2005 | Tischer et al. ............ 379/199 |
| 2005/0035752 A1 | 2/2005 | Bertness |
| 2005/0043868 A1 | 2/2005 | Mitcham ............... 701/29 |
| 2005/0057256 A1 | 3/2005 | Bertness ............... 324/426 |
| 2005/0060070 A1 | 3/2005 | Kapolka et al. ............ 701/29 |
| 2005/0073314 A1 | 4/2005 | Bertness et al. ............ 324/433 |
| 2005/0076381 A1 | 4/2005 | Gross ............... 725/107 |
| 2005/0077904 A1 | 4/2005 | Bertness ............... 324/426 |
| 2005/0096809 A1 | 5/2005 | Skeen et al. ............ 701/29 |
| 2005/0099185 A1 | 5/2005 | Klang |
| 2005/0102073 A1 | 5/2005 | Ingram ............... 701/29 |
| 2005/0119809 A1 | 6/2005 | Chen ............... 701/33.5 |
| 2005/0128083 A1 | 6/2005 | Puzio et al. ............ 340/572.1 |
| 2005/0128902 A1 | 6/2005 | Tsai ............... 369/44.32 |
| 2005/0133245 A1 | 6/2005 | Katsuyama et al. ........ 174/74 R |
| 2005/0134282 A1 | 6/2005 | Averbuch ............... 324/426 |
| 2005/0143882 A1 | 6/2005 | Umezawa ............... 701/29 |
| 2005/0159847 A1 | 7/2005 | Shah et al. ............ 700/276 |
| 2005/0162172 A1 | 7/2005 | Bertness ............... 324/426 |
| 2005/0168226 A1 | 8/2005 | Quint et al. ............ 324/426 |
| 2005/0173142 A1 | 8/2005 | Cutler et al. ............ 173/181 |
| 2005/0182536 A1 | 8/2005 | Doyle et al. ............ 701/29 |
| 2005/0184732 A1 | 8/2005 | Restaino ............... 324/426 |
| 2005/0192045 A1 | 9/2005 | Lowles |
| 2005/0206346 A1 | 9/2005 | Smith et al. |
| 2005/0212521 A1 | 9/2005 | Bertness et al. ............ 324/426 |
| 2005/0213874 A1 | 9/2005 | Kline ............... 385/15 |
| 2005/0218902 A1 | 10/2005 | Restaino et al. ............ 324/433 |
| 2005/0231205 A1 | 10/2005 | Bertness et al. ............ 324/426 |
| 2005/0254106 A9 | 11/2005 | Silverbrook et al. ........ 358/539 |
| 2005/0256617 A1 | 11/2005 | Cawthorne et al. ............ 701/22 |
| 2005/0258241 A1 | 11/2005 | McNutt et al. ............ 235/385 |
| 2005/0264296 A1 | 12/2005 | Philbrook ............... 324/433 |
| 2005/0269880 A1 | 12/2005 | Konishi ............... 307/10.7 |
| 2005/0273218 A1 | 12/2005 | Breed ............... 701/2 |
| 2006/0012330 A1 | 1/2006 | Okumura et al. ............ 320/103 |
| 2006/0017447 A1 | 1/2006 | Bertness ............... 324/538 |
| 2006/0026017 A1 | 2/2006 | Walkder ............... 701/31.4 |
| 2006/0030980 A1 | 2/2006 | St. Denis ............... 701/29 |
| 2006/0038572 A1 | 2/2006 | Philbrook |
| 2006/0043976 A1 | 3/2006 | Gervais ............... 324/508 |
| 2006/0061469 A1 | 3/2006 | Jaeger ............... 340/539.13 |
| 2006/0076923 A1 | 4/2006 | Eaves ............... 320/112 |
| 2006/0079203 A1 | 4/2006 | Nicolini ............... 455/411 |
| 2006/0089767 A1 | 4/2006 | Sowa ............... 701/29 |
| 2006/0090554 A1 | 5/2006 | Krampitz |
| 2006/0090555 A1 | 5/2006 | Krampitz |
| 2006/0091597 A1 | 5/2006 | Opsahl |
| 2006/0092584 A1 | 5/2006 | Raichle |
| 2006/0095230 A1 | 5/2006 | Grier et al. ............ 702/183 |
| 2006/0102397 A1 | 5/2006 | Buck ............... 429/432 |
| 2006/0125482 A1 | 6/2006 | Klang |
| 2006/0136119 A1 | 6/2006 | Raichle |
| 2006/0139167 A1 | 6/2006 | Davie |
| 2006/0152224 A1 | 7/2006 | Kim et al. ............ 324/430 |
| 2006/0155439 A1 | 7/2006 | Slawinski ............... 701/33.4 |
| 2006/0161313 A1 | 7/2006 | Rogers et al. ............ 701/1 |
| 2006/0161390 A1 | 7/2006 | Namaky et al. ............ 702/183 |
| 2006/0217914 A1 | 9/2006 | Bertness ............... 702/113 |
| 2006/0244456 A1 | 11/2006 | Henningson |
| 2006/0244457 A1 | 11/2006 | Henningson et al. ........ 324/426 |
| 2006/0282227 A1 | 12/2006 | Bertness |
| 2006/0282323 A1 | 12/2006 | Walker et al. ............ 705/14 |
| 2007/0005201 A1 | 1/2007 | Chenn ............... 701/31.5 |
| 2007/0024460 A1 | 2/2007 | Clark ............... 340/663 |
| 2007/0026916 A1 | 2/2007 | Juds et al. ............ 463/1 |
| 2007/0046261 A1 | 3/2007 | Porebski ............... 320/132 |
| 2007/0082652 A1 | 4/2007 | Hartigan |
| 2007/0088472 A1 | 4/2007 | Ganzhorn et al. ............ 701/33 |
| 2007/0108942 A1 | 5/2007 | Johnson et al. ............ 320/112 |
| 2007/0159177 A1 | 7/2007 | Bertness et al. ............ 324/426 |
| 2007/0182576 A1 | 8/2007 | Proska et al. ............ 340/636.1 |
| 2007/0194791 A1 | 8/2007 | Huang ............... 324/430 |
| 2007/0194793 A1 | 8/2007 | Bertness ............... 324/503 |
| 2007/0205752 A1 | 9/2007 | Leigh ............... 324/500 |
| 2007/0205983 A1 | 9/2007 | Naimo ............... 345/160 |
| 2007/0210801 A1 | 9/2007 | Krampitz ............... 324/426 |
| 2007/0244660 A1 | 10/2007 | Bertness |
| 2007/0259256 A1 | 11/2007 | Le Canut et al. ............ 429/90 |
| 2007/0279066 A1 | 12/2007 | Chism ............... 324/437 |
| 2008/0023547 A1 | 1/2008 | Raichle ............... 235/462.13 |
| 2008/0036421 A1 | 2/2008 | Seo ............... 320/132 |
| 2008/0053716 A1 | 3/2008 | Scheucher ............... 180/2.1 |
| 2008/0059014 A1 | 3/2008 | Nasr et al. ............ 701/22 |
| 2008/0064559 A1 | 3/2008 | Cawthorne ............... 477/5 |
| 2008/0086246 A1 | 4/2008 | Bolt et al. ............ 701/29 |
| 2008/0087479 A1 | 4/2008 | Kang |
| 2008/0094068 A1 | 4/2008 | Scott ............... 324/426 |
| 2008/0103656 A1 | 5/2008 | Lipscomb ............... 701/33.4 |
| 2008/0106267 A1 | 5/2008 | Bertness ............... 320/112 |
| 2008/0169818 A1 | 7/2008 | Lesesky et al. ............ 324/426 |
| 2008/0179122 A1 | 7/2008 | Sugawara ............... 180/65.245 |
| 2008/0194984 A1 | 8/2008 | Keefe ............... 600/559 |
| 2008/0256815 A1 | 10/2008 | Schafer |
| 2008/0303528 A1 | 12/2008 | Kim ............... 324/430 |
| 2008/0303529 A1 | 12/2008 | Nakamura et al. ............ 324/433 |
| 2008/0315830 A1 | 12/2008 | Bertness ............... 320/104 |
| 2009/0006476 A1 | 1/2009 | Andreasen et al. ........ 707/104.1 |
| 2009/0011327 A1 | 1/2009 | Okumura et al. ............ 429/99 |
| 2009/0013521 A1 | 1/2009 | Okumura et al. ............ 29/730 |
| 2009/0024266 A1 | 1/2009 | Bertness ............... 701/22 |
| 2009/0024419 A1 | 1/2009 | McClellan ............... 705/4 |
| 2009/0085571 A1 | 4/2009 | Bertness ............... 324/426 |
| 2009/0146610 A1 | 6/2009 | Trigiani |
| 2009/0146800 A1 | 6/2009 | Grimlund et al. ............ 340/505 |
| 2009/0160395 A1 | 6/2009 | Chen ............... 320/101 |
| 2009/0184165 A1 | 7/2009 | Bertness et al. |
| 2009/0198372 A1 | 8/2009 | Hammerslag ............... 700/226 |
| 2009/0203247 A1 | 8/2009 | Fifelski ............... 439/345 |
| 2009/0237029 A1 | 9/2009 | Andelfinger ............... 320/108 |
| 2009/0237086 A1 | 9/2009 | Andelfinger ............... 324/431 |
| 2009/0247020 A1 | 10/2009 | Gathman et al. ............ 439/759 |
| 2009/0251151 A1 | 10/2009 | Miyashita |
| 2009/0259432 A1 | 10/2009 | Liberty ............... 702/150 |
| 2009/0265121 A1 | 10/2009 | Rocci ............... 702/57 |
| 2009/0273451 A1 | 11/2009 | Soppera et al. |
| 2009/0276115 A1 | 11/2009 | Chen ............... 701/32 |
| 2009/0311919 A1 | 12/2009 | Smith ............... 439/759 |
| 2010/0023198 A1 | 1/2010 | Hamilton ............... 701/29 |
| 2010/0039065 A1 | 2/2010 | Kinkade ............... 320/104 |
| 2010/0052193 A1 | 3/2010 | Sylvester ............... 261/26 |
| 2010/0066283 A1 | 3/2010 | Kitanaka ............... 318/400.02 |
| 2010/0088050 A1 | 4/2010 | Keuss ............... 702/63 |
| 2010/0094496 A1 | 4/2010 | Hershkovitz et al. |
| 2010/0117603 A1 | 5/2010 | Makhija ............... 320/162 |
| 2010/0145780 A1 | 6/2010 | Nishikawa et al. ........ 705/14.11 |
| 2010/0214055 A1 | 8/2010 | Fuji ............... 340/3.1 |
| 2010/0265131 A1 | 10/2010 | Fabius |
| 2010/0314950 A1 | 12/2010 | Rutkowski et al. ........... 307/125 |
| 2011/0004427 A1 | 1/2011 | Gorbold et al. ............ 702/63 |
| 2011/0015815 A1 | 1/2011 | Bertness ............... 701/22 |
| 2011/0106280 A1 | 5/2011 | Zeier ............... 700/90 |
| 2011/0127960 A1 | 6/2011 | Plett |
| 2011/0161025 A1 | 6/2011 | Tomura ............... 702/63 |
| 2011/0215767 A1 | 9/2011 | Johnson et al. ............ 320/136 |
| 2011/0218747 A1 | 9/2011 | Bertness ............... 702/63 |
| 2011/0258112 A1 | 10/2011 | Eder et al. |
| 2011/0265025 A1 | 10/2011 | Bertness |
| 2011/0267067 A1 | 11/2011 | Bertness et al. |
| 2011/0273181 A1 | 11/2011 | Park et al. ............ 324/429 |
| 2011/0294367 A1 | 12/2011 | Moon ............... 439/878 |
| 2011/0300416 A1 | 12/2011 | Bertness |
| 2012/0041697 A1 | 2/2012 | Stukenberg ............... 702/63 |
| 2012/0046807 A1 | 2/2012 | Ruther ............... 701/2 |
| 2012/0046824 A1 | 2/2012 | Ruther et al. ............ 701/31.5 |

(56) References Cited

U.S. PATENT DOCUMENTS

| | | | |
|---|---|---|---|
| 2012/0062237 A1 | 3/2012 | Robinson | 324/433 |
| 2012/0074904 A1 | 3/2012 | Rutkowski et al. | 320/112 |
| 2012/0086399 A1 | 4/2012 | Choi | |
| 2012/0116391 A1 | 5/2012 | Houser | 606/41 |
| 2012/0182132 A1 | 7/2012 | McShane | |
| 2012/0249069 A1 | 10/2012 | Ohtomo | 320/109 |
| 2012/0256494 A1 | 10/2012 | Kesler | 307/104 |
| 2012/0256568 A1 | 10/2012 | Lee | 318/139 |
| 2012/0274331 A1 | 11/2012 | Liu | 324/426 |
| 2012/0293372 A1 | 11/2012 | Amendolare | 342/451 |
| 2013/0099747 A1 | 4/2013 | Baba | 310/118 |
| 2013/0106362 A1 | 5/2013 | Mackintosh et al. | |
| 2013/0106596 A1 | 5/2013 | Mouchet | |
| 2013/0115821 A1 | 5/2013 | Golko | 439/638 |
| 2013/0134926 A1 | 5/2013 | Yoshida | |
| 2013/0158782 A1 | 6/2013 | Bertness et al. | 701/34.4 |
| 2013/0172019 A1 | 7/2013 | Youssef | 455/456.6 |
| 2013/0200855 A1 | 8/2013 | Christensen et al. | |
| 2013/0218781 A1 | 8/2013 | Simon | |
| 2013/0288706 A1 | 10/2013 | Yu | 455/456.1 |
| 2013/0297247 A1 | 11/2013 | Jardine | |
| 2013/0311124 A1 | 11/2013 | Van Bremen | 702/104 |
| 2013/0314041 A1 | 11/2013 | Proebstle | 320/109 |
| 2013/0325405 A1 | 12/2013 | Miller | |
| 2014/0002021 A1 | 1/2014 | Bertness | |
| 2014/0002094 A1 | 1/2014 | Champlin | 324/426 |
| 2014/0029308 A1 | 1/2014 | Cojocaru | 363/13 |
| 2014/0081527 A1 | 3/2014 | Miller | |
| 2014/0099830 A1 | 4/2014 | Byrne | 439/638 |
| 2014/0117997 A1 | 5/2014 | Bertness | 324/426 |
| 2014/0145670 A1 | 5/2014 | Van Zwan et al. | |
| 2014/0194084 A1 | 7/2014 | Noonan | 455/404.1 |
| 2014/0225622 A1 | 8/2014 | Kudo | 324/433 |
| 2014/0239964 A1 | 8/2014 | Gach | 324/433 |
| 2014/0260577 A1 | 9/2014 | Chinnadurai | |
| 2014/0266061 A1 | 9/2014 | Wachal | |
| 2014/0278159 A1 | 9/2014 | Chinnadurai | |
| 2014/0354237 A1 | 12/2014 | Cotton | |
| 2014/0368156 A1 | 12/2014 | Aloe | |
| 2014/0374475 A1 | 12/2014 | Kallfelz et al. | |
| 2015/0093922 A1 | 4/2015 | Bosscher | 439/39 |
| 2015/0115720 A1 | 4/2015 | Hysell | 307/65 |
| 2015/0166518 A1 | 6/2015 | Boral et al. | |
| 2015/0168499 A1 | 6/2015 | Palmisano | |
| 2015/0221135 A1 | 8/2015 | Hill | 345/633 |
| 2015/0239365 A1 | 8/2015 | Hyde et al. | |
| 2015/0353192 A1 | 12/2015 | Morrison | |
| 2016/0011271 A1 | 1/2016 | Bertness | |
| 2016/0091571 A1 | 3/2016 | Salo, III | |
| 2016/0154044 A1 | 6/2016 | Bertness | |
| 2016/0171799 A1 | 6/2016 | Bertness | |
| 2016/0216335 A1 | 7/2016 | Bertness | |
| 2016/0232736 A1 | 8/2016 | Holtappels et al. | |
| 2016/0238667 A1 | 8/2016 | Palmisano et al. | |
| 2016/0253852 A1 | 9/2016 | Bertness et al. | |
| 2016/0266212 A1 | 9/2016 | Carlo | |
| 2016/0285284 A1 | 9/2016 | Matlapudi et al. | |
| 2016/0321897 A1 | 11/2016 | Lee | |
| 2016/0336623 A1 | 11/2016 | Nayar | |
| 2017/0093056 A1 | 3/2017 | Salo, III et al. | |
| 2017/0146602 A1 | 5/2017 | Samp | |
| 2017/0158058 A1 | 6/2017 | Lee et al. | |
| 2017/0373410 A1 | 12/2017 | Lipkin et al. | |
| 2018/0009328 A1 | 1/2018 | Hinterberger et al. | |
| 2018/0113171 A1 | 4/2018 | Bertness | |
| 2018/0306867 A1 | 10/2018 | Bertness | |
| 2019/0105998 A1 | 4/2019 | Bertness | |
| 2019/0152332 A1 | 5/2019 | Bertness | |
| 2019/0154763 A1 | 5/2019 | Bertness | |
| 2019/0204392 A1 | 7/2019 | Bertness | |
| 2020/0086757 A1 | 3/2020 | Vain et al. | |
| 2020/0174078 A1 | 6/2020 | Salo, III et al. | |
| 2020/0274370 A1 | 8/2020 | Krieg | |
| 2021/0048374 A1 | 2/2021 | Sampson et al. | |
| 2021/0049480 A1 | 2/2021 | Kale et al. | |
| 2021/0135462 A1 | 5/2021 | Sampson et al. | |
| 2021/0141021 A1 | 5/2021 | Salo, III et al. | |
| 2021/0141043 A1 | 5/2021 | Bertness | |
| 2021/0203016 A1 | 7/2021 | Bertness | |
| 2021/0231737 A1 | 7/2021 | Salo, III et al. | |
| 2021/0325471 A1 | 10/2021 | Bertness | |
| 2022/0050142 A1 | 2/2022 | Bertness | |
| 2022/0258619 A1 | 8/2022 | Bertness | |

FOREIGN PATENT DOCUMENTS

| | | |
|---|---|---|
| CN | 103091633 | 5/2013 |
| CN | 206658084 | 11/2017 |
| DE | 29 26 716 B1 | 1/1981 |
| DE | 40 07 883 | 9/1991 |
| DE | 196 38 324 | 9/1996 |
| DE | 601 12 502 T2 | 6/2006 |
| DE | 10 2009 013 857 | 10/2009 |
| DE | 10 2008 036 595 A1 | 2/2010 |
| DE | 10 2018 001885 | 9/2018 |
| EP | 0 022 450 A1 | 1/1981 |
| EP | 0 391 694 A2 | 4/1990 |
| EP | 0 476 405 A1 | 9/1991 |
| EP | 0 476 405 | 3/1992 |
| EP | 0 637 754 A1 | 2/1995 |
| EP | 0 772 056 A1 | 5/1997 |
| EP | 0 982 159 A2 | 3/2000 |
| EP | 1 810 869 A1 | 11/2004 |
| EP | 1 786 057 | 5/2007 |
| EP | 1 807 710 B1 | 7/2007 |
| EP | 1 807 710 | 1/2010 |
| EP | 2 302 724 | 3/2011 |
| FR | 2 749 397 | 12/1997 |
| GB | 154 016 | 11/1920 |
| GB | 2 029 586 | 3/1980 |
| GB | 2 088 159 A | 6/1982 |
| GB | 2 246 916 A | 10/1990 |
| GB | 2 266 150 | 10/1993 |
| GB | 2 275 783 A | 7/1994 |
| GB | 2 353 367 | 2/2001 |
| GB | 2 387 235 A | 10/2003 |
| JP | 59-17892 | 1/1984 |
| JP | 59-17893 | 1/1984 |
| JP | 59017894 | 1/1984 |
| JP | 59215674 | 12/1984 |
| JP | 60225078 | 11/1985 |
| JP | 62-180284 | 8/1987 |
| JP | 63027776 | 2/1988 |
| JP | 03274479 | 12/1991 |
| JP | 03282276 | 12/1991 |
| JP | 4-8636 | 1/1992 |
| JP | 04095788 | 3/1992 |
| JP | 04131779 | 5/1992 |
| JP | 04372536 | 12/1992 |
| JP | 05211724 A | 8/1993 |
| JP | 5216550 | 8/1993 |
| JP | 7-128414 | 5/1995 |
| JP | 09061505 | 3/1997 |
| JP | 10056744 | 2/1998 |
| JP | 10232273 | 9/1998 |
| JP | 11103503 A | 4/1999 |
| JP | 11-150809 | 6/1999 |
| JP | 11-271409 | 10/1999 |
| JP | 2001-023037 | 1/2001 |
| JP | 2001057711 A | 2/2001 |
| JP | 2003-346909 | 12/2003 |
| JP | 2005-238969 | 9/2005 |
| JP | 2006/242674 | 9/2006 |
| JP | 2006331976 A | 12/2006 |
| JP | 2009-244166 | 10/2009 |
| JP | 2009-261174 | 11/2009 |
| JP | 2010-172122 | 5/2010 |
| JP | 2010-172142 | 8/2010 |
| RU | 2089015 C1 | 8/1997 |
| WO | WO 93/22666 | 11/1993 |
| WO | WO 94/05069 | 3/1994 |
| WO | WO 96/01456 | 1/1996 |
| WO | WO 96/06747 | 3/1996 |
| WO | WO 96/28846 | 9/1996 |

(56) References Cited

FOREIGN PATENT DOCUMENTS

| | | |
|---|---|---|
| WO | WO 97/01103 | 1/1997 |
| WO | WO 97/44652 | 11/1997 |
| WO | WO 98/04910 | 2/1998 |
| WO | WO 98/21132 | 5/1998 |
| WO | WO 98/58270 | 12/1998 |
| WO | WO 99/23738 | 5/1999 |
| WO | WO 99/56121 | 11/1999 |
| WO | WO 00/16083 | 3/2000 |
| WO | WO 00/62049 | 10/2000 |
| WO | WO 00/67359 | 11/2000 |
| WO | WO 01/59443 | 2/2001 |
| WO | WO 01/16614 | 3/2001 |
| WO | WO 01/16615 | 3/2001 |
| WO | WO 01/51947 | 7/2001 |
| WO | WO 03/047064 A3 | 6/2003 |
| WO | WO 03/076960 A1 | 9/2003 |
| WO | WO 2004/047215 A1 | 6/2004 |
| WO | WO 2007/059935 | 5/2007 |
| WO | WO 2007/075403 | 7/2007 |
| WO | WO 2009/004001 | 1/2009 |
| WO | WO 2010/007681 | 1/2010 |
| WO | WO 2010/035605 | 4/2010 |
| WO | WO 2010/042517 | 4/2010 |
| WO | WO 2011/153419 | 12/2011 |
| WO | WO 2012/078921 | 6/2012 |
| WO | WO 2013/070850 | 5/2013 |

OTHER PUBLICATIONS

Notification of Transmittal of the International Search Report and the Written Opinion of the International Searching Authority, or the Declaration for PCT/US2019/014487, dated Apr. 11, 2019.
Notification of Transmittal of the International Search Report and the Written Opinion of the International Searching Authority, or the Declaration for PCT/US2019/014494, dated Apr. 24, 2019.
U.S. Appl. No 16/695,705, filed Nov. 26, 2019, 26 pgs.
"Electrochemical Impedance Spectroscopy in Battery Development and Testing", *Batteries International*, Apr. 1997, pp. 59 and 62-63.
"Battery Impedance", by E. Willihnganz et al., *Electrical Engineering*, Sep. 1959, pp. 922-925.
"Determining the End of Battery Life", by S. DeBardelaben, *IEEE*, 1986, pp. 365-368.
"A Look at the Impedance of a Cell", by S. Debardelaben, *IEEE*, 1988, pp. 394- 397.
"The Impedance of Electrical Storage Cells", by N.A. Hampson et al., *Journal of Applied Electrochemistry*, 1980, pp. 3-11.
"A Package for Impedance/Admittance Data Analysis", by B. Boukamp, *Solid State Ionics*, 1986, pp. 136-140.
"Precision of Impedance Spectroscopy Estimates of Bulk, Reaction Rate, and Diffusion Parameters", by J. Macdonald et al., *J. Electroanal, Chem.*, 1991, pp. 1-11.
Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128,131.
IEEE Recommended Practice for Maintenance, Testings, and Replacement of Large Lead Storage Batteries for Generating Stations and Substations, *The Institute of Electrical and Electronics Engineers, Inc., ANSI/IEEE Std.* 450-1987, Mar. 9, 1987, pp. 7-15.
"Field and Laboratory Studies to Assess the State of Health of Valve-Regulated Lead Acid Batteries: Part I Conductance/Capacity Correlation Studies", by D. Feder et al., *IEEE*, Aug. 1992, pp. 218-233.
"JIS Japanese Industrial Standard-Lead Acid Batteries for Automobiles", *Japanese Standards Association UDC*, 621.355.2:629.113. 006, Nov. 1995.
"Performance of Dry Cells", by C. Hambuechen, Preprint of *Am. Electrochem. Soc.*, Apr. 18-20, 1912, paper No. 19, pp. 1-5.
"A Bridge for Measuring Storage Battery Resistance", by E. Wilihncanz, *The Electrochemical Society*, preprint 79-20, Apr. 1941, pp. 253-258.

National Semiconductor Corporation, "High Q Notch Filter", Mar. 1969, Linear Brief 5, Mar. 1969.
Burr-Brown Corporation, "Design A 60 Hz Notch Filter with the UAF42", Jan. 1994, AB-071, 1994.
National Semiconductor Corporation, "LMF90-$4^{th}$-Order Elliptic Notch Filter", Dec. 1994, RRD-B30M115, Dec. 1994.
"Alligator Clips with Wire Penetrators" *J.S. Popper, Inc.* product information, downloaded from http://www.jspopper.com/, prior to Oct. 1, 2002.
"#12: LM78S40 Simple Switcher DC to DC Converter", *ITM e-Catalog*, downloaded from http://www.pcbcafe.com, prior to Oct. 1, 2002.
"Simple DC-DC Converts Allows Use of Single Battery", *Electronix Express*, downloaded from http://www.elexp.com/t_dc-dc.htm, prior to Oct. 1, 2002.
"DC-DC Converter Basics", *Power Designers*, downloaded from http://www.powerdesigners.com/InforWeb.design_center/articles/ DC-DC/converter.shtm, prior to Oct. 1, 2002.
"Notification of Transmittal of the International Search Report or the Declaration", PCT/US02/29461, filed Sep. 17, 2002 and dated Jan. 3, 2003.
"Notification of Transmittal of the International Search Report or the Declaration", PCT/US03/07546, filed Mar. 13, 2003 and dated Jul. 4, 2001.
"Notification of Transmittal of the International Search Report or the Declaration", PCT/US03/06577, filed Mar. 5, 2003 and dated Jul. 24, 2003.
"Notification of Transmittal of the International Search Report or the Declaration", PCT/US03/07837, filed Mar. 14, 2003 and dated Jul. 4, 2003.
"Improved Impedance Spectroscopy Technique for Status Determination of Production Li/$SO_2$ Batteries" Terrill Atwater et al., pp. 10-113, (1992).
"Notification of Transmittal of the International Search Report or the Declaration", PCT/US03/41561; Search Report completed Apr. 13, 2004, dated May 6, 2004.
"Notification of Transmittal of the International Search Report or the Declaration", PCT/US03/27696, filed Sep. 4, 2003 and dated Apr. 15, 2004.
"Programming Training Course, 62-000 Series Smart Engine Analyzer", Testproducts Division, Kalamazoo, Michigan, pp. 1-207, (1984).
"Operators Manual, Modular Computer Analyzer Model MCA 3000", Sun Electric Corporation, Crystal Lake, Illinois, pp. 1-1-14- 13, (1991).
Supplementary European Search Report Communication for Appl. No. 99917402.2; dated Sep. 7, 2004.
"Dynamic modelling of lead/acid batteries using impedance spectroscopy for parameter identification", Journal of Power Sources, pp. 69-84, (1997).
Notification of Transmittal of the International Search Report for PCT/US03/30707, filed Sep. 30, 2003 and dated Nov. 24, 2004.
"A review of impedance measurements for determination of the state-of-charge or state-of-health of secondary batteries", Journal of Power Sources, pp. 59-69, (1998).
"Search Report Under Section 17" for Great Britain Application No. GB0421447.4, date of search Jan. 27, 2005, dated Jan. 28, 2005.
"Results of Discrete Frequency Immittance Spectroscopy (DFIS) Measurements of Lead Acid Batteries", by K.S. Champlin et al., *Proceedings of $23^{rd}$ International Teleco Conference (INTELEC)*, published Oct. 2001, IEE, pp. 433-440.
"Examination Report" from the UK Patent Office for App. No. 0417678.0; dated Jan. 24, 2005.
Wikipedia Online Encyclopedia, Inductance, 2005, http://en.wikipedia. org/wiki/inductance, pp. 1-5, mutual Inductance, pp. 3,4.
"Professional BCS System Analyzer Battery-Charger-Starting", pp. 2-8, (2001).
Young Illustrated Encyclopedia Dictionary of Electronics, 1981, Parker Publishing Company, Inc., pp. 318-319.
"DSP Applications in Hybrid Electric Vehicle Powertrain", Miller et al., Proceedings of the American Control Conference, San Diego, CA, Jun. 1999; 2 ppg.

(56) References Cited

OTHER PUBLICATIONS

"Notification of Transmittal of the International Search Report and the Written Opinion of the International Searching Authority, or the Declaration" for PCT/US2008/008702 filed Jul. 2008; 15 pages.
"A Microprocessor-Based Control System for a Near-Term Electric Vehicle", Bimal K. Bose; IEEE Transactions on Industry Applications, vol. IA-17, No. 6, Nov./Dec. 1981; 0093-9994/81/1100-0626$00.75 © 1981 IEEE, 6 pages.
Notification of Transmittal of the International Search Report and the Written Opinion of the International Searching Authority, or the Declaration for PCT/US2011/038279 filed May 27, 2011, dated Sep. 16, 2011, 12 pages.
U.S. Appl. No. 60/387,912, filed Jun. 13, 2002 which is related to U.S. Pat. No. 7,089,127.
"Conductance Testing Compared to Traditional Methods of Evaluating the Capacity of Valve-Regulated Lead-Acid Batteries and Predicting State-of-Health", by D. Feder et al., May 1992, pp. 1-8; (13 total pgs.).
"Field and Laboratory Studies to Assess the State of Health of Valve-Regulated Lead Acid Batteries: Part I-Conductance/Capacity Correlation Studies", by D. Feder at al., Oct. 1992, pp. 1-15; (19 total pgs.).
"Field Application of Conductance Measurements Use to Ascertain Cell/Battery and Inter-Cell Connection State-of-Health in Electric Power Utility Applications", by M. Hlavac et al., Apr. 1993, pp. 1-14; (19 total pgs.).
"Conductance Testing of Standby Batteries in Signaling and Communications Applications for the Purpose of Evaluating Battery State-of-Health", by S. McShane, Apr. 1993, pp. 1-9; (14 total pgs.).
"Condutance Monitoring of Recombination Lead Acid Batteries", by B. Jones, May 1993, pp. 1-6; (11 total pgs.).
"Evaluating the State-of-Health of Lead Acid Flooded and Valve-Regulated Batteries: A Comparison of Conductance Testing vs. Traditional Methods", by M. Hlavac et al., Jun. 1993, pp. 1-15; (20 total pgs.).
"Updated State of Conductance/Capacity Correlation Studies to Determine the State-of-Health of Automotive SLI and Standby Lead Acid Batteries", by D. Feder et al., Sep. 1993, pp. 1-17; (22 total pgs.).
"Field and Laboratory Studies to Access the State-of-Health of Valve-Regulated Lead-Acid Battery Technologies Using Conductance Testing Part II—Further Conductance/Capacity Correlation Studies", by M. Hlavac et al., Sep. 1993, pp. 1-9; (14 total pgs.).
"Field Experience of Testing VRLA Batteries by Measuring Conductance", by M.W. Kniveton, May 1994, pp. 1-4; (9 total pgs.).
"Reducing the Cost of Maintaining VRLA Batteries in Telecom Applications", by M.W. Kniveton, Sep. 1994, pp. 1-5; (10 total pgs.).
"Analysis and Interpretation of Conductance Measurements used to Access the State-of-Health of Valve Regulated Lead Acid Batteries Part III: Analytical Techniques", by M. Hlavac, Nov. 1994, 9 pgs; (13 total pgs.).
"Testing 24 Volt Aircraft Batteries Using Midtronics Conductance Technology", by M. Hlavac et al., Jan. 1995, 9 pgs; (13 total pgs.).
"VRLA Battery Monitoring Using Conductance Technology Part IV: On-Line State-of-Health Monitoring and Thermal Runaway Detection/Prevention", by M. Hlavac et al., Oct. 1995, 9 pgs; (13 total pgs.).
"VRLA Battery Conductance Monitoring Part V: Strategies for VRLA Battery Testing and Monitoring in Telecom Operating Environments", by M. Hlavac et al., Oct. 1996, 9 pgs; (13 total pgs.).
"Midpoint Conductance Technology Used in Telecommunication Stationary Standby Battery Applications Part VI: Considerations for Deployment of Midpoint Conductance in Telecommunications Power Applications", by M. Troy et al., Oct. 1997, 9 pgs; (13 total pgs.).
"Impedance/Conductance Measurements as an Aid to Determining Replacement Strategies", M. Kniveton, Sep. 1998, pp. 297-301; (9 total pgs.).

"A Fundamentally New Approach to Battery Performance Analysis Using DFRA™/DTIS™ Technology", by K. Champlin et al., Sep. 2000, 8 pgs; (12 total pgs.).
"Battery State of Health Monitoring, Combining Conductance Technology With Other Measurement Parameters for Real-Time Battery Performance Analysis", by D. Cox et al., Mar. 2000, 6 pgs; (10 total pgs.).
Search Report and Written Opinion from PCT Application No. PCT/US2011/026608, dated Aug. 29, 2011, 9 pgs.
Examination Report under section 18(3) for corresponding Great Britain Application No. GB1000773.0, dated Feb. 6, 2012, 2 pages.
Communication from GB1216105.5, dated Sep. 21, 2012.
Notification of Transmittal of the International Search Report and Written Opinion from PCT/US2011/039043, dated Jul. 26, 2012.
Notification of Transmittal of the International Search Report and Written Opinion from PCT/US2011/053886, dated Jul. 27, 2012.
"Field Evaluation of Honda's EV Plus Battery Packs", by A. Paryani, *IEEE AES Systems Magazine*, Nov. 2000, pp. 21-24.
Search Report from PCT/US2011/047354, dated Nov. 11, 2011.
Written Opinion from PCT/US2011/047354, dated Nov. 11, 2011.
First Office Action (Notification of Reasons for Rejections) dated Dec. 3, 2013 in related Japanese patent application No. 2013-513370, 9 pgs. Including English Translation.
Official Action dated Jan. 22, 2014 in Korean patent application No. 10-2012-7033020, 2 pgs including English Translation.
Official Action dated Feb. 20, 2014 in Korean patent application No. 10-2013-7004814, 6 pgs including English Translation.
First Office Action for Chinese Patent Application No. 201180011597.4, dated May 6, 2014, 20 pages.
Office Action from Korean Application No. 10/2012-7033020, dated Jul. 29, 2014.
Office Action for Chinese Patent Application No. 201180038844.X, dated Jul. 1, 2014.
Office Action for Chinese Patent Application No. 201180030045.8, dated Jul. 21, 2014.
Office Action for German Patent Application No. 1120111020643 dated Aug. 28, 2014.
Office Action from Japanese Patent Application No. 2013-513370, dated Aug. 5, 2014.
Office Action from Japanese Patent Application No. 2013-531839, dated Jul. 8, 2014.
Office Action for German Patent Application No. 103 32 625.1, dated Nov. 7, 2014, 14 pages.
Office Action from Chinese Patent Application No. 201180038844.X, dated Dec. 8, 2014.
Office Action from CN Application No. 201180011597.4, dated Jan. 6, 2015.
Office Action for Chinese Patent Application No. 201180030045.8, dated Mar. 24, 2015.
Office Action for Japanese Patent Application No. 2013-531839, dated Mar. 31, 2015.
Notification of Transmittal of the International Search Report and Written Opinion from PCT/US2014/069661, dated Mar. 26, 2015.
Office Action for Chinese Patent Application No. 201180038844.X, dated Jun. 8, 2015.
Office Action from Chinese Patent Application No. 201180011597.4 dated Jun. 3, 2015.
European Search Report from European Application No. EP 15151426.2, dated Jun. 1, 2015.
Notification of Transmittal of the International Search Report and the Written Opinion from PCT/US2016/014867, dated Jun. 3, 2016.
Office Action from Japanese Patent Application No. 2015-014002, dated Jul. 19, 2016.
Notification of Transmittal of the International Search Report and the Written Opinion of the International Searching Authority from PCT/US2016/029696, dated Aug. 24, 2016.
Office Action from German Patent Application No. 10393251.8, dated Nov. 4, 2016, including English translation.
Office Action from European Patent Application No. 15 151 426.2-1801, dated Aug. 28, 2017, 2 pages.
Office Action from German Patent Application No. 112011101892.4, dated Sep. 7, 2017.

(56) References Cited

OTHER PUBLICATIONS

Office Action from Japanese Patent Application No. 2017-026740, dated Jan. 9, 2018.
Office Action from Chinese Patent Application No. 201480066251.8, dated May 29, 2018.
Brochure: "Sensors Intelligent Battery Sensors, Measuring Battery Capacity and Ageing", by Hella, 6 pgs.
Office Action from Japanese Patent Application No. 2017-026740, dated May 8, 2018.
Office Action from Parent U.S. Appl. No. 14/039,746, dated Aug. 27, 2015, 14 pages.
Final Office Action from Parent U.S. Appl. No. 14/039,746, dated Jan. 13, 2016, 14 pages.
Office Action from Parent U.S. Appl. No. 14/039,746, dated Aug. 17, 2016, 15 pages.
Final Office Action from Parent U.S. Appl. No. 14/039,746, dated Feb. 15, 2017, 12 pages.
Office Action from Parent U.S. Appl. No. 14/039,746, dated Jun. 14, 2017, 15 pages.
Final Office Action from Parent U.S. Appl. No. 14/039,746, dated Oct. 3, 2017, 14 pages.
Office Action from Parent U.S. Appl. No. 14/039,746, dated Apr. 5, 2018, 17 pages.
Office Action from Parent U.S. Appl. No. 13/152,711, dated Oct. 25, 2011, 20 pages.
Final Office Action from Parent U.S. Appl. No. 13/152,711, dated Apr. 25, 2012, 27 pages.
Office Action from Parent U.S. Appl. No. 13/152,711, dated Jan. 14, 2013, 27 pages.
Office Action from Parent U.S. Appl. No. 12/894,951, dated Dec. 28, 2012, 13 pages.
Office Action from Parent U.S. Appl. No. 12/894,951, dated May 30, 2013, 12 pages.
Final Office Action from Parent U.S. Appl. No. 12/894,951, dated Oct. 11, 2013, 12 pages.
U.S. Appl. No. 12/697,485, filed Feb. 1, 2010, 36 pgs.
Office Action from U.S. Appl. No. 16/253,526, dated Apr. 16, 2021.
Office Action from U.S. Appl. No. 16/253,526, dated Jul. 20, 2021.
Office Action from U.S. Appl. No. 16/297,975, dated Jul. 29, 2021.
Notification of Transmittal of the International Search Report and the Written Opinion of the International Searching Authority, or the Declaration for PCT/US2020/059015, dated Jan. 22, 2021.
Office Action from U.S. Appl. No. 16/297,975, dated Nov. 10, 2021.
U.S. Appl. No. 17/504,897, filed Oct. 19, 2021.
Notification of Transmittal of the International Search Report and the Written Opinion of the International Searching Authority, or the Declaration for PCT/US2021/040313 dated Oct. 25, 2021; 14 pages.
U.S. Office Action for U.S. Appl. No. 16/297,975, dated Nov. 10, 2021.
Office Action from German Patent Application No. 11 2011 101 892.4, dated Oct. 1, 2020, and translation using Google Translate.
Wikipedia Online Encyclopedia, https: // de.wikipedia.org/w/index.php?title= four-wire measurement & oldid=67143514-4 (Retrieved Sep. 15, 2020) along with Google Translation.
U.S. Appl. No. 16/943,120, filed Jul. 30, 2020.
U.S. Appl. No. 17/088,824, filed Nov. 4, 2020.
U.S. Appl. No. 17/086,629, filed Nov. 2, 2020.
U.S. Appl. No. 17/090,129, filed Nov. 5, 2020.
U.S. Appl. No. 17/136,600, filed Dec. 29, 2020.
Office Action from U.S. Appl. No. 16/297,975, dated Oct. 14, 2022.
Office Action from U.S. Appl. No. 17/504,897, dated Sep. 13, 2022.
U.S. Appl. No. 17/750,719, filed May 23, 2022.
U.S. Appl. No. 17/893,412, filed Aug. 23, 2022.

* cited by examiner

| Battery ID | Parameter 1 | Parameter 2 | ... | Parameter M |
|---|---|---|---|---|
| $ID_1$ | $P_{11}$ | $P_{21}$ | ... | $P_{M1}$ |
| $ID_2$ | $P_{12}$ | $P_{22}$ | ... | $P_{M2}$ |
| ⋮ | ⋮ | ⋮ | ⋮ | ⋮ |
| $ID_N$ | $P_{1N}$ | $P_{2N}$ | ... | $P_{MN}$ |

FIG. 5

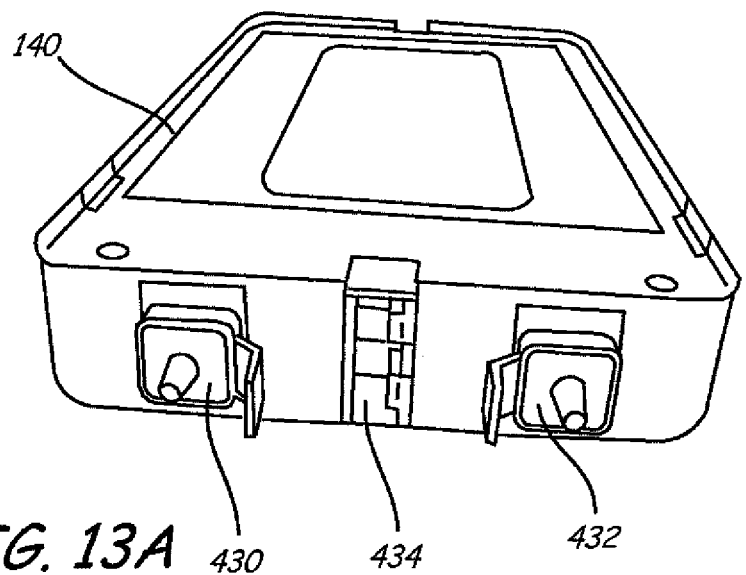
FIG. 13A  430    434    432
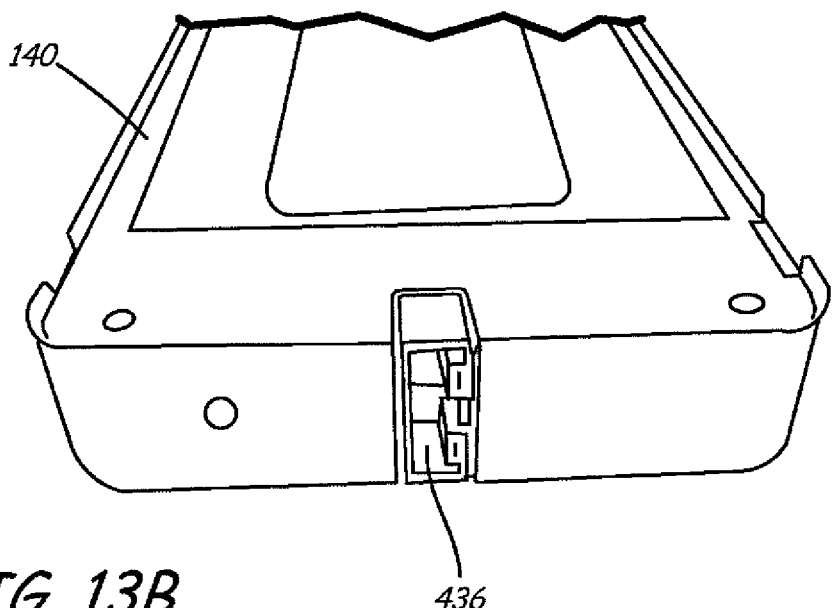
FIG. 13B    436

# BATTERY PACK MAINTENANCE FOR ELECTRIC VEHICLE

CROSS-REFERENCE TO RELATED APPLICATION

The present application is a continuation of U.S. patent application Ser. No. 14/039,746, filed Sep. 27, 2013 which is a continuation of U.S. patent application Ser. No. 13/152,711, filed Jun. 3, 2011, which is based on and claims the benefit of U.S. provisional patent application Ser. No. 61/351,017, filed Jun. 3, 2010, and is also a Continuation of and claims priority of U.S. patent application Ser. No. 12/894,951, filed Sep. 30, 2010, the contents of which are hereby incorporated by reference in their entirety.

BACKGROUND OF THE INVENTION

The present invention relates to electric vehicles of the types which use battery packs for storing electricity. More specifically, the present invention relates to maintenance of such battery packs.

Traditionally, automotive vehicles have used internal combustion engines as their power source. Petroleum as a source of power. However, vehicles which also store energy in batteries are finding widespread use. Such vehicle can provide increased fuel efficiency and can be operated using alternative energy sources.

Some types of electric vehicles are completely powered using electric motors and electricity. Other types of electric vehicles include an internal combustion engine. The internal combustion engine can be used to generate electricity and supplement the power delivered by the electric motor. These types of vehicles are known as "hybrid" electric vehicles.

Operation of an electric vehicle requires a source of electricity. Typically, electric vehicles store electricity in large battery packs which consist of a plurality of batteries. These batteries may be formed by a number of individual cells or may themselves be individual cells depending on the configuration of the battery and battery pack. The packs are large and replacement can be expensive.

SUMMARY OF THE INVENTION

A method and apparatus for repairing or testing a used battery pack from an electric vehicle include removing the battery pack from the vehicle. Battery tests are performed on at least some of the plurality of batteries and battery test results for each of the batteries tested are obtained. A cradle is configured to receive at least two different types of batteries. The cradle includes connectors to electrically couple circuitry of a battery tester to the battery.

BRIEF DESCRIPTION OF THE DRAWINGS

FIG. 5 illustrates a database shown in FIGS. 3 and 4.
FIG. 13A is a front perspective view and FIG. 13B is a rear perspective view of a another configuration of a hybrid electric vehicle battery.

DETAILED DESCRIPTION OF ILLUSTRATIVE EMBODIMENTS

As discussed in the background section, battery packs used with electric vehicles are able to store large amounts of energy. The battery packs are large and difficult to work on and test because of the high voltages involved. Further, the battery packs are expensive. In one aspect, the present application recognizes that a single bad battery within the battery pack can reduce the capabilities of the overall battery pack. A bad battery or (batteries) can reduce the amount of energy the battery pack can store, reduce the rate at which the battery pack can be recharged and cause other batteries with in the battery pack to drain prematurely.

In one aspect of the present invention, a battery pack is removed from the electric vehicle whereby maintenance can be performed on it. More specifically, individual batteries of the pack tested. A refurbished battery pack is made by preparing a new set of batteries for use in creating a refurbished battery pack. The new set of batteries is formed from used batteries from previously used battery pack(s) along with one or more additional batteries. The set of batteries used to form the refurbished battery pack are selected such that they have at least one test result which is similar to the others. The refurbished battery pack can then placed in an electric vehicle and be used as a source of power for the vehicle.

Figure 1:
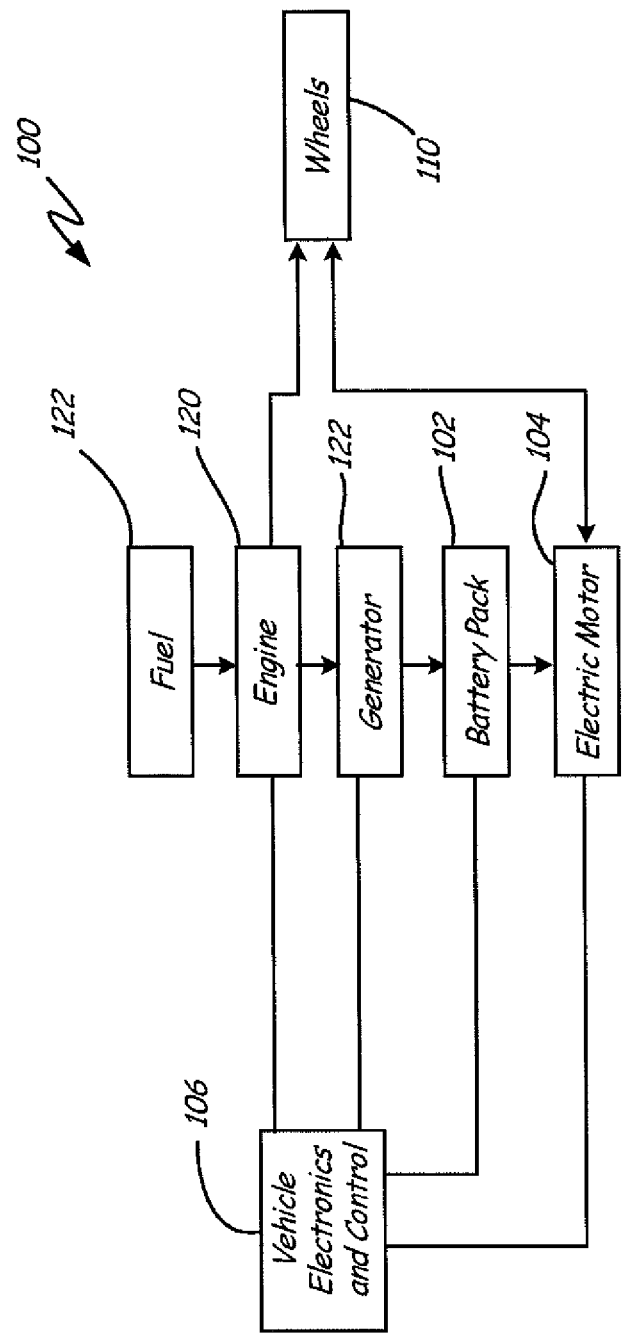
FIG. 1 is a simplified block diagram of an electric vehicle.

FIG. 1 is a simplified block diagram of an electric vehicle 100. Electric vehicle 100 can be configured to operate solely based upon electric power, or may include an internal combustion engine. Vehicle 100 includes a battery pack 102 and at least one electric motor 104. Vehicle electronics and control system 106 couples to the battery pack and electric motor and is configured to control their operation. Wheels 110 of vehicle 100 are configured to propel the vehicle in response to a mechanical input from electric motor 104. Electric motor 104 operates using energy drawn from the battery 102. In some configurations a regenerative braking system can be used in which a braking energy is recovered from the wheels 110 by the electric motor 104 or other equipment. The recovered energy can be used to recharge the battery pack 102.

FIG. 1 also shows optional components of vehicle 100. These optional components allow the vehicle 100 to operate as "hybrid" vehicle. In such a configuration, an internal combustion engine 120 is provided which operates using, for example, petroleum based fuel 122. The engine 120 can be configured to directly mechanically drive the wheels 110 and/or an electric generator 122. The electric generator 122 can be configured to charge the battery pack 102 and/or provide electrical power directly to electric motor 104.

The battery pack 102 is a critical component of the electric vehicle 100. Operation of the battery pack 102 will determine the efficiency of the vehicle, the overall range of the vehicle, the rate at which the battery pack 102 can be charged and the rate at which the battery pack 102 can be discharged.

Figure 2:
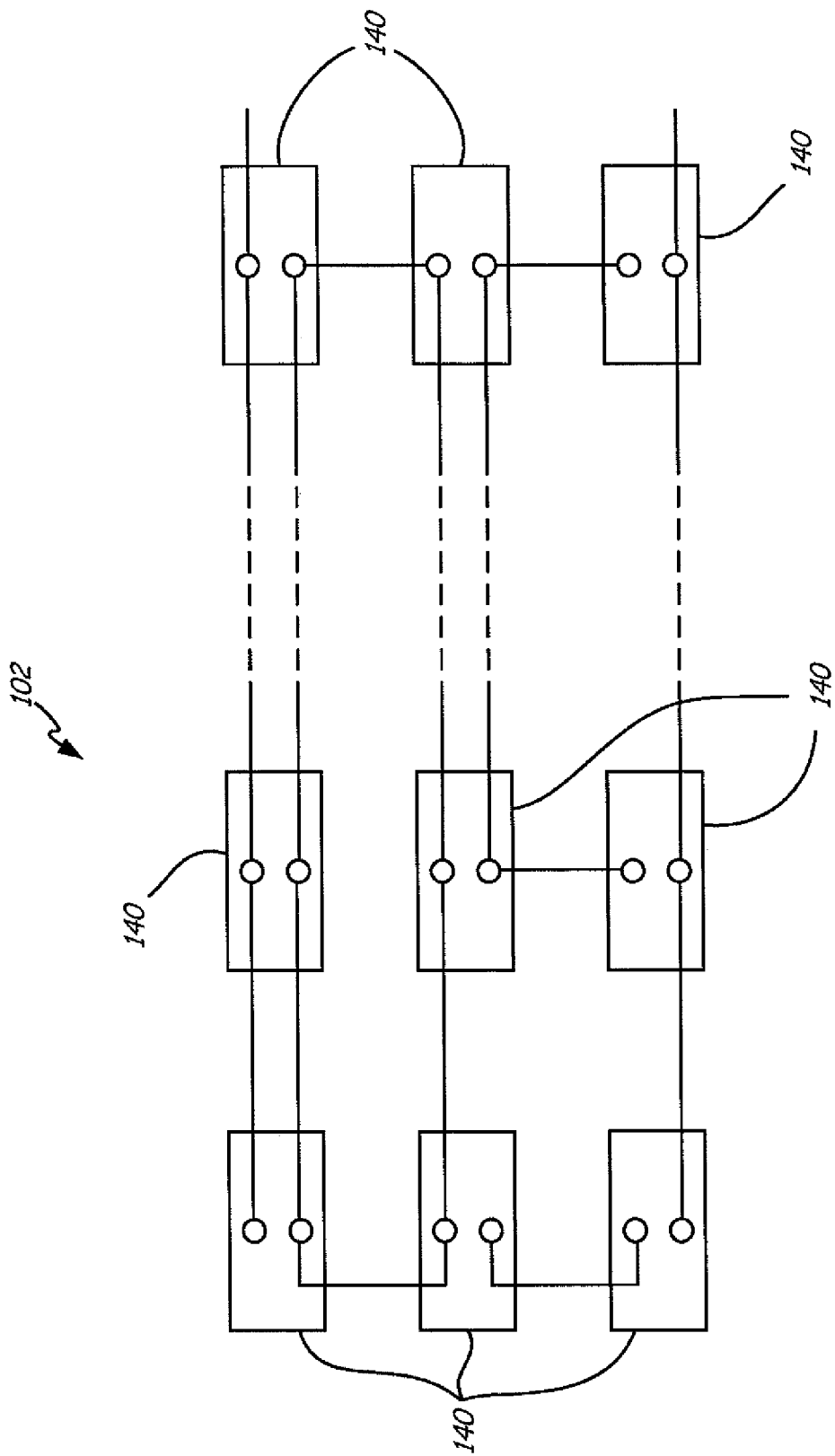
FIG. 2 is simplified schematic diagram of a battery pack for use in the electric vehicle of FIG. 1.

FIG. 2 is a simplified diagram of an example configuration of battery pack 102. In FIG. 2, a plurality of individual batteries 140 are shown connected in series and parallel. Each of the individual batteries 140 may comprise a single cell or may comprise multiple cells connected in series and/or parallel. These may be removable battery modules formed by a single cell or a group of cells. If elements 140 are a group of cells, in some configurations individual connections may be available within the battery and used in accordance with the invention.

During the lifetime of vehicle 100, the battery pack 102 will degrade with time and use. This degradation may be gradual, or may occur rapidly based upon a failure of a component within the pack 102. When such a failure occurs, or when the pack has degraded sufficiently, the entire battery pack 102 is typically replaced. The battery pack 102 is one of the primary components of electric vehicle 100 and its replacement can be very expensive. In one aspect, the present invention is directed to performing maintenance on battery pack 102. The maintenance can be performed after the battery pack has failed, or prior to the failure of the battery pack.

In one aspect, the invention includes the recognition that the failure, degradation, or impending failure of battery pack 102 may be due to the failing or degrading of one or more of the individual batteries 140 within the pack 102. In such a case, the battery pack 102 can be refurbished or otherwise repaired by identifying the failed, failing, or degraded batteries 140 and replacing them with operable batteries 140. In another aspect, the present invention includes the recognition that the simple replacement of a faulty battery 140 in a battery pack 102 may not provide the optimum configuration for the repaired or refurbished battery pack 102. More specifically, a "new" battery 140 used to replace a "bad" battery 140 within the battery pack 102 will introduce a battery which is not balanced with respect to other batteries 140 in the pack 102. This unbalanced battery 140 may cause further deterioration in the battery pack 102. Thus, in one aspect, the present invention includes selecting batteries 140 which have a similar characteristic or measured parameter for replacing bad batteries 140 within a battery pack 102.

In one aspect, the present invention provides a method and apparatus in which batteries 140 for use in battery packs 102 are sorted and selected for replacement based upon measured parameters. The measured parameters can be selected such that they are in agreement with one another within a desired range. Example parameters include static parameters in which a static property of a battery is measured using a static function as well as dynamic parameters in which a property of a battery is measured using a dynamic function. Example parameters include dynamic parameters such as conductance resistance, admittance, impedance, etc., as well as static equivalents. Load testing based parameters may also be employed. Other example parameters include battery capacitance, battery state of charge, battery voltage, and others.

Figure 3:
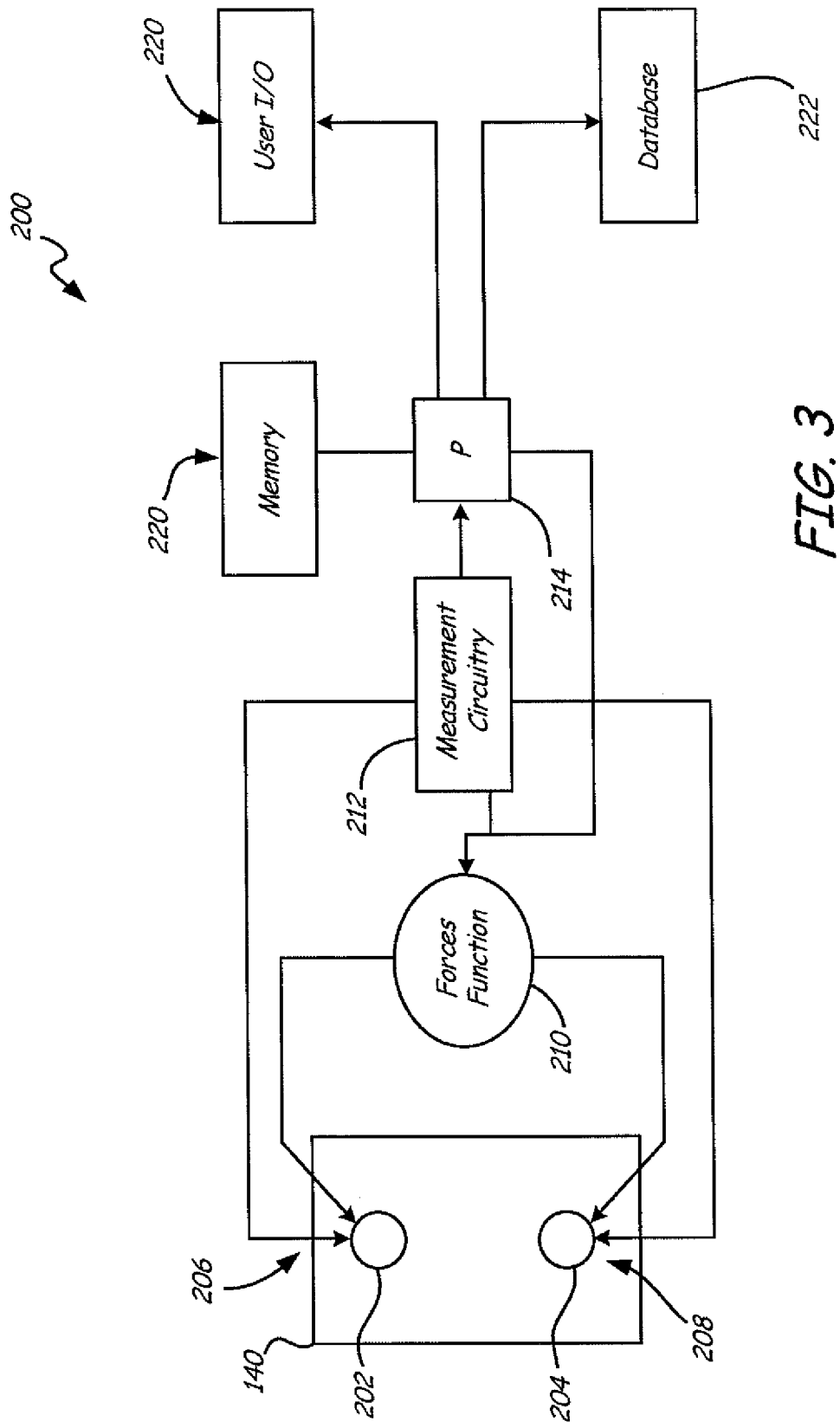
FIG. 3 is a block diagram of a device in accordance with one example embodiment of the present invention.

FIG. 3 is a simplified block diagram of a battery pack maintenance device 200 for performing maintenance on battery pack 102. FIG. 3 shows one example of battery test circuitry, in FIG. 3 maintenance device 200 is shown coupled to battery 140 having a positive terminal 202 and a negative terminal 204. A connection 206 is provided to terminal 202 and a similar connector 208 is provided to terminal 204. The connectors 204 and 206 are illustrated as Kelvin connectors, however, the invention is not limited to this configuration. Through connections 206 and 208, a forcing function 210 is coupled to battery 140. The forcing function applies a forcing function signal to the battery 140. The forcing function signal may have a time varying component and may be an active signal in which an electrical signal is injected into the battery or maybe a passive signal in which a current is drawn from the battery. Measurement circuitry 212 is configured to measure a response to the battery 140 to the applied forcing function signal from the forcing function 210. Measurement circuitry 212 provides a measurement signal to microprocessor 214. Microprocessor 214 operates in accordance with instructions stored in memory 220. Memory 220 may also be configured to contain parameters measured from battery 140. A user input/output circuitry 220 is provided for use by an operator. Further, the device 200 is configured to store data in database 220. The battery testing may be optionally performed in accordance with techniques pioneered by Midtronics, Inc. of Willowbrook, Ill., and Dr. Keith S. Champlin, including for example, those discussed in U.S. Pat. No. 3,873,911, issued Mar. 25, 1975, to Champlin; U.S. Pat. No. 3,909,708, issued Sep. 30, 1975, to Champlin; U.S. Pat. No. 4,816,768, issued Mar. 28, 1989, to Champlin; U.S. Pat. No. 4,825,170, issued Apr. 25, 1989, to Champlin; U.S. Pat. No. 4,881,038, issued Nov. 14, 1989, to Champlin; U.S. Pat. No. 4,912,416, issued Mar. 27, 1990, to Champlin; U.S. Pat. No. 5,140,269, issued Aug. 18, 1992, to Champlin; U.S. Pat. No. 5,343,380, issued Aug. 30, 1994; U.S. Pat. No. 5,572,136, issued Nov. 5, 1996; U.S. Pat. No. 5,574,355, issued Nov. 12, 1996; U.S. Pat. No. 5,583,416, issued Dec. 10, 1996; U.S. Pat. No. 5,585,728, issued Dec. 17, 1996; U.S. Pat. No. 5,589,757, issued Dec. 31, 1996; U.S. Pat. No. 5,592,093, issued Jan. 7, 1997; U.S. Pat. No. 5,598,098, issued Jan. 28, 1997; U.S. Pat. No. 5,656,920, issued Aug. 12, 1997; U.S. Pat. No. 5,757,192, issued May 26, 1998; U.S. Pat. No. 5,821,756, issued Oct. 13, 1998; U.S. Pat. No. 5,831,435, issued Nov.

3, 1998; U.S. Pat. No. 5,871,858, issued Feb. 16, 1999; U.S. Pat. No. 5,914,605, issued Jun. 22, 1999; U.S. Pat. No. 5,945,829, issued Aug. 31, 1999; U.S. Pat. No. 6,002,238, issued Dec. 14, 1999; U.S. Pat. No. 6,037,751, issued Mar. 14, 2000; U.S. Pat. No. 6,037,777, issued Mar. 14, 2000; U.S. Pat. No. 6,051,976, issued Apr. 18, 2000; U.S. Pat. No. 6,081,098, issued Jun. 27, 2000; U.S. Pat. No. 6,091,245, issued Jul. 18, 2000; U.S. Pat. No. 6,104,167, issued Aug. 15, 2000; U.S. Pat. No. 6,137,269, issued Oct. 24, 2000; U.S. Pat. No. 6,163,156, issued Dec. 19, 2000; U.S. Pat. No. 6,172,483, issued Jan. 9, 2001; U.S. Pat. No. 6,172,505, issued Jan. 9, 2001; U.S. Pat. No. 6,222,369, issued Apr. 24, 2001; U.S. Pat. No. 6,225,808, issued May 1, 2001; U.S. Pat. No. 6,249,124, issued Jun. 19, 2001; U.S. Pat. No. 6,259,254, issued Jul. 10, 2001; U.S. Pat. No. 6,262,563, issued Jul. 17, 2001; U.S. Pat. No. 6,294,896, issued Sep. 25, 2001; U.S. Pat. No. 6,294,897, issued Sep. 25, 2001; U.S. Pat. No. 6,304,087, issued Oct. 16, 2001; U.S. Pat. No. 6,310,481, issued Oct. 30, 2001; U.S. Pat. No. 6,313,607, issued Nov. 6, 2001; U.S. Pat. No. 6,313,608, issued Nov. 6, 2001; U.S. Pat. No. 6,316,914, issued Nov. 13, 2001; U.S. Pat. No. 6,323,650, issued Nov. 27, 2001; U.S. Pat. No. 6,329,793, issued Dec. 11, 2001; U.S. Pat. No. 6,331,762, issued Dec. 18, 2001; U.S. Pat. No. 6,332,113, issued Dec. 18, 2001; U.S. Pat. No. 6,351,102, issued Feb. 26, 2002; U.S. Pat. No. 6,359,441, issued Mar. 19, 2002; U.S. Pat. No. 6,363,303, issued Mar. 26, 2002; U.S. Pat. No. 6,377,031, issued Apr. 23, 2002; U.S. Pat. No. 6,392,414, issued May 21, 2002; U.S. Pat. No. 6,417,669, issued Jul. 9, 2002; U.S. Pat. No. 6,424,158, issued Jul. 23, 2002; U.S. Pat. No. 6,441,585, issued Aug. 17, 2002; U.S. Pat. No. 6,437,957, issued Aug. 20, 2002; U.S. Pat. No. 6,445,158, issued Sep. 3, 2002; U.S. Pat. Nos. 6,456,045; 6,466,025, issued Oct. 15, 2002; U.S. Pat. No. 6,465,908, issued Oct. 15, 2002; U.S. Pat. No. 6,466,026, issued Oct. 15, 2002; U.S. Pat. No. 6,469,511, issued Nov. 22, 2002; U.S. Pat. No. 6,495,990, issued Dec. 17, 2002; U.S. Pat. No. 6,497,209, issued Dec. 24, 2002; U.S. Pat. No. 6,507,196, issued Jan. 14, 2003; U.S. Pat. No. 6,534,993; issued Mar. 18, 2003; U.S. Pat. No. 6,544,078, issued Apr. 8, 2003; U.S. Pat. No. 6,556,019, issued Apr. 29, 2003; U.S. Pat. No. 6,566,883, issued May 20, 2003; U.S. Pat. No. 6,586,941, issued Jul. 1, 2003; U.S. Pat. No. 6,597,150, issued Jul. 22, 2003; U.S. Pat. No. 6,621,272, issued Sep. 16, 2003; U.S. Pat. No. 6,623,314, issued Sep. 23, 2003; U.S. Pat. No. 6,633,165, issued Oct. 14, 2003; U.S. Pat. No. 6,635,974, issued Oct. 21, 2003; U.S. Pat. No. 6,707,303, issued Mar. 16, 2004; U.S. Pat. No. 6,737,831, issued May 18, 2004; U.S. Pat. No. 6,744,149, issued Jun. 1, 2004; U.S. Pat. No. 6,759,849, issued Jul. 6, 2004; U.S. Pat. No. 6,781,382, issued Aug. 24, 2004; U.S. Pat. No. 6,788,025, filed Sep. 7, 2004; U.S. Pat. No. 6,795,782, issued Sep. 21, 2004; U.S. Pat. No. 6,805,090, filed Oct. 19, 2004; U.S. Pat. No. 6,806,716, filed Oct. 19, 2004; U.S. Pat. No. 6,850,037, filed Feb. 1, 2005; U.S. Pat. No. 6,850,037, issued Feb. 1, 2005; U.S. Pat. No. 6,871,151, issued march 22, 2005; U.S. Pat. No. 6,885,195, issued Apr. 26, 2005; U.S. Pat. No. 6,888,468, issued May 3, 2005; U.S. Pat. No. 6,891,378, issued May 10, 2005; U.S. Pat. No. 6,906,522, issued Jun. 14, 2005; U.S. Pat. No. 6,906,523, issued Jun. 14, 2005; U.S. Pat. No. 6,909,287, issued Jun. 21, 2005; U.S. Pat. No. 6,914,413, issued Jul. 5, 2005; U.S. Pat. No. 6,913,483, issued Jul. 5, 2005; U.S. Pat. No. 6,930,485, issued Aug. 16, 2005; U.S. Pat. No. 6,933,727, issued Aug. 23, 200; U.S. Pat. No. 6,941,234, filed Sep. 6, 2005; U.S. Pat. No. 6,967,484, issued Nov. 22, 2005; U.S. Pat. No. 6,998,847, issued Feb. 14, 2006; U.S. Pat. No. 7,003,410, issued Feb. 21, 2006; U.S. Pat. No. 7,003,411, issued Feb. 21, 2006; U.S. Pat. No. 7,012,433, issued Mar. 14, 2006; U.S. Pat. No. 7,015,674, issued Mar. 21, 2006; U.S. Pat. No. 7,034,541, issued Apr. 25, 2006; U.S. Pat. No. 7,039,533, issued May 2, 2006; U.S. Pat. No. 7,058,525, issued Jun. 6, 2006; U.S. Pat. No. 7,081,755, issued Jul. 25, 2006; U.S. Pat. No. 7,106,070, issued Sep. 12, 2006; U.S. Pat. No. 7,116,109, issued Oct. 3, 2006; U.S. Pat. No. 7,119,686, issued Oct. 10, 2006; and U.S. Pat. No. 7,126,341, issued Oct. 24, 2006; U.S. Pat. No. 7,154,276, issued Dec. 26, 2006; U.S. Pat. No. 7,198,510, issued Apr. 3, 2007; U.S. Pat. No. 7,363,175, issued Apr. 22, 2008; U.S. Pat. No. 7,208,914, issued Apr. 24, 2007; U.S. Pat. No. 7,246,015, issued Jul. 17, 2007; U.S. Pat. No. 7,295,936, issued Nov. 13, 2007; U.S. Pat. No. 7,319,304, issued Jan. 15, 2008; U.S. Pat. No. 7,363,175, issued Apr. 22, 2008; U.S. Pat. No. 7,398,176, issued Jul. 8, 2008; U.S. Pat. No. 7,408,358, issued Aug. 5, 2008; U.S. Pat. No. 7,425,833, issued Sep. 16, 2008; U.S. Pat. No. 7,446,536, issued Nov. 4, 2008; U.S. Pat. No. 7,479,763, issued Jan. 20, 2009; U.S. Pat. No. 7,498,767, issued Mar. 3, 2009; U.S. Pat. No. 7,501,795, issued Mar. 10, 2009; U.S. Pat. No. 7,505,856, issued Mar. 17, 2009; U.S. Pat. No. 7,545,146, issued Jun. 9, 2009; U.S. Pat. No. 7,557,586, issued Jul. 7, 2009; U.S. Pat. No. 7,595,643, issued Sep. 29, 2009; U.S. Pat. No. 7,598,699, issued Oct. 6, 2009; U.S. Pat. No. 7,598,744, issued Oct. 6, 2009; U.S. Pat. No. 7,598,743, issued Oct. 6, 2009; U.S. Pat. No. 7,619,417, issued Nov. 17, 2009; U.S. Pat. No. 7,642,786, issued Jan. 5, 2010; U.S. Pat. No. 7,642,787, issued Jan. 5, 2010 U.S. Pat. No. 7,656,162, issued Feb. 2, 2010 U.S. Pat. No. 7,688,074, issued Mar. 30, 2010; U.S. Pat. No. 7,705,602, issued Apr. 27, 2010; U.S. Pat. No. 7,706,992, issued Apr. 27, 2010; U.S. Pat. No. 7,710,119, issued May 4, 2010; U.S. Pat. No. 7,723,993, issued May 25, 2010; U.S. Pat. No. 7,728,597, issued Jun. 1, 2010; U.S. Pat. No. 7,772,850, issued Aug. 10, 2010; U.S. Pat. No. 7,774,151, issued Aug. 10, 2010; U.S. Pat. No. 7,777,612, issued Aug. 17, 2010; U.S. Pat. No. 7,791,348, issued Sep. 7, 2010; U.S. Pat. No. 7,808,375, issued Oct. 5, 2010; U.S. Ser. No. 09/780,146, filed Feb. 9, 2001, entitled STORAGE BATTERY WITH INTEGRAL BATTERY TESTER; U.S. Ser. No. 09/756,638, filed Jan. 8, 2001, entitled METHOD AND APPARATUS FOR DETERMINING BATTERY PROPERTIES FROM COMPLEX IMPEDANCE/ADMITTANCE; U.S. Ser. No. 09/862,783, filed May 21, 2001, entitled METHOD AND APPARATUS FOR TESTING CELLS AND BATTERIES EMBEDDED IN SERIES/PARALLEL SYSTEMS; U.S. Ser. No. 09/880,473, filed Jun. 13, 2001; entitled BATTERY TEST MODULE; U.S. Ser. No. 10/042,451, filed Jan. 8, 2002, entitled BATTERY CHARGE CONTROL DEVICE; U.S. Ser. No. 10/109,734, filed Mar. 28, 2002, entitled APPARATUS AND METHOD FOR COUNTERACTING SELF DISCHARGE IN A STORAGE BATTERY; U.S. Ser. No. 10/112,998, filed Mar. 29, 2002, entitled BATTERY TESTER WITH BATTERY REPLACEMENT OUTPUT; U.S. Ser. No. 10/263,473, filed Oct. 2, 2002, entitled ELECTRONIC BATTERY TESTER WITH RELATIVE TEST OUTPUT; U.S. Ser. No. 10/310,385, filed Dec. 5, 2002, entitled BATTERY TEST MODULE; U.S. Ser. No. 09/653,963, filed Sep. 1, 2000, entitled SYSTEM AND METHOD FOR CONTROLLING POWER GENERATION AND STORAGE; U.S. Ser. No. 10/174,110, filed Jun. 18, 2002, entitled DAYTIME RUNNING LIGHT CONTROL USING AN INTELLIGENT POWER MANAGEMENT SYSTEM; U.S. Ser. No. 10/258,441, filed Apr. 9, 2003, entitled CURRENT MEASURING CIRCUIT SUITED FOR BATTERIES; U.S. Ser. No. 10/681,666, filed Oct. 8, 2003, entitled ELECTRONIC BATTERY TESTER WITH PROBE LIGHT; U.S. Ser. No. 10/791,141, filed Mar. 2, 2004, entitled METHOD AND APPARATUS FOR AUDITING A BATTERY TEST; U.S. Ser. No. 10/867,385, filed Jun. 14, 2004, entitled ENERGY MANAGEMENT SYSTEM FOR AUTOMOTIVE VEHICLE; U.S. Ser. No. 10/958,812, filed Oct. 5, 2004, entitled SCAN TOOL FOR ELECTRONIC BATTERY TESTER; U.S. Ser. No. 60/587,232, filed Dec. 14, 2004, entitled CELLTRON ULTRA, U.S. Ser. No. 60/653,537, filed Feb. 16, 2005, entitled CUSTOMER MANAGED WARRANTY CODE; U.S. Ser. No. 60/665,070, filed Mar. 24, 2005, entitled OHMMETER PROTECTION CIRCUIT; U.S. Ser. No. 60/694,199, filed Jun. 27, 2005, entitled GEL BATTERY CONDUCTANCE COMPENSATION; U.S. Ser. No. 60/705,389, filed Aug. 4, 2005, entitled PORTABLE TOOL THEFT PREVENTION SYSTEM, U.S. Ser. No. 11/207,419, filed Aug. 19, 2005, entitled SYSTEM FOR AUTOMATICALLY GATHERING BATTERY INFORMATION FOR USE DURING BATTERY TESTER/CHARGING, U.S. Ser. No. 60/712,322, filed Aug. 29, 2005, entitled AUTOMOTIVE VEHICLE ELECTRICAL SYSTEM DIAGNOSTIC DEVICE, U.S. Ser. No. 60/713,168, filed Aug. 31, 2005, entitled LOAD TESTER SIMULATION WITH DISCHARGE COMPENSATION, U.S. Ser. No. 60/731,881, filed Oct. 31, 2005, entitled PLUG-IN FEATURES FOR BATTERY TESTERS; U.S. Ser. No. 60/731,887, filed Oct. 31, 2005, entitled AUTOMOTIVE VEHICLE ELECTRICAL SYSTEM DIAGNOSTIC DEVICE; U.S. Ser. No. 11/304,004, filed Dec. 14, 2005, entitled BATTERY TESTER THAT CALCULATES ITS OWN REFERENCE VALUES; U.S. Ser. No. 60/751,853, filed Dec. 20, 2005, entitled BATTERY MONITORING SYSTEM; U.S. Ser. No. 11/304,004, filed Dec. 14, 2005, entitled BATTERY TESTER WITH CALCULATES ITS OWN REFERENCE VALUES; U.S. Ser. No. 60/751,853, filed Dec. 20, 2005, entitled BATTERY MONITORING SYSTEM; U.S. Ser. No. 11/356,443, filed Feb. 16, 2006, entitled ELECTRONIC BATTERY TESTER WITH NETWORK COMMUNICATION; U.S. Ser. No. 11/519,481, filed Sep. 12, 2006, entitled BROAD-BAND LOW-CONDUCTANCE CABLES FOR MAKING KELVIN CONNECTIONS TO ELECTROCHEMICAL CELLS AND BATTERIES; U.S. Ser. No. 60/847,064, filed Sep. 25, 2006, entitled STATIONARY BATTERY MONITORING ALGORITHMS; U.S. Ser. No. 11/641,594, filed Dec. 19, 2006, entitled METHOD AND APPARATUS FOR MEASURING A PARAMETER OF A VEHICLE ELECTRONIC SYSTEM; U.S. Ser. No. 60/950,182, filed Jul. 17, 2007, entitled BATTERY TESTER FOR HYBRID VEHICLE; U.S. Ser. No. 60/973,879, filed Sep. 20, 2007, entitled ELECTRONIC BATTERY TESTER FOR TESTING STATIONARY BATTERIES; U.S. Ser. No. 11/931,907, filed Oct. 31, 2007, entitled BATTERY MAINTENANCE WITH PROBE LIGHT; U.S. Ser. No. 60/992,798, filed Dec. 6, 2007, entitled STORAGE BATTERY AND BATTERY TESTER; U.S. Ser. No. 61/061,848, filed Jun. 16, 2008, entitled KELVIN CLAMP FOR ELECTRONICALLY COUPLING TO A BATTERY CONTACT; U.S. Ser. No. 12/168,264, filed Jul. 7, 2008, entitled BATTERY TESTERS WITH SECONDARY FUNCTIONALITY; U.S. Ser. No. 12/174,894, filed Jul. 17, 2008, entitled BATTERY TESTER FOR ELECTRIC VEHICLE; U.S. Ser. No. 12/204,141, filed Sep. 4, 2008, entitled ELECTRONIC BATTERY TESTER OR CHARGER WITH DATABUS CONNECTION; U.S. Ser. No. 12/328,022, filed Dec. 4, 2008, entitled STORAGE BATTERY AND BATTERY TESTER; U.S. Ser. No. 12/416,457, filed Apr. 1, 2009, entitled SYSTEM FOR AUTOMATICALLY GATHERING BATTERY INFORMATION; U.S. Ser. No. 12/416,453, filed Apr. 1, 2009, entitled INTEGRATED TAG READER AND ENVIRONMENT SENSOR; U.S. Ser. No. 12/416,445, filed Apr. 1, 2009, entitled SIMPLIFICATION OF INVENTORY MANAGEMENT; U.S. Ser. No. 12/485,459, filed Jun. 16, 2009, entitled CLAMP FOR ELECTRONICALLY COUPLING TO A BATTERY CONTACT; U.S. Ser. No. 12/498,642, filed Jul. 7, 2009, entitled ELECTRONIC BATTERY TESTER; U.S. Ser. No. 12/697,485, filed Feb. 1, 2010, entitled ELECTRONIC BATTERY TESTER; U.S. Ser. No. 12/698,375, filed Feb. 2, 2010, entitled ELECTRONIC BATTERY TESTER; U.S. Ser. No. 12/712,456, filed Feb. 25, 2010, entitled METHOD AND APPARATU FOR DETECTING CELL DETERIORATION IN AN ELECTROCHEMICAL CELL OR BATTERY; U.S. Ser. No. 61/311,485, filed Mar. 8, 2010, entitled BATTERY TESTER WITH DATABUS FOR COMMUNICATING WITH VEHICLE ELECTRICAL SYSTEM; U.S. Ser. No. 61/313,893, filed Mar. 15, 2010, entitled USE OF BATTERY MANUFACTURE/SELL DATE IN DIAGNOSIS AND RECOVERY OF DISCHARGED BATTERIES; U.S. Ser. No. 12/758,407, filed Apr. 12, 2010, entitled ELECTRONIC BATTERY TESTER WITH NETWORK COMMUNICATION; U.S. Ser. No. 12/765,323, filed Apr. 22, 2010, entitled AUTOMOTIVE VEHICLE ELECTRICAL SYSTEM DIAGNOSTIC DEVICE; U.S. Ser. No. 12/769,911, filed Apr. 29, 2010, entitled STATIONARY BATTERY TESTER; U.S. Ser. No. 61/330,497, filed May 3, 2010, entitled MAGIC WAND WITH ADVANCED HARNESS DETECTION; U.S. Ser. No. 12/774,892, filed May 6, 2010, entitled SCAN TOOL FOR ELECTRONIC BATTERY TESTER; U.S. Ser. No. 12/786,890, filed May 25, 2010, entitled BATTERY TESTER WITH PROMOTION FEATURE; U.S. Ser. No. 61/348,901, filed May 27, 2010, entitled ELECTRTONIC BATTERY TESTER; U.S. Ser. No. 29/362,827, filed Jun. 1, 2010, entitled ELECTRONIC BATTERY TESTER; U.S. Ser. No. 61/351,017, filed Jun. 3, 2010, entitled IMPROVED ELECTRIC VEHICLE AND HYBRID ELECTRIC VEHICLE BATTERY MODULE BALANCER; U.S. Ser. No. 12/818,290, filed Jun. 18, 2010, entitled BATTERY MAINTENANCE DEVICE WITH THERMAL BUFFER; U.S. Ser. No. 61/373,045, filed Aug. 12, 2010, entitled ELECTRONIC BATTERY TESTER FOR TESTING STATIONARY STORAGE BATTERY; U.S. Ser. No. 12/888,689, filed Sep. 23, 2010, entitled BATTERY TESTER FOR ELECTRIC VEHICLE; U.S. Ser. No. 12/894,951, filed Sep. 30, 2010, entitled BATTERY PACK MAINTENANCE FOR ELECTRIC VEHICLES; U.S. Ser. No. 61/411,162, filed Nov. 8, 2010, entitled ELECTRONIC BATTERY TESTER; U.S. Ser. No. 13/037,641, filed Mar. 1, 2011, entitled MONITOR FOR FRONT TERMINAL BATTERIES; which are incorporated herein by reference in their entirety.

During operation, device 200 is capable of measuring a parameter of battery 140 through the Kelvin connections 206 and 208. For example, a forcing function can be applied by forcing function 210. Measurement circuitry 212 can monitor the effect of the applied forcing function signal on the battery 140 and responsively provide an output to microprocessor 214. This can be used to measure a dynamic parameter of the battery such as dynamic conductance, etc. The present invention is not limited to this particular testing method and other techniques may also be employed. Further, the testing of battery 140 or group of batteries 140 may be performed using sensors within battery pack 102. In such a configuration, the testing may be performed without disassembling the battery pack 102. Microprocessor 214 can operate in accordance with programming instructions stored in memory 220. Memory 220 can also store information by microprocessor 214. Operation of device 200 can be controlled by user I/O 220 which can comprise, for example, a manual input such as a keyboard and/or an output such as a display. As discussed below in greater detail, measured parameters of battery can be stored in database 222 for subsequent retrieval.

Figure 4:
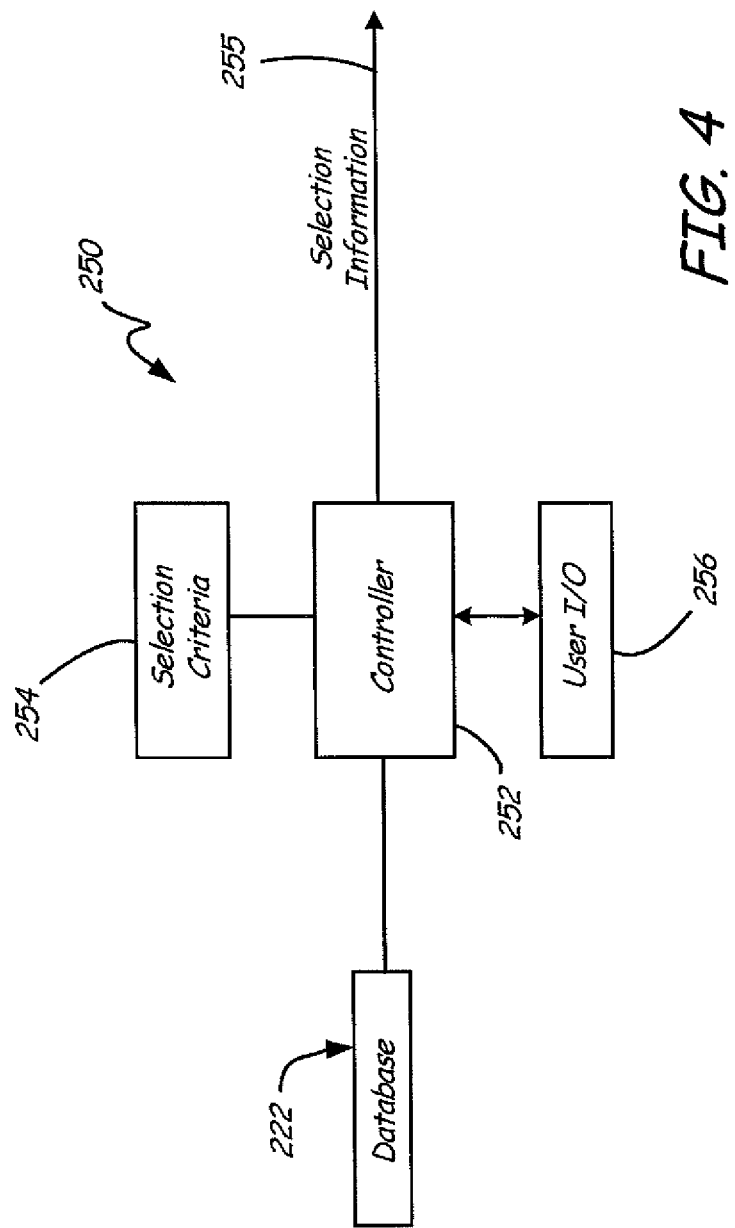
FIG. 4 is a simplified block diagram of a device for use in selecting batteries for use in refurbishing a battery pack.

FIG. 4 is simplified block diagram of a battery selection system 250 in accordance with one example embodiment of the invention. Battery selection system 250 can be embodied in the device 200 shown in FIG. 3 or can be a separate system. System 250 may typically be implemented in a computer or microprocessor system and is configured to access information from the database 222. System 250 includes a controller 252 coupled to the database 222 and battery selection criteria 254. Controller 252 examines battery parameters stored in database 222 based upon the selection criteria 254. Based upon this examination, controller 252 provides a selection information output 255. The selection information output 255 provides information related to which of the batteries identified in the database 222 should be used to form a refurbished battery pack 102. The selection information output 255 may also include information related to specifically where in the physical or electrical configuration of the battery pack 102 a specific battery 140 should be positioned. A user I/O 256 is also provided which may include a physical input such as a keypad and/or an output such as a display. The user I/O can be used to provide instructions to controller 252 and provide a mechanism for controller 252 to provide an output to an operator. The selection information 255 output may be delivered through the user I/O 256 or through some other means. Further, the selection criteria 254 can be updated as desired. In some configurations, controller 252 can also be configured to modify data within the database 222. The selection criteria 254 and the database 222 can be implemented in a memory such as memory 220 shown in FIG. 3.

FIG. 5 shows an example configuration of database 222. Database 222 includes a number of different fields. A battery identification field 224 is used to store information which identifies a battery 140. The battery 140 may be a battery from within an existing battery pack 102 or may be a new battery 140. At least one battery parameter 226 is associated with an identified battery. In some configurations, more than one battery parameter 226 is associated with one specific battery 140.

The battery identification 224 can be in accordance with any technique which will provide information which can be used to identify a battery. This may include, for example, a serial number or the like. The identifying information can be created during the refurbishing process, or at some other time, for example, during manufacture of a battery 140 or pack 102. This information may be manually entered into the database 222 using, for example, user I/O 220 shown in FIG. 3 or user I/O 256 shown in FIG. 4, or may be entered into database 222 using more automated techniques such as a barcode scanner, RFID tag, etc. User I/O 220 and 256 may comprise such inputs. The battery parameter 226 can comprise any information which is related to an identified battery 140. The information can be information obtained through a battery test or may be information obtained through other means. For example, information related to the age of the battery may be used, information related to whether the battery 140 came from a battery pack 102 in which an operator has or has not identified any problems, manufacturing information, geographic location information, information related to a location of a battery within the battery pack 102, etc. Examples of other parameters include parameters collected by testing the battery may include temperature, etc. These parameters may include the results of any type of battery test or data measured or collected prior to, during, or after a test is performed and are not limited to those discussed herein.

Figure 6:
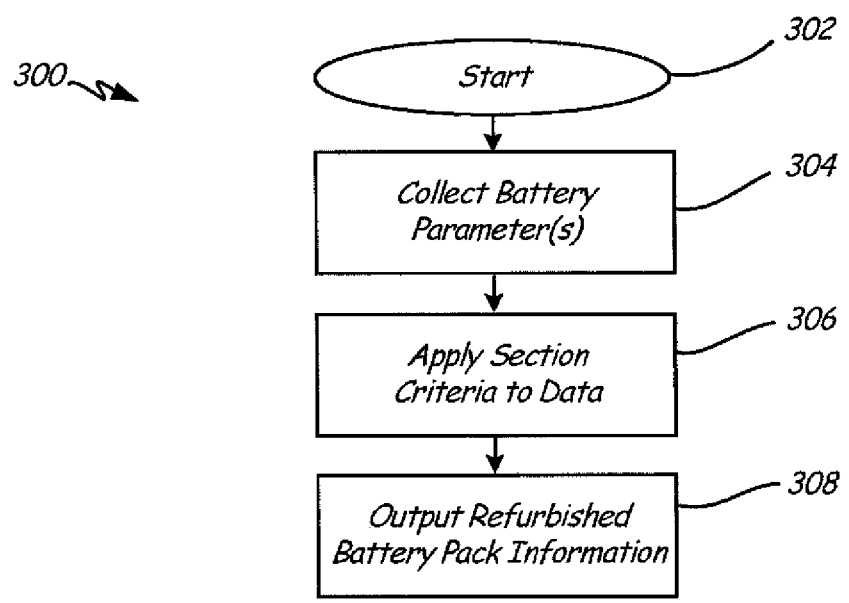
FIG. 6 is a flow chart showing steps for use in refurbishing a battery pack.

FIG. 6 is simplified block diagram 300 shown in steps in accordance with one example embodiment of the present invention. The steps begin at start block 302. At block 304 battery parameters are collected as discussed above. These battery parameters are stored in the database 222 and associated with information which identifies a respective battery 140. At block 306, the selection criteria 254 is applied to the data contained in database 222. Based upon this selection criteria, at block 308, the controller 352 shown in FIG. 4 provides the selection information output 255 which identifies refurbished battery pack information as discussed above.

During operation of the system discussed above, any bad batteries 140 within the battery pack 102 are identified by testing and removed from the battery pack. This may require that the battery pack 102 be charged and discharged. Further, remaining batteries 140 in the battery pack 102, as well as any replacement batteries 140, may be charged or discharged such that they are all at the approximately the same state of charge.

The batteries may be tested while remaining in the pack through connections at individual points between multiple batteries. In another example, the batteries are tested by collecting data over an internal databus of vehicle 100 using techniques described in copending application Ser. No. 12/174,894 which is entitled BATTERY TESTER FOR ELECTRIC VEHICLE, filed Jul. 17, 2008. In another example, the entire battery pack 102 may be tested by supplying a known current to the entire pack 102, or a portion of the pack 102. This current may be a DC current, a time varying DC current, a bi-polar current, a uni-polar AC current, etc. While is current is applied, a battery 140 or groups of batteries 140 within the battery pack 102 can be monitored. This monitoring may be through sensors which are internal to the battery pack 102 or through sensors which are separably applied to the battery 102. In another example, individual batteries are removed from the pack and tested.

The present invention includes the recognition that in a high voltage string of batteries, simply replacing one faulty battery 140 with a new battery 140 may not provide an optimal solution in refurbishing the battery pack 102. This is because the replacement battery 140 may be out of balance with the other batteries 140 in the battery pack 102. Thus, it is desirable that the batteries 140 in the battery pack 102 be balanced in such a way that they have a similar capacity, state of charge, voltage, impedance, conductance, or other parameter, depending upon the selection criteria 254.

The particular selection criteria 254 can be selected as desired. For example, the selection criteria 254 can be determined by testing many batteries 140 across many different battery packs 102 and identifying which parameter 226 or parameters 226 will have a detrimental impact if they are "out of balance" with other batteries 140 within a battery pack 102, identifying a range of acceptable values of a particular parameter 226, identifying an interrelationship between multiple parameters 226 and/or identifying a particular physical or electrical configuration of such batteries 140 within a battery pack 102. Using a load test as an example, a group of batteries 140 may be fully charged and then discharged for a period of time at a desired discharged rate. The voltage of the batteries 140 during or following the discharge can be measured. Batteries 140 having a voltage which is within a selected percentage of the voltage of other batteries 140 may be identified for use in a refurbished battery pack 102. This selection process may be applied only to batteries 140 which are used to replace faulty batteries 140 within a battery pack 102, or may be applied to additional batteries 140 within the battery pack 102 including all of the batteries 140 within a particular battery pack 102. Further, the batteries 140 which are used to replace faulty batteries 140 may themselves be retrieved from other battery packs 102 which are in the process of being refurbished or otherwise disassembled. The replacement batteries 140 may also comprise new or otherwise unused batteries 140. The battery 140 discussed herein may comprise an individual cell or may comprise multiple cells or batteries. The battery 140 and/or cells may operate in accordance with any suitable battery technology. The database 222 discussed above may be implemented in any suitable database 222 format. In one configuration, the database 222 may be implemented manually. In another configuration, the database is stored in a memory, for example, a computer memory.

Figure 7:
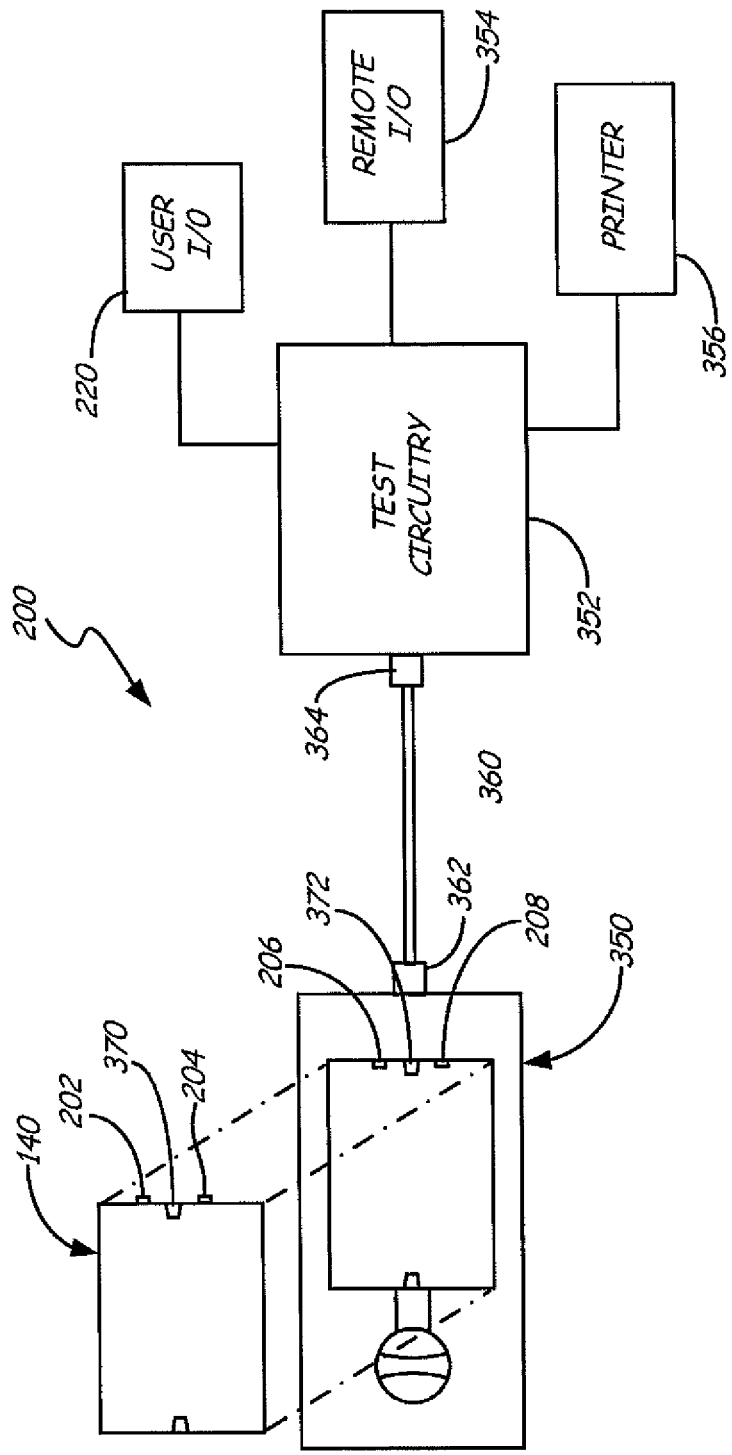
FIG. 7 is a simplified block diagram showing a diagnostic device including a cradle configured to receive battery.

FIG. 7 is a simplified block diagram showing battery tester 200 including a battery cradle 350. Tester 200 includes test circuitry 352 coupled to user I/O 220. FIG. 7 also illustrates a remote I/O connection 354 for communicating with a remote location such as over a network, to a centralized data system, to other electrical equipment, to a remote user, etc. An optional printer 356 is also illustrated in FIG. 7 and can be used to provide a physical hard copy of test results or other information.

The test circuitry 352 couples to the battery 350 to a removable cable 360. Cable 360 has ends 362 and 364 which plug into the battery cradle 350 and the test circuitry 352, respectively. The battery 140 can be placed into the cradle 350 whereby tests may be performed by the battery 140. Battery 140 is illustrated as including battery terminals 202 and 204 which couple to Kelvin connections 206 and 208 in cradle 350. These may be Kelvin connections or single connections. A midpoint connector 370 is also illustrated which allows a midpoint test connector 372 to connect to one or more connections between cells or groups of cells within the battery 140.

The configuration shown in FIG. 7 simplifies the technical requirements of connecting a battery to the battery test circuitry. The use of an individual cradle allows the battery to simply be "snapped" into place for testing. The cradle can include a protective case cover and integrated safety lock to protect the operator and circuitry during testing. Mechanical and/or electrical polarity detection can be used as discussed below in greater detail. The cable 360 can be replaceable as if it becomes worn through extended use. Additionally, different types of cradles can be used for different types of batteries 140 and simply plugged into the cable 360. Some particular types of cradles 350 may use different types of cabling connections 360. This allows the particular cable to be easily exchanged and/or plugged into a different type of cradle 350. In one configuration, the cable 360 represents a wireless communication link such as an RF link using BlueTooth®, WIFI, etc. In such a configuration, part of the test circuitry maybe located within the cradle 350 in order to sense voltages directed and/or apply forcing functions. The remote I/O 354 can then communicate as appropriate including wireless or wired connections such as Ethernet, WIFI, etc. The battery test circuitry 352 can be configured for testing, discharging and charging the battery 140. Some tests or battery maintenance may require discharging or recharging as well as testing the battery 140.

In one configuration, the test circuitry 352 receives information regarding the state of charge and/or voltage of batteries within a battery pack. A replacement battery 140 is then connected to the device 200 and the circuitry 352 adjust the state of charge and/or voltage of the replacement battery 140 to more closely match the state of charge and/or the voltage of the other batteries within the pack. As specified above, similar techniques can be used to balance the state of charge for all the batteries within a battery pack. The information regarding the state of charge and/or voltage can be received by the test circuitry by a user I/O 220 or through remote I/O 354. For example, the information may be received from the onboard databus of the vehicle such as OBDII databus, over wireless connection, input by service personnel. The state of charge of the battery may be determined using an approximate relationship between voltage of the battery, and/or current in/out of the battery, and state of charge. Other techniques may be used including measurement of dynamic parameter as discussed above. When charging a battery, the circuitry can be charged using a constant current or can charge in a constant current or constant voltage mode as desired. In such embodiments, the forcing function 210 is configured as a constant current source, a constant voltage source as well as a load including a constant current load.

Preferably, the test circuitry includes a fail safe configuration whereby if a voltage of a battery is out of a predetermined range, such as 2.5 volts to 4.25 volts, the current or voltage applied to the battery 140 may be terminated. As described below in more detail, the test circuitry can selectively couple to individual cells within the battery 140 if appropriate midpoint connections are provided. A power on self test (POST) and/or watchdog timer can be selectively provided within test circuitry 252 in order to improve the reliability of the device. In one configuration, a "start" button is provided on the user I/O 220 which can be used to initiate the charge/discharge cycle. Over voltage, current and temperature protection is preferably provided in order to protect the battery and the test circuitry.

Figure 8:
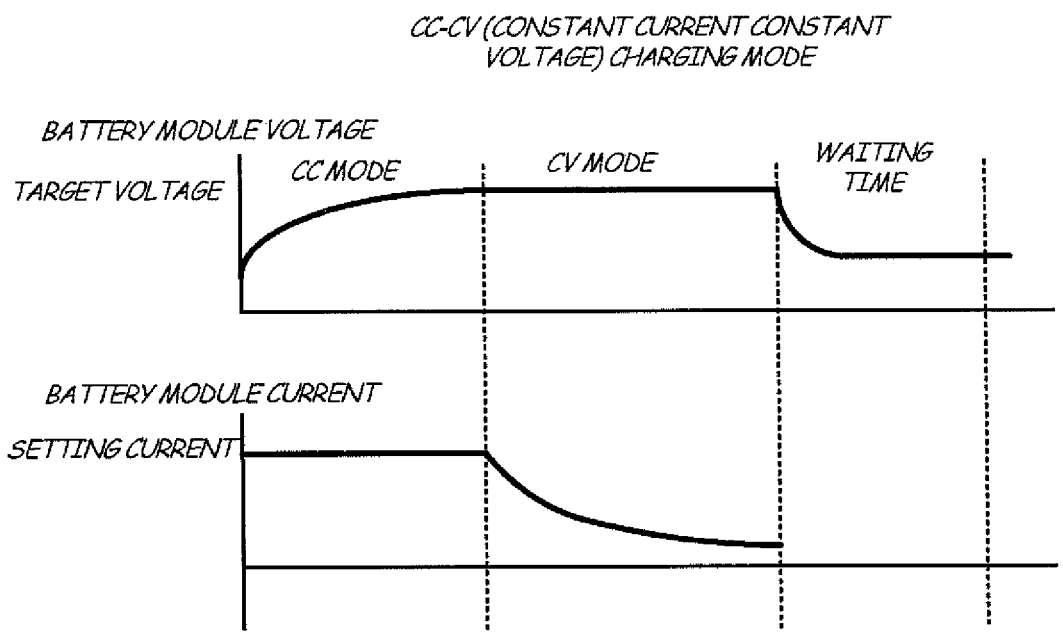
FIG. 8 shows graphs of voltage and current versus time charging of a battery.
Figure 9:
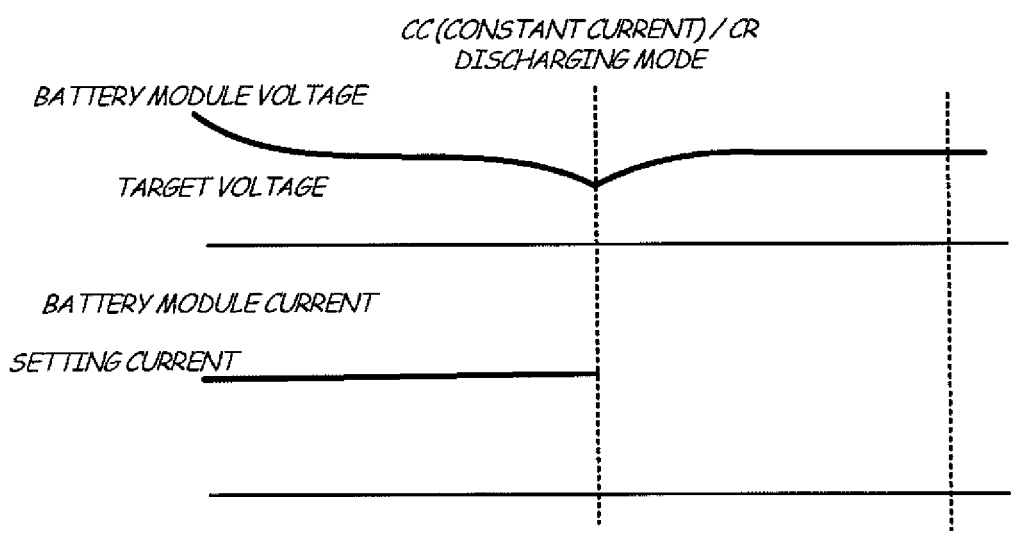
FIG. 9 shows graphs of voltage and current versus discharging of a battery.

FIG. 8 shows graphs of battery voltage and battery current during a constant voltage charging mode. As illustrated in FIG. 8, during a first phase of operation, a constant current is applied to the battery. In a second period, a constant voltage is applied to the battery followed by a waiting time. These periods can be cycled in order to maximize battery charge. Similarly, FIG. 9 shows a constant current discharging mode. In such a configuration a constant is applied to the battery for a first period of time. The discharge current is then brought to zero amps.

Figure 10:
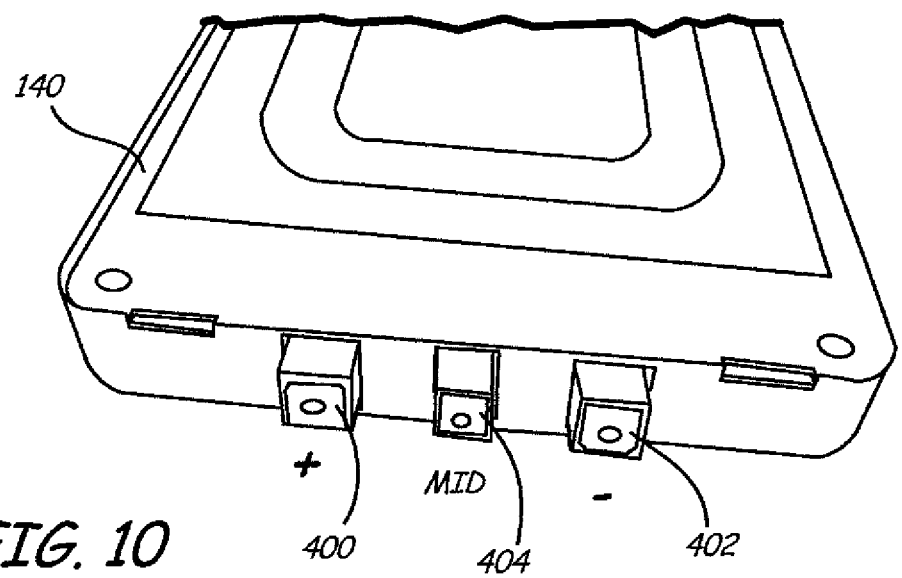
FIG. 10 is a front perspective view of a configuration of an electric vehicle battery.
Figure 11:
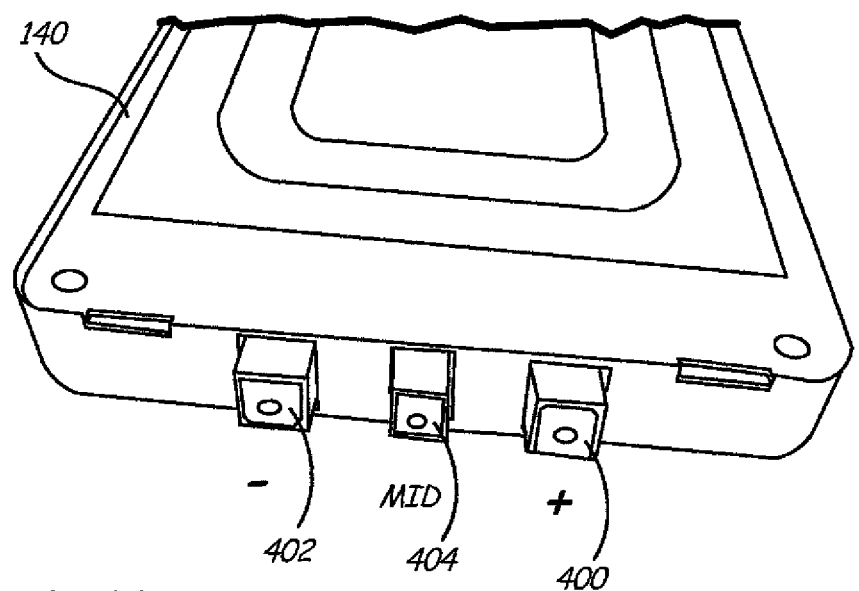
FIG. 11 is front perspective view of another configuration of an electric vehicle battery.

FIG. 10 is a front perspective view of battery 140 when configured as an electrical vehicle (EV) type battery. In such a configuration, the battery is made up of four cells in which two parallel pairs of cells are connected in series providing a total of four cells. The battery includes a positive connector 400 and a negative connector 402 including a midpoint connector 404. There are two different versions of this type of battery. FIG. 11 illustrates a second configuration in which the positive and negative connections 400, 402 are reversed. In one aspect, the present invention includes a cradle 350 configure to couple to electrical (EV) vehicle batteries configured either in the configuration shown in FIG. 10 or 11.

Figure 12A:
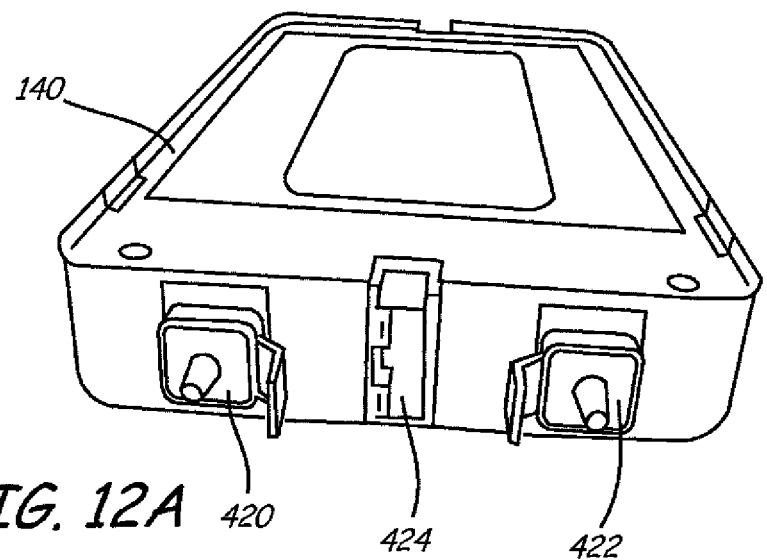
FIG. 12A is a front perspective view and FIG. 12B is a rear perspective view of a configuration of a hybrid electric vehicle battery.
Figure 12B:
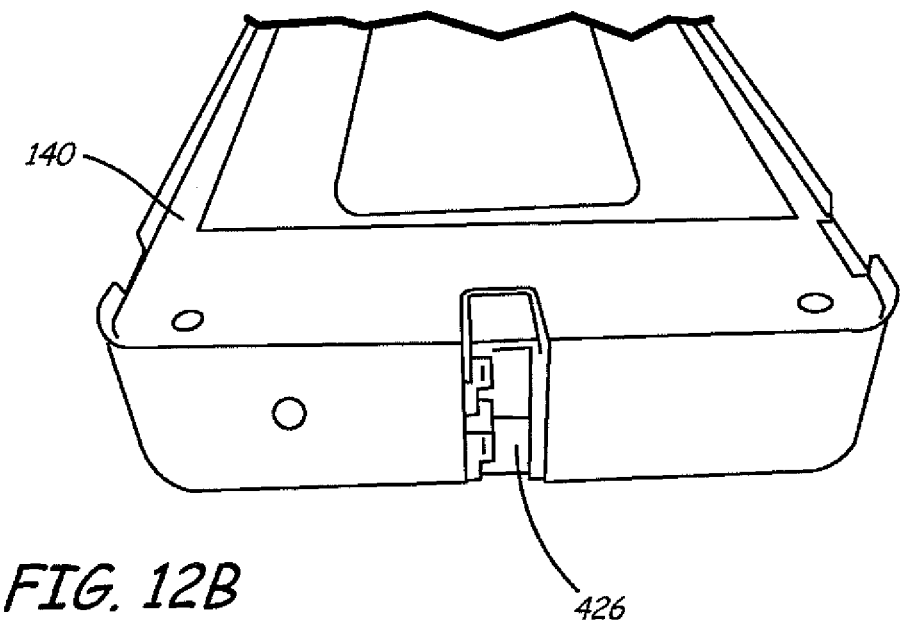

Similarly, hybrid electric vehicles (HEV) include two types of battery packs. FIG. 12A is a front perspective view and FIG. 12B is a rear perspective view of a first type of hybrid electric battery pack 140. In FIG. 12A, battery 140 includes end terminals 420 and 422. Typically, the hybrid electrical vehicle (HEV) battery consists of eight individual cells connected in series. The inner cell connectors provide inner cell connections between each of the eight batteries for a total of seven inner cell connections in addition to the two end connections. An inner cell connector 424 is provided having a "key" on the left side. In FIG. 12B, a second inner cell connector 426 is shown in which the "key" is opposite the key shown of connector 424 and is positioned on the right side. FIGS. 13A and 13B are front and rear perspective view, respectively, of a second hybrid electric battery 140. In FIG. 13A, end connectors 430 and 432 are illustrated along with an inner cell connector 434 having a "key" on the right side of the illustration. In FIG. 13B, a second inner cell connector 436 is illustrated in which the "key" is positioned on the left side of the figure. In one aspect, the present invention provides a cradle 350 for coupling to either the battery pack configuration shown in FIGS. 12A, 12B or the configuration shown in FIG. 12A, 12B or 13A, 13B.

Figure 14:
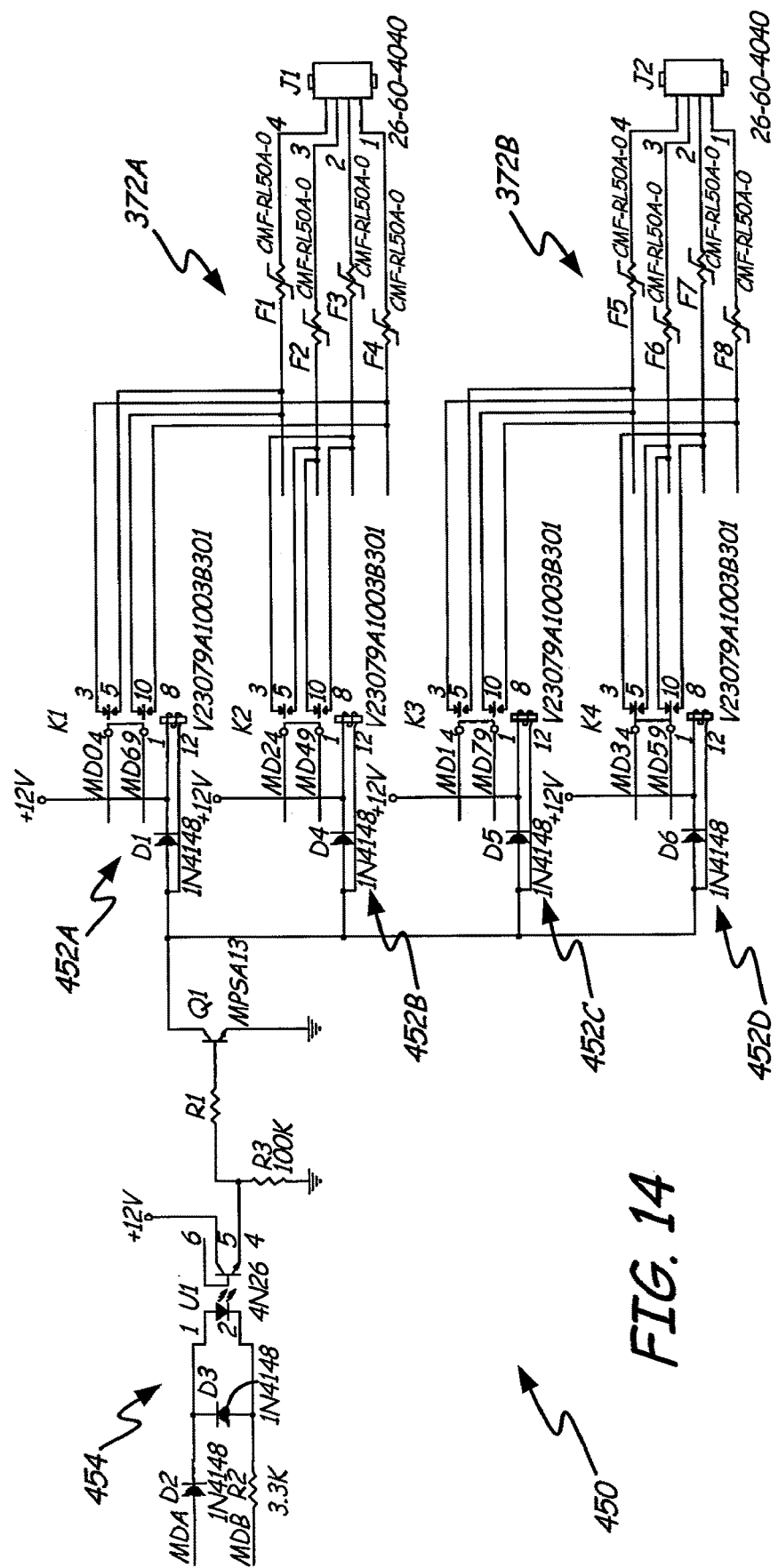
FIG. 14 is a schematic diagram showing polarity reversing circuitry for use in coupling to a battery.

FIG. 14 is an electrical schematic diagram of switching circuitry 450 used to selectively couple test circuitry 352 to cells within the battery 140 through the inner cell connector 372. In FIG. 14, two inner cell connectors 372A and 372B are illustrated for use in coupling to opposed ends of battery 140 when configured for a hybrid electric vehicle as illustrated in FIGS. 13A and 13B. Switching circuitry 450 includes four relay type switches 452A, 452B, 452C and 452D. Each of the relays 452 include two switches which each have an electrical connection to one of two connections in connector 372A, 372B connecting to an inner cell battery. A switch controller 454 is optically isolated from other circuitry and includes a transistor which drives coils within each of the relay switches 452A, B, C, and D. By selectively actuating the relays 452A, B, C, and D, the polarity of the electrical connections to the inner cell batteries can be reversed. Thus, in one embodiment, circuitry within test circuitry, for example measurement circuitry 272 shown in FIG. 3, senses a voltage of the inner cell connection and selectively actuates relays 452A, B, C and D through controller 454 to obtain the desired polarity on the electrical connection. Similarly circuitry can be used to select a desired polarity of electrical connections to the end points 400, 402 shown in FIGS. 10 and 11 as well as the end point connections 420, 422 and 430, 432 shown in FIGS. 12A and 13A, respectively. Circuitry 450 can be located in test circuitry 352 or can be located within cradle 350 as desired.

In one aspect, the present invention provides one or more cradle configuration for receiving a battery 140 and coupling the battery 140 to circuitry device 200. The cradle configuration allows coupling process to be at least partially automated thereby reducing the time required by an operator as well as the likelihood of operator error in providing the coupling. The cradle and associated circuitry can be configured to select a desired polarity of the connections to the battery and physically secure the battery for testing, charging, discharging, etc. This also allows a single cradle to be used with more than one battery configuration.

Figure 15:
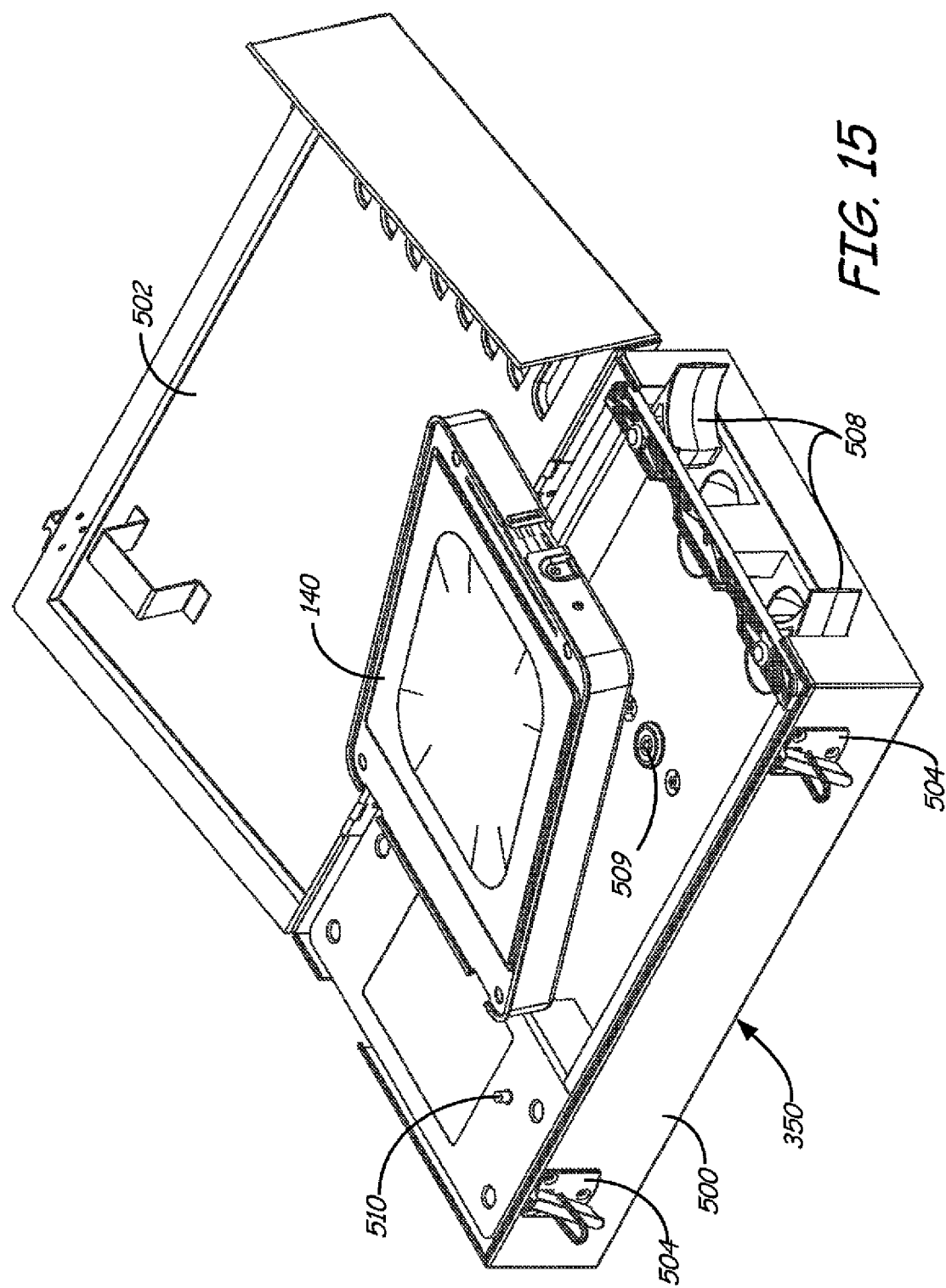
FIG. 15 is a perspective view showing electric vehicle battery encased in a cradle.
Figure 16:
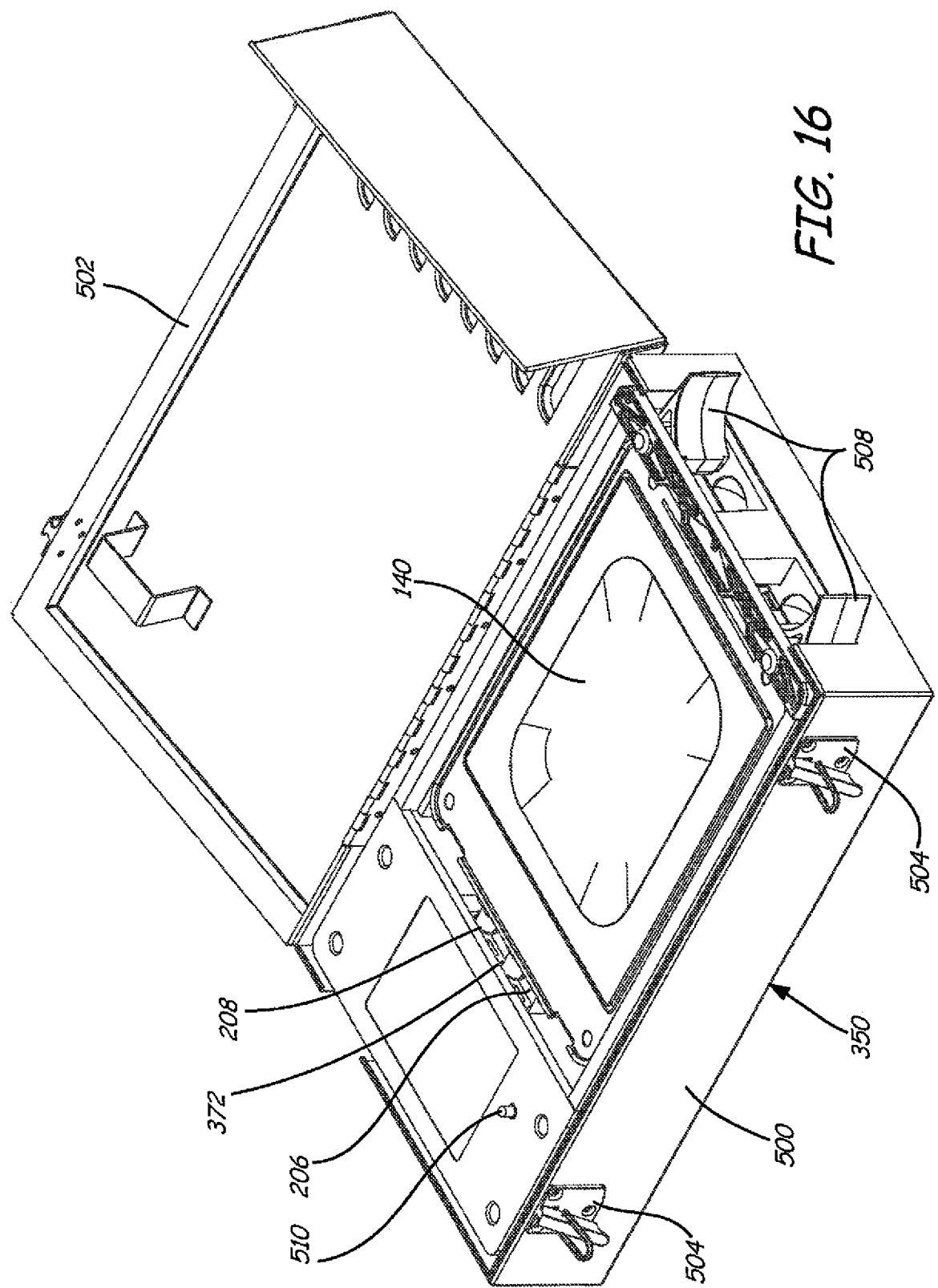
FIG. 16 is a perspective view showing a battery of FIG. 15 placed into the cradle.
Figure 17:
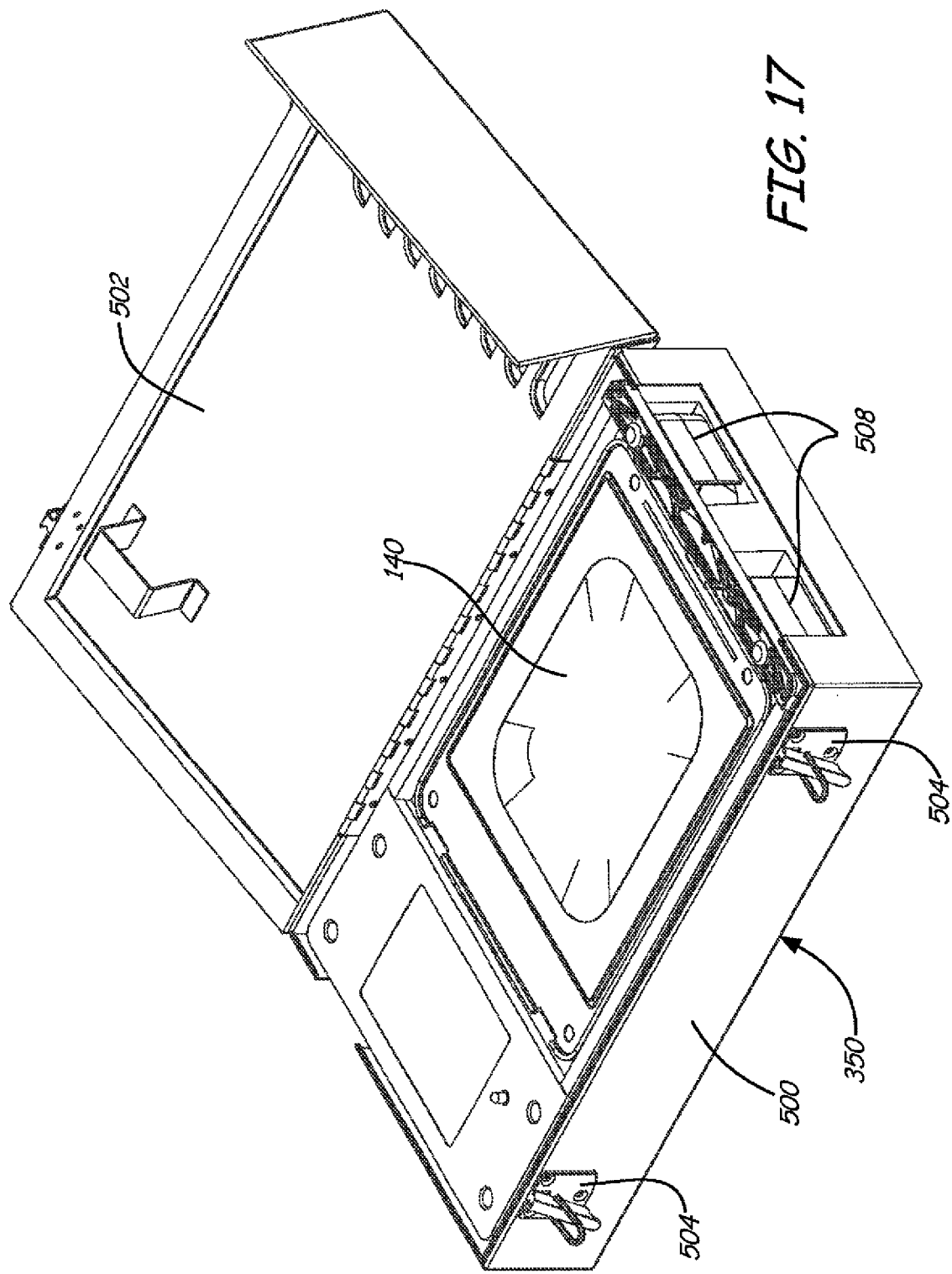
FIG. 17 is a perspective view showing a battery of FIG. 16 placed into the cradle.
Figure 18:
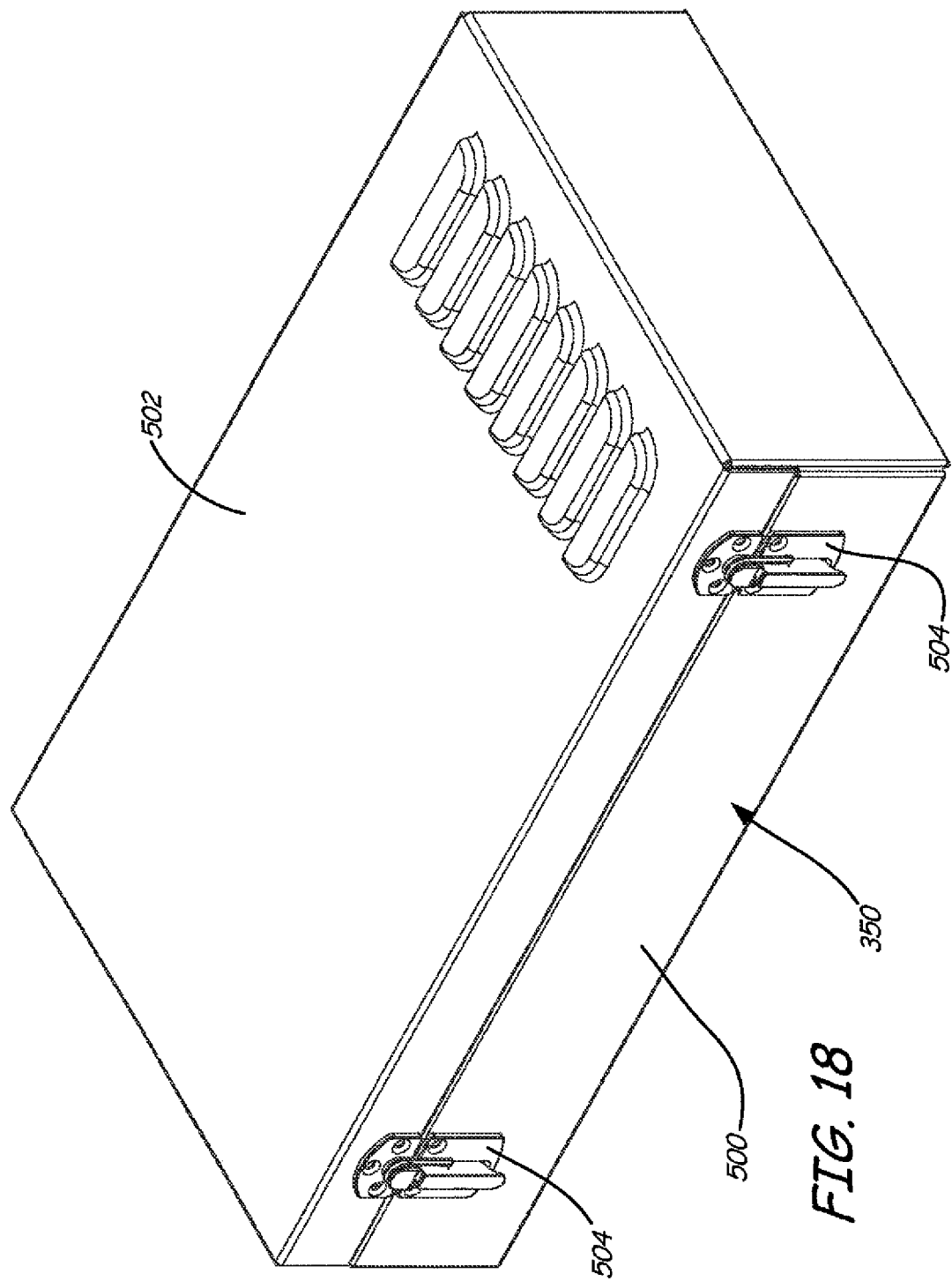
FIG. 18 is a perspective showing a cradle with a cover in the closed position.
Figure 19:
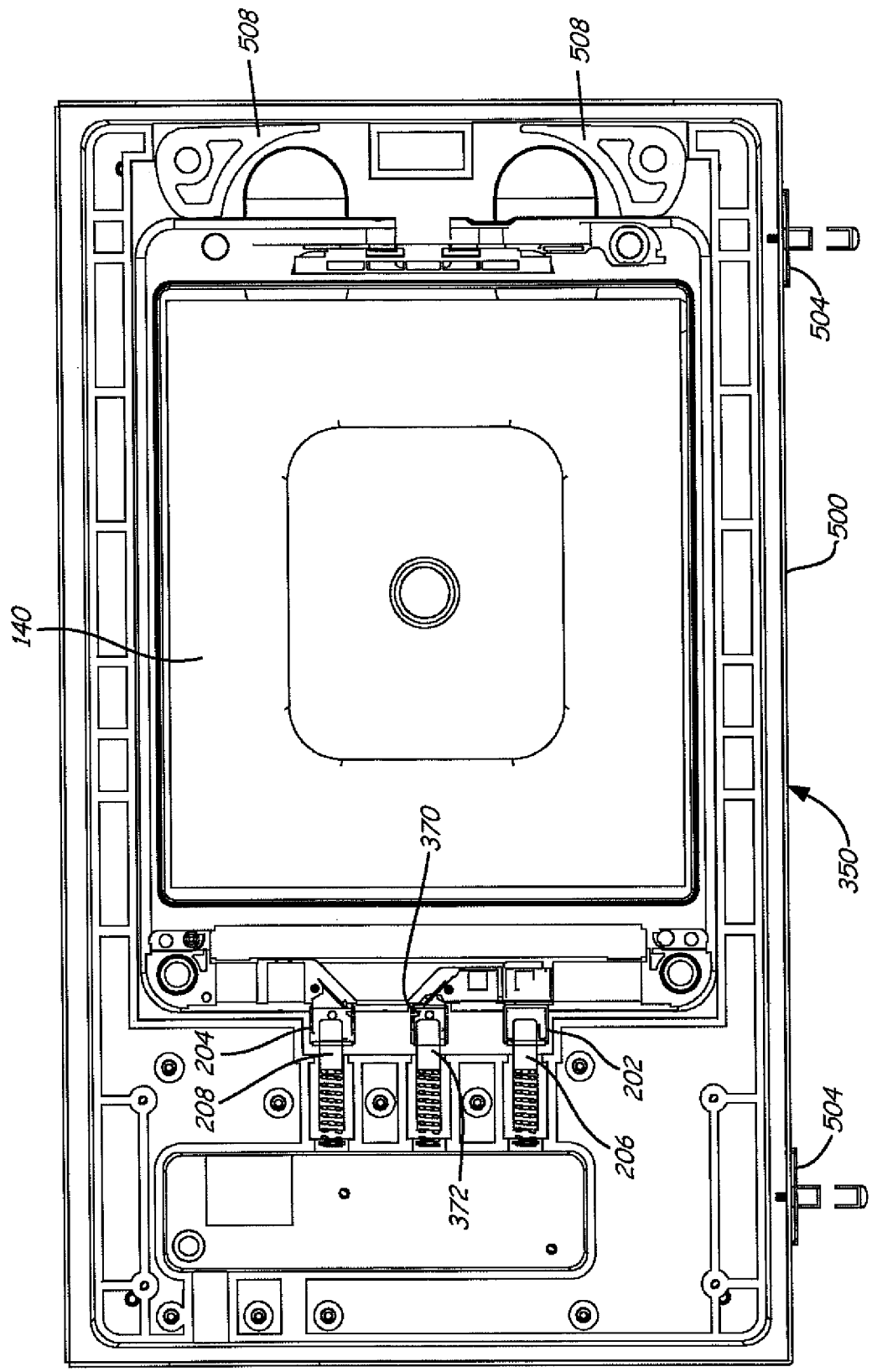
FIG. 19 is a top cutaway view of the cradle of FIG. 15.

FIG. 15 is an exploded perspective view of battery 140 adjacent to cradle 350. In the configuration of FIG. 15, battery 140 is configured as an electric vehicle (EV) battery. In FIG. 15, cradle 350 is illustrated as including a base 500, a cover 502 and latches 504 to secure cover 502 to base 500. Locking tabs 508 are illustrated in open position. A safety switch 510 is also shown and configured to actuate when lid 502 is closed. FIG. 16 is a perspective view showing battery 140 and inserted into base 500. Connectors 206 and 208, and midpoint test connector 372 are shown. These are configured to make contact with battery terminals 202 and 204 and 370. In FIG. 17, the locking tabs 508 are rotated into position thereby secure the battery 140 against Kelvin connections 206, 208 and midpoint connector 372. This also secures the battery 140 within the base 350 whereby cover 502 may be closed and latched and secured with latches 504 as illustrated in FIG. 18. FIG. 19 is a partial cutaway view plan view of base 500. In FIG. 19, operating of locking tabs 508 is shown further. Connectors 206, 208 and midpoint connector 372 are shown as being spring-loaded and urged against connectors 208, 202 and 370, respectively, of battery 140. Note that when the cover 502 is closed, switch 510 is pushed downward and can thereby be used to provide fail safe operation of device without having a cover 502 in the closed position. A temperature sensor 509 such as a thermometer is positioned adjacent battery 140 to measure its temperature during charging and discharging.

Figure 20:
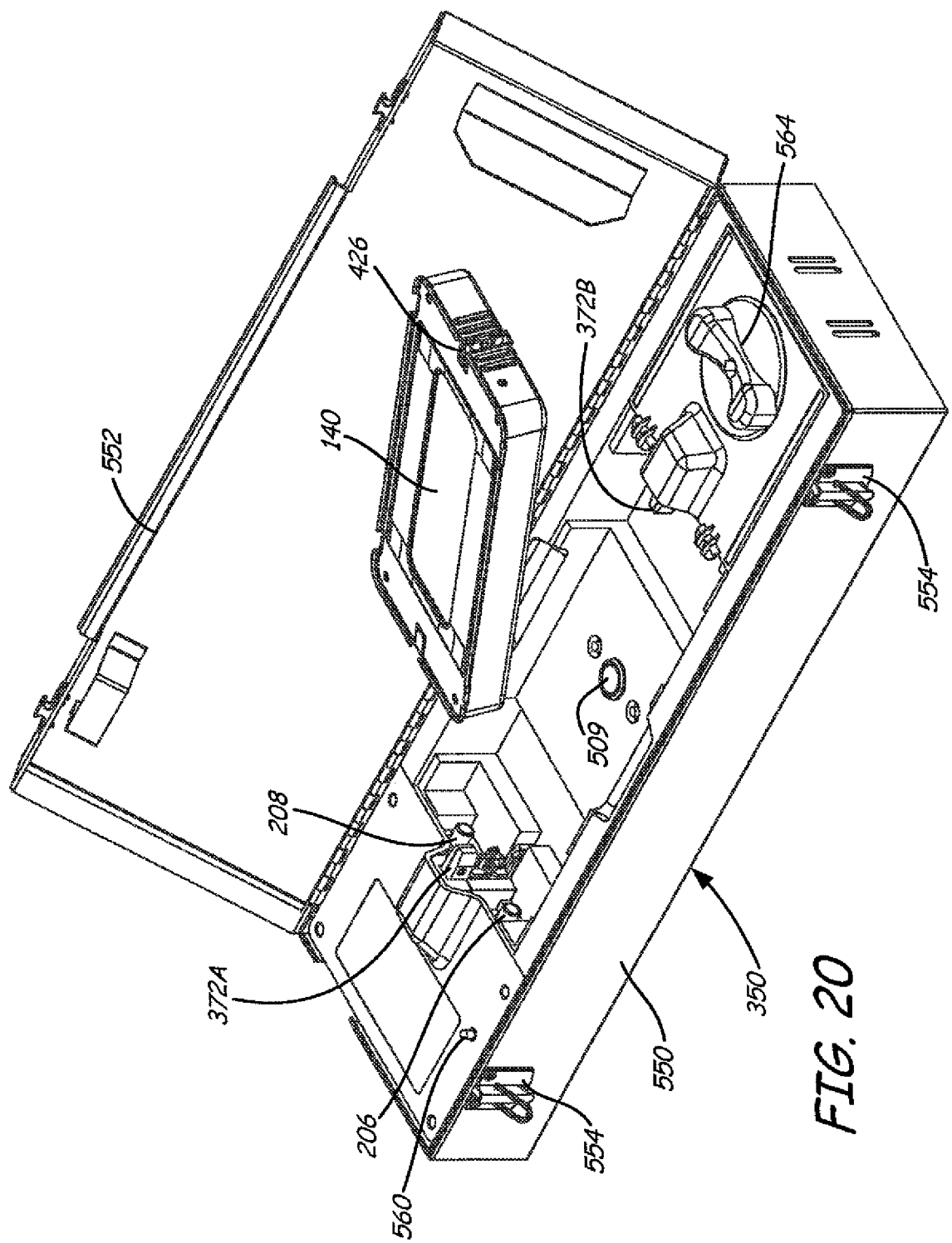
FIG. 20 is a perspective view of a hybrid electric vehicle battery facing a cradle.
Figure 21:
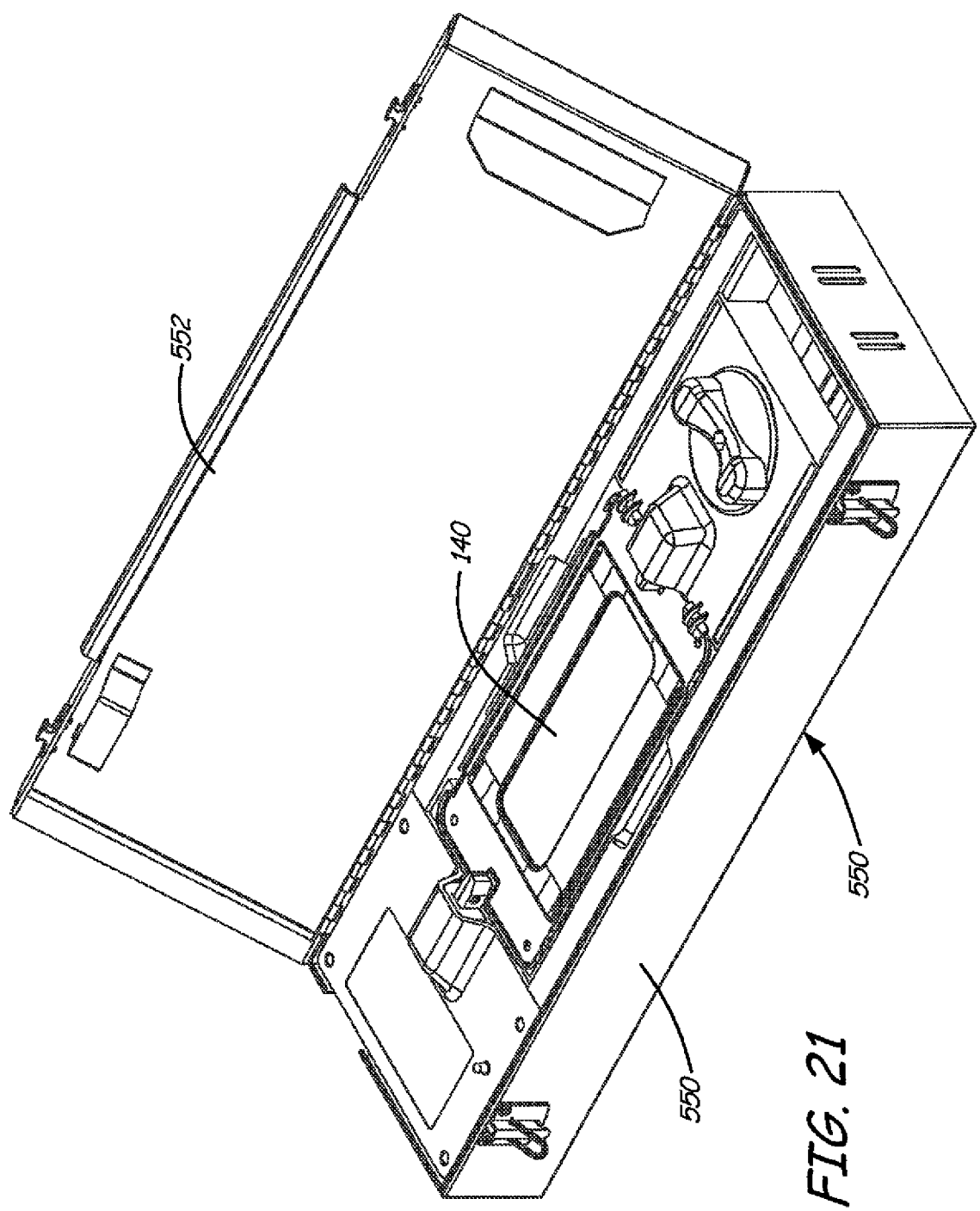
FIG. 21 is a perspective view of a battery positioned in the cradle of FIG. 20.
Figure 22:
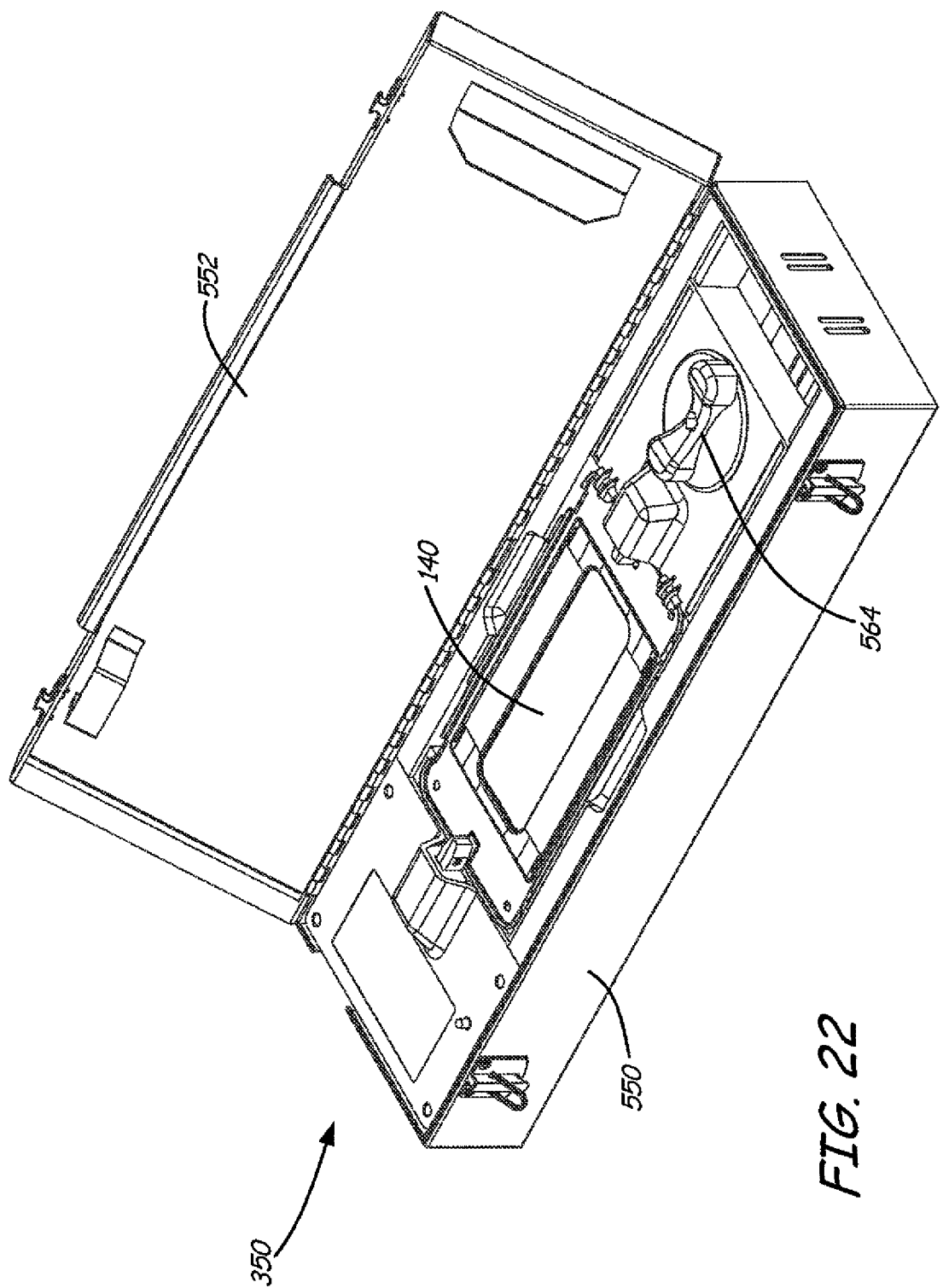
FIG. 22 is a perspective view of a battery secured in the cradle of FIG. 20.
Figure 23:
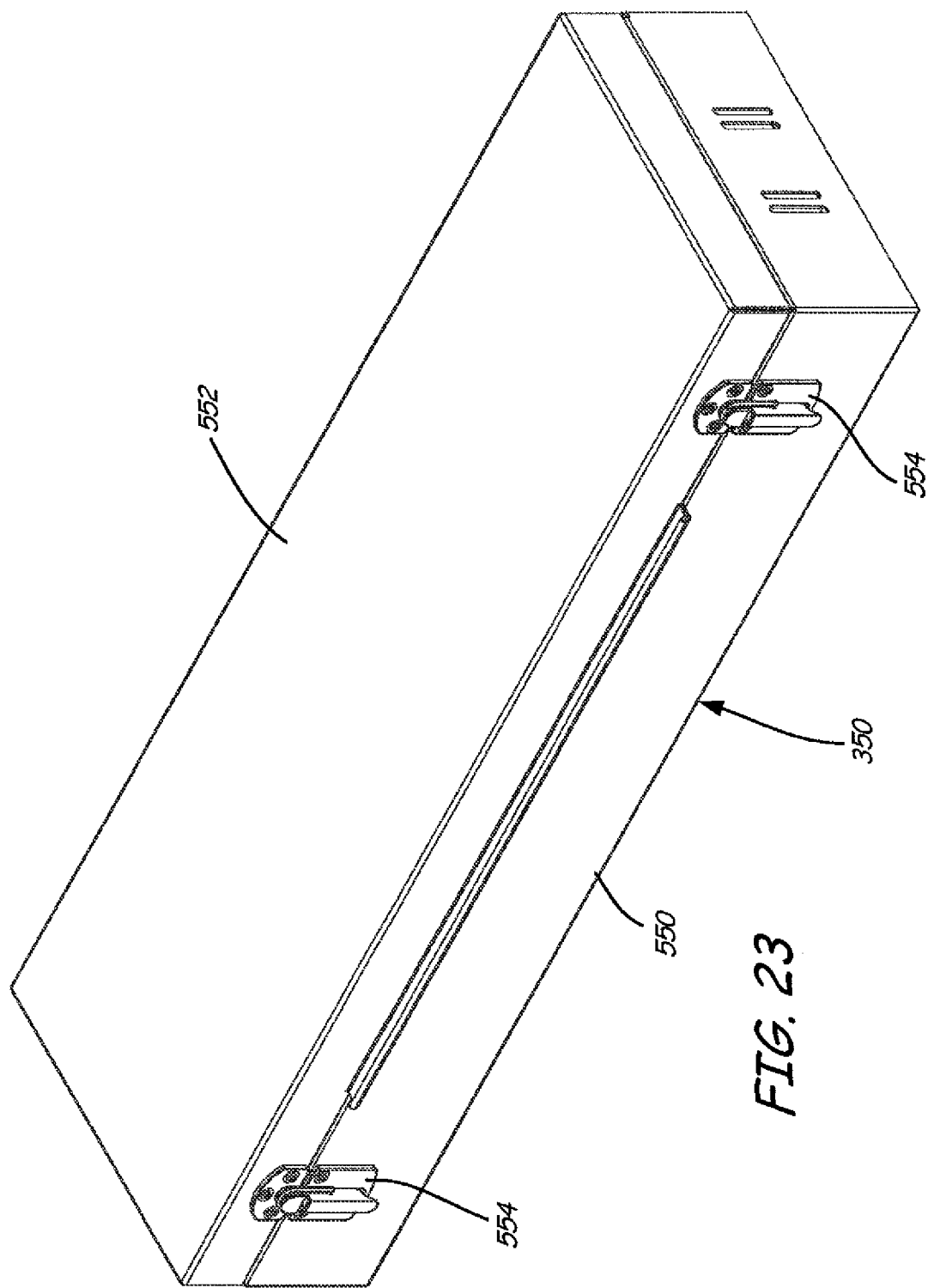
FIG. 23 is a perspective view showing the cradle of FIG. 20 having a cover in the closed position.

FIG. 20 is a perspective view of cradle 350 configured to receive a hybrid electric vehicle (HEV) style battery 140. In the configuration of FIG. 20, cradle 350 contains a base 550, a cover 552 and latches 554. In order to couple to a hybrid electric vehicle battery, the base 550 includes inner cell electrical (or midpoint) connectors 372A, 372B which are configured to couple to inter cell connector 424 and 436 (or 434 and 436), respectively, of battery 140. A safety switch 560 is also illustrated. When battery 140 is inserted into base 550, a slidable portion 555 can be pushed towards battery whereby the battery is secured and electrical contact is made. In rotatable actuator 564 is turned to thereby secure moveable portion 565 in place. Once the battery is secured, the cover 552 can be closed and latched as illustrated in FIG. 23. In this position, the switch 560 is actuated to thereby ensure that the cover 552 has been closed prior operation of the device.

Figure 24:
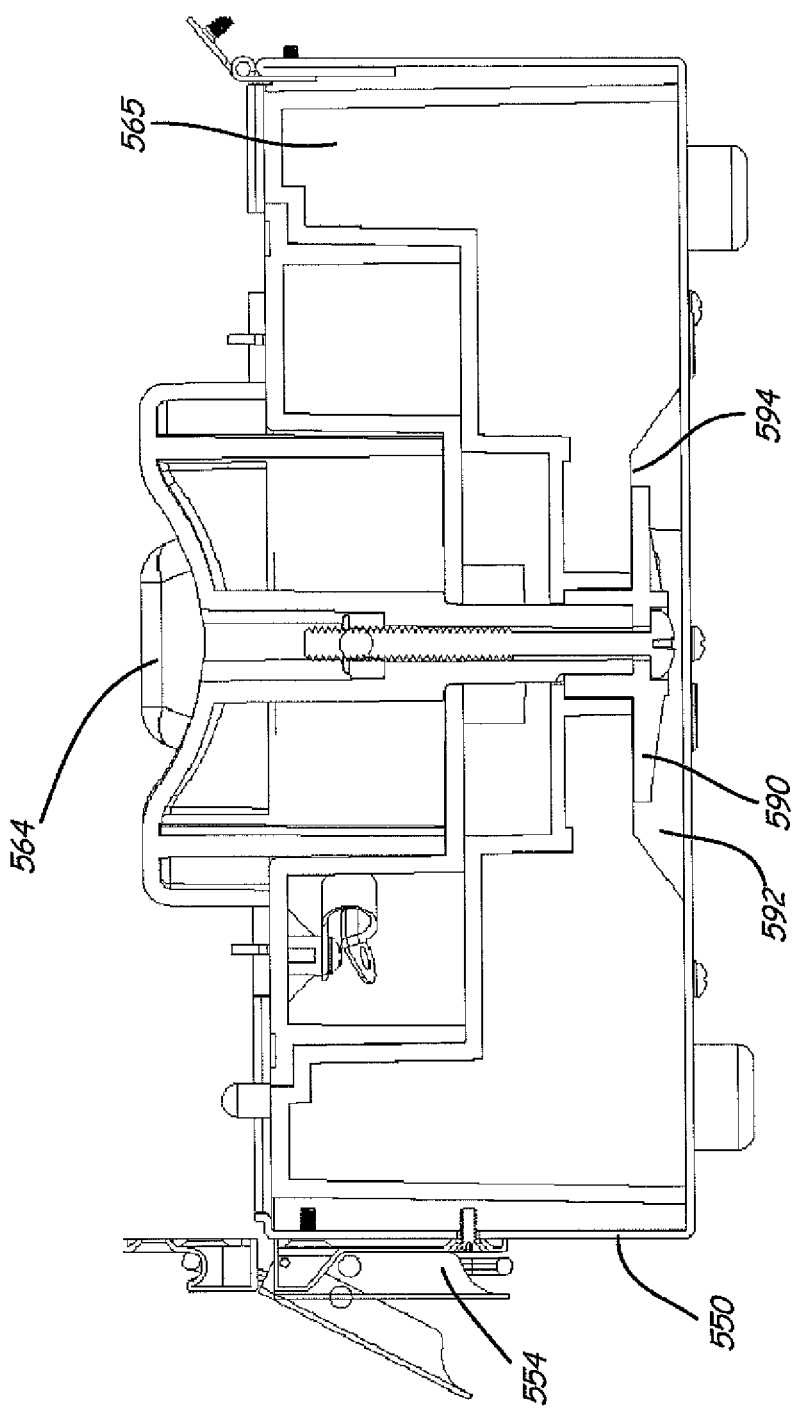
FIG. 24 is a side cross sectional view of the cradle of FIG. 20.

FIG. 24 is a side cross-sectional view of base 550 showing the actuator 564 in greater detail. As illustrated in FIG. 24, the actuator 564 can be rotated. Prior to rotation of actuator 564, moveable portion 565 is slid toward the battery 140 to thereby secure the battery into base 550. A locking disc 590 is slidably received in a track 592. The rotation of actuator 564 causes the locking disc 590 to be urged against track surface 594 to thereby secure the moveable portion 565 in position.

Figure 25:
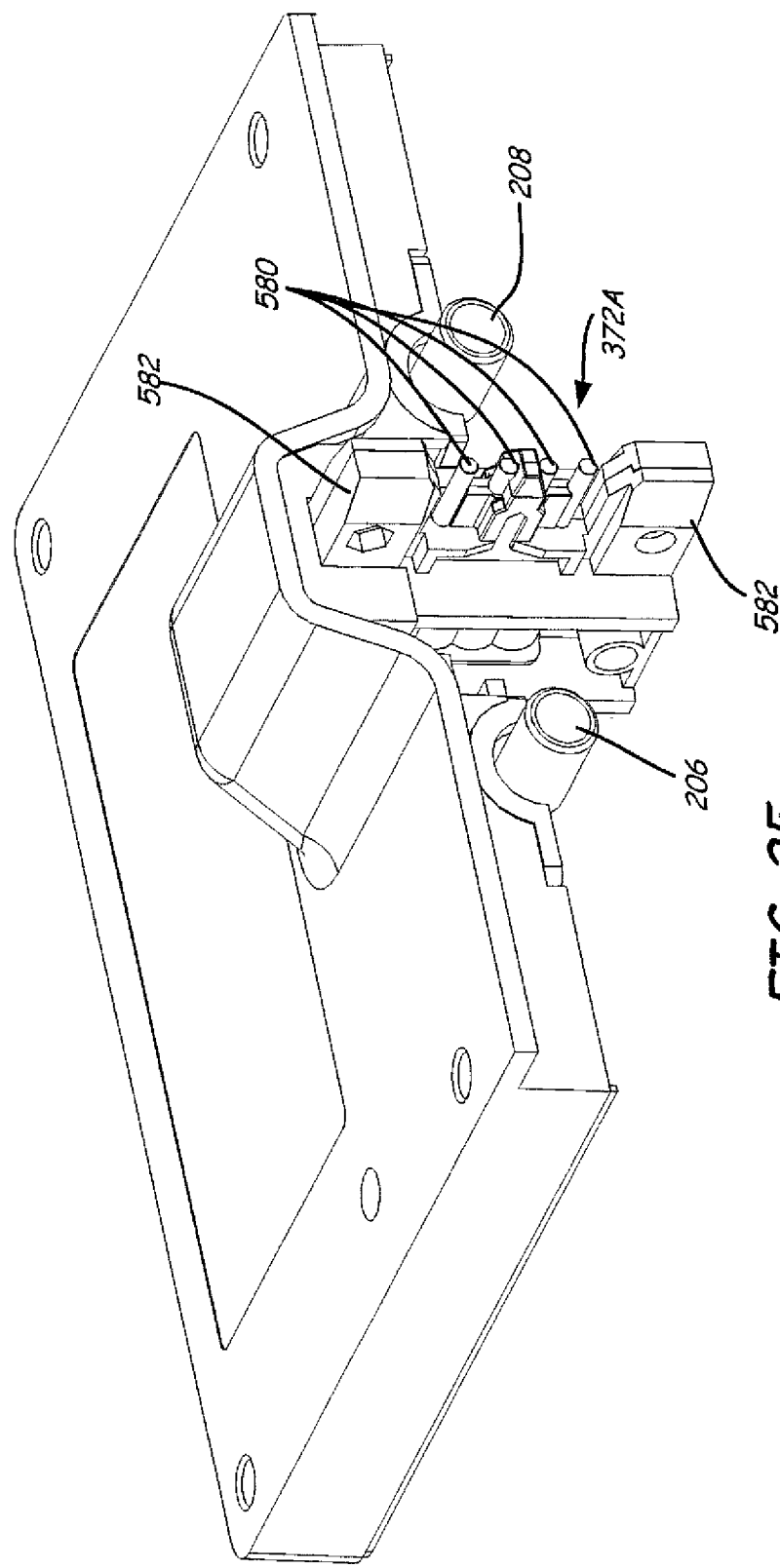
FIG. 25 is a perspective view showing an electrical contacts of FIG. 20.

FIG. 25 is a perspective view of Kelvin connections 206 and 208 and midpoint connector 372A in greater detail. As illustrated in FIG. 25, midpoint connector 372A includes four electrical connectors 580 configured to couple to the midpoint connections between four of the batteries or cells within the hybrid electric vehicle battery 140. Alignment tabs 582 are arranged to position the battery 140 within the base 580 and align the electrical connectors 580 with the midpoint connectors to the individual cells. The connectors 580 are arranged to couple to electrical connections inner cell connectors 424 and 434. A similar connector 372B is provided opposite connector 372A and arranged to couple to inner cell connectors 426 and 436.

Figure 26:
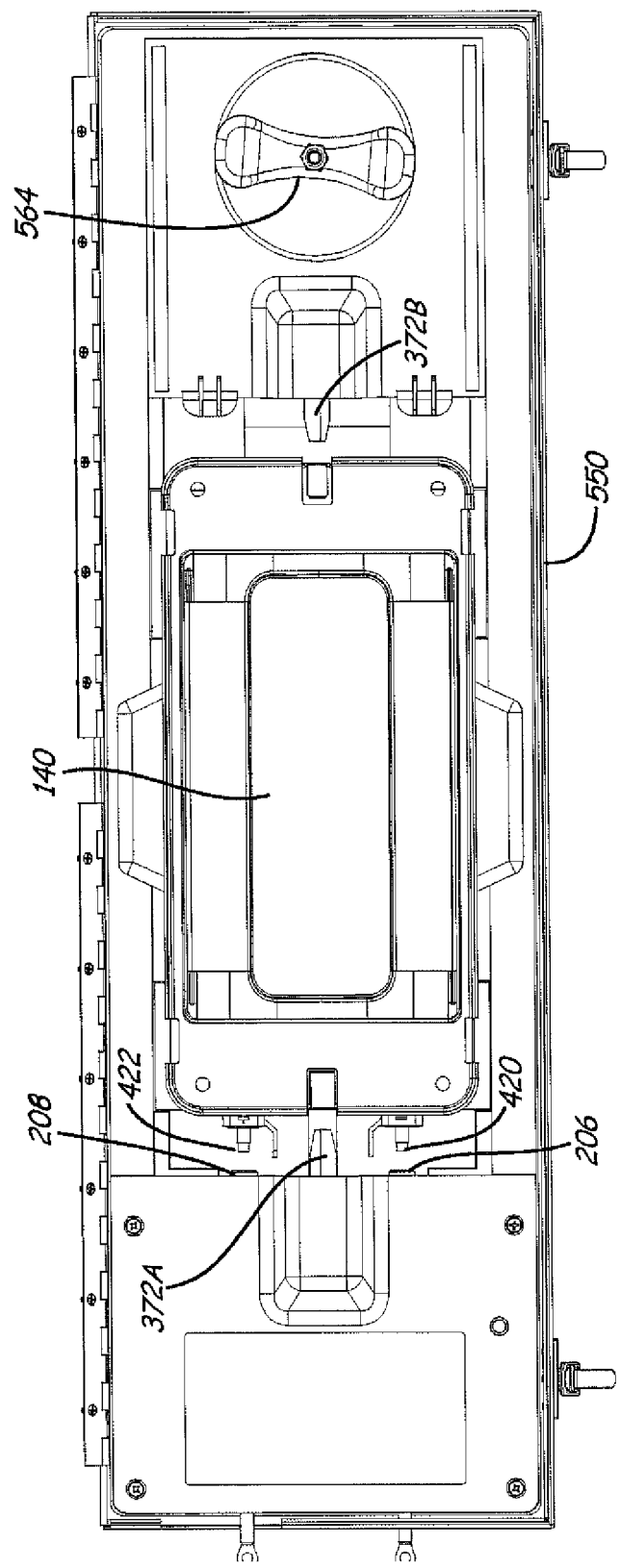
FIG. 26 is a top plan view of the battery placed in a cradle of FIG. 20.
Figure 27:
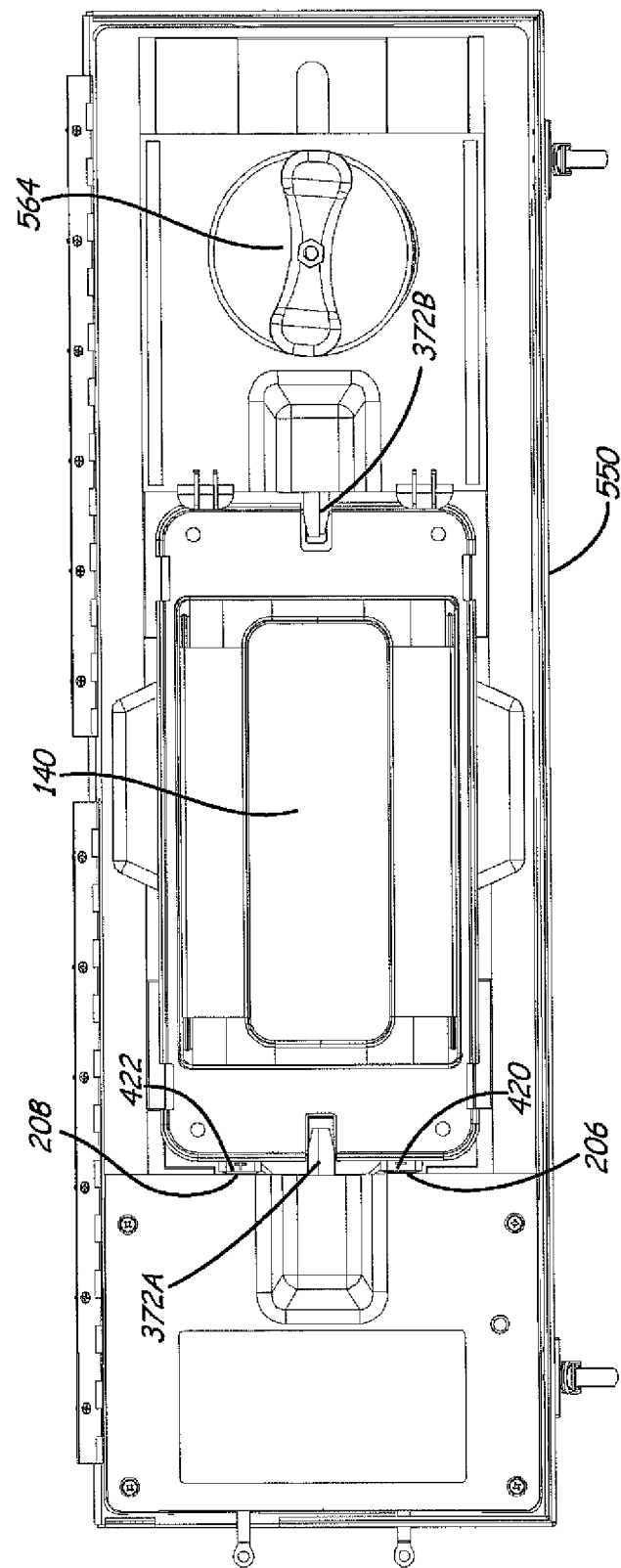
FIG. 27 is a top plan view showing the battery secured in the cradle of FIG. 20.

FIG. 26 is a top perspective view of base 550 having the battery 140 inserted therein prior to rotation of actuator 564. FIG. 27 is a top view showing battery 140 positioned in base 550 prior to movement of moveable portion 565 into position against the battery 140. In FIG. 27, moveable portion 565 has been moved into position and secured in position by rotating rotatable actuator 564.

Although the present invention has been described with reference to preferred embodiments, workers skilled in the art will recognize that changes may be made in form and detail without departing from the spirit and scope of the invention. As discussed above, the step of identifying can be performed based upon various parameters. Some of these parameters can be independently adjusted by the testing device or otherwise, for example voltage or state of charge for a particular battery or cell. Other parameters cannot be changed, for example, conductance, impedance, etc. In preparing a replacement battery pack, the parameters which can be adjusted independently may be changed as desired, for example, by charging or discharging a battery in order to provide a better match with other batteries in the replacement pack. The step of identifying can be configured such that a greater weight can be given to those parameters which cannot be adjusted. In such a configuration, prior to assembling the replacement battery pack, parameters which can be adjusted to more closely match one another can be changed accordingly. Further, an information in a database can be developed that relates a voltage or state of charge to conductance or impedance for a specific type of battery. In such a situation, if the database information indicates that a match will be difficult to obtain following equalization of adjustable parameters, the measurement device and/or method can be configured such that that particular battery will not be used and thereby saving time during the refurbishing process. Typically, a battery will comprise a lithium ion battery; another example technology is a nickel metal hydrate battery. However, the present invention is not limited to these battery configurations and may be implemented with other battery technologies. Typically electrical vehicle batteries will include four cells for battery module while hybrid electric vehicle batteries will include eight cells per battery module. The connections to a cell or battery can be single connections or Kelvin connections.

What is claimed is:

1. An apparatus for testing a battery of a battery pack from an electric vehicle, comprising:
   test circuitry configured to perform a battery test on the battery;
   a cradle configured to receive the battery, the cradle comprising:
      first and second connectors configured to electrically connect the test circuitry to end connectors of the battery, wherein the first and second connectors comprise Kelvin connectors;
      at least one midpoint test connector configured to electrically connect the test circuitry to an electrical midpoint between the end connectors, wherein the midpoint test connector is keyed and arranged to fit with a battery midpoint connector on the battery;
      a base arranged to receive the battery therein;
      switch circuitry coupled to the at least one midpoint test connector arranged to reverse a polarity of a connection to the battery through the at least one midpoint test connector, the switch circuitry including:
         at least one relay type switch electrically connected to first and second input connections of the at least one midpoint test connector and first and second output connections of the test circuitry, each relay type switch includes a first switch and a second switch, wherein when the first and second switches are selectively in a first polarity configuration the first switch electrically connects the first input connection to the first output connection and the second switch electrically connects the second input connection to the second output connection and wherein when the first and second switches are selectively in a second polarity configuration that is reversed from the first polarity configuration the first switch electrically connects the second input connection to the first output connection and the second switch electrically connects the first input connection to the second output connection;
      a switch controller operated by the test circuitry including an optoisolator and a transistor arranged to energize the at least one relay type switch;
   an actuator arranged to lock the battery in the base and urge the battery into electrical contact with the first, second and midpoint connectors; and
   a cover arranged to cover the base.

2. The apparatus of claim 1 wherein the actuator comprises a lock mechanism to secure the battery in the cradle.

3. The apparatus of claim 1 wherein the cradle includes a temperature sensor.

4. The apparatus of claim 1 wherein the at least one midpoint test connector includes a plurality of electrical connectors configured to couple to a plurality of electrical midpoints between the end connectors of the battery.

5. The apparatus of claim 1 including a second midpoint test connector configured to couple to additional midpoint connections between the end connectors of the battery.

6. The apparatus of claim 5 wherein the second midpoint connector is carried on a slidable portion.

7. The apparatus of claim 6 including a lock mechanism to secure the slidable portion to the base of the cradle.

8. The apparatus of claim 1 wherein the cradle includes a switch actuated by the cover when the cover is in a closed position.

9. The apparatus of claim 1 wherein the test circuitry is configured to measure a dynamic parameter of the battery.

10. The apparatus of claim 1 wherein the actuator comprises a locking tab.

11. The apparatus of claim 1 wherein the actuator comprises a rotatable actuator.

12. The apparatus of claim 1 wherein the switch circuitry coupled to the at least one midpoint test connector comprises a second relay type switch electrically connected to third and fourth input connections of the at least one midpoint test connector and third and fourth output connections of the test circuitry, the second relay type switch including a first switch and a second switch.

13. The apparatus of claim 12 wherein when the first and second switches of the second relay type switch are selectively in a third polarity configuration the first switch of the second relay type switch electrically connects the third input connection to the third output connection and the second switch of the second relay type switch electrically connects the fourth input connection to the fourth output connection and wherein when the first and second switches of the second relay type switch are selectively in a fourth polarity configuration that is reversed from the first polarity configuration the first switch of the second relay type switch electrically connects the fourth input connection to the third output connection and the second switch of the second relay type switch electrically connects the third input connection to the fourth output connection.

* * * * *